United States Patent
Park et al.

(10) Patent No.: US 11,031,410 B2
(45) Date of Patent: Jun. 8, 2021

(54) NONVOLATILE MEMORY DEVICE AND METHOD FOR FABRICATING THE SAME

(71) Applicant: Samsung Electronics Co., Ltd., Suwon-si (KR)

(72) Inventors: Se Jun Park, Yongin-si (KR); Min-Tai Yu, Seoul (KR); Jae Duk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/425,365

(22) Filed: May 29, 2019

(65) Prior Publication Data

US 2020/0127002 A1 Apr. 23, 2020

(30) Foreign Application Priority Data

Oct. 22, 2018 (KR) .................. 10-2018-0125725

(51) Int. Cl.
| | |
|---|---|
| *H01L 27/11556* | (2017.01) |
| *H01L 27/11582* | (2017.01) |
| *G11C 5/06* | (2006.01) |

(52) U.S. Cl.
CPC ......... *H01L 27/11556* (2013.01); *G11C 5/06* (2013.01); *H01L 27/11582* (2013.01)

(58) Field of Classification Search
CPC H01L 27/11556; H01L 27/11582; G11C 5/06
USPC ....................................................... 257/314
See application file for complete search history.

(56) References Cited

U.S. PATENT DOCUMENTS

| | | | |
|---|---|---|---|
| 8,329,513 B2 | 12/2012 | Pekny | |
| 8,394,698 B2 | 3/2013 | Park et al. | |
| 8,703,597 B1 | 4/2014 | Sekar et al. | |
| 8,853,773 B2 | 10/2014 | Lee | |
| 8,865,554 B2 | 10/2014 | Don | |
| 9,362,303 B2 | 6/2016 | Lee et al. | |
| 9,576,975 B2 | 2/2017 | Zhang et al. | |
| 2013/0341701 A1 | 12/2013 | Blomme et al. | |
| 2014/0061770 A1* | 3/2014 | Lee ................... | H01L 29/42324 257/324 |
| 2015/0008502 A1* | 1/2015 | Chien ................ | H01L 27/1157 257/321 |
| 2015/0036426 A1* | 2/2015 | Kwak .................. | G11C 16/10 365/185.03 |

(Continued)

*Primary Examiner* — Igwe U Anya
(74) *Attorney, Agent, or Firm* — Harness, Dickey & Pierce, P.L.C.

(57) ABSTRACT

A nonvolatile memory device in which reliability is improved and a method for fabricating the same are provided. The nonvolatile memory device includes a mold structure which includes a first insulating pattern, a first gate electrode and a second insulating pattern sequentially stacked on a substrate, a semiconductor pattern which penetrates the mold structure, is connected to the substrate, and extends in a first direction, a first charge storage film extending in the first direction between the first insulating pattern and the second insulating pattern and between the first gate electrode and the semiconductor pattern, and a blocking insulation film between the first gate electrode and the first charge storage film, wherein a first length at which the first charge storage film extends in the first direction is longer than a second length at which the blocking insulation film extends in the first direction.

20 Claims, 45 Drawing Sheets

(56) References Cited

U.S. PATENT DOCUMENTS

2015/0318300 A1* 11/2015 Ohsaki .............. H01L 29/40117
                                                    438/258
2016/0172372 A1*  6/2016 Yun .................... H01L 29/7883
                                                    257/321
2016/0336340 A1* 11/2016 Song ................... H01L 23/5329
2017/0062471 A1   3/2017 Son et al.
2017/0084624 A1*  3/2017 Lee .................... H01L 27/1157

* cited by examiner

NONVOLATILE MEMORY DEVICE AND METHOD FOR FABRICATING THE SAME This application claims priority to Korean Patent Application No. 10-2018-0125725, filed on Oct. 22, 2018, and all the benefits accruing therefrom under 35 U.S.C. § 119, the disclosure of which is incorporated herein by reference in its entirety.

BACKGROUND

1. Technical Field

The present inventive concepts relate to a nonvolatile memory device and a method for fabricating the same. More specifically, the present inventive concepts relate to a nonvolatile memory device including a cut charge storage film and a method for fabricating the same.

2. Description of the Related Art

A semiconductor memory device is a memory device implemented using semiconductors such as silicon (Si), germanium (Ge), gallium arsenide (GaAs), and indium phosphide (InP). Semiconductor memory devices may be largely classified into a volatile memory device and a nonvolatile memory device.

A volatile memory device is a memory device in which stored data disappears when a power supply is cut off. Volatile memory devices may include an SRAM (Static RAM), a DRAM (Dynamic RAM), an SDRAM (Synchronous DRAM), and the like. A nonvolatile memory device is a memory device that holds stored data even if the power supply is cut off. Nonvolatile memory devices may be a flash memory device, a ROM (Read Only Memory), a PROM (Programmable ROM), an EPROM (Electrically Programmable ROM), an EEPROM (Electrically Erasable and Programmable ROM), a resistive memory device (for example, a PRAM (phase-change RAM), a FRAM (Ferroelectric RAM), and a RRAM (Resistive RAM)), and the like.

The degree of integration of nonvolatile memory devices is increasing in order to satisfy the improved performance and/or low price required by consumers. In the case of a two-dimensional device or a planar memory device, the degree of integration is determined by an area occupied by the unit memory cells. Therefore, recently, a three-dimensional memory device in which the unit memory cells are arranged vertically has been developed.

SUMMARY

Aspects of the present inventive concepts provide a nonvolatile memory device in which reliability is improved by cutting a charge storage film to protrude from a blocking insulation film.

Aspects of the present inventive concepts also provide a method for fabricating a nonvolatile memory device capable of fabricating a nonvolatile memory device in which reliability is improved by cutting the charge storage film to protrude from the blocking insulation film.

However, aspects of the present inventive concepts are not restricted to the one set forth herein. The above and other aspects of the present inventive concepts will become more apparent to one of ordinary skill in the art to which the present inventive concepts pertain by referencing the detailed description of the present inventive concepts given below.

According to aspects of the present inventive concepts, there is provided a nonvolatile memory device comprising a mold structure which includes a first insulating pattern, a first gate electrode and a second insulating pattern sequentially stacked on a substrate, a semiconductor pattern which penetrates the mold structure, is connected to the substrate, and extends in a first direction, a first charge storage film extending in the first direction between the first insulating pattern and the second insulating pattern and between the first gate electrode and the semiconductor pattern, and a blocking insulation film between the first gate electrode and the first charge storage film, wherein a first length at which the first charge storage film extends in the first direction is longer than a second length at which the blocking insulation film extends in the first direction.

According to aspects of the present inventive concepts, there is provided a nonvolatile memory device comprising a mold structure which includes a first gate electrode, an insulating pattern and a second gate electrode sequentially stacked on a substrate, a semiconductor pattern penetrating the mold structure and connected to the substrate, a first charge storage film between the first gate electrode and the semiconductor pattern, a second charge storage film apart from the first charge storage film between the second gate electrode and the semiconductor pattern, a first blocking insulation film between the first gate electrode and the insulating pattern, and a second blocking insulation film between the second gate electrode and the insulating pattern, wherein a first distance at which the first charge storage film and the second charge storage film are apart from each other is shorter than a second distance at which the first blocking insulation film and the second blocking insulation film are apart from each other.

According to aspects of the present inventive concepts, there is provided a nonvolatile memory device comprising a mold structure which includes a first insulating pattern, a first gate electrode and a second insulating pattern sequentially stacked on a substrate, a semiconductor pattern which penetrates the mold structure, is connected to the substrate, and extends in a first direction, and a first charge storage film extending in the first direction between the first insulating pattern and the second insulating pattern and between the first gate electrode and the semiconductor pattern, wherein a first length at which the first charge storage film extends in the first direction increases approaching the semiconductor pattern.

According to aspects of the present inventive concepts, there is provided a nonvolatile memory device comprising a mold structure which includes an insulating pattern and a gate electrode alternately stacked on a substrate, a semiconductor pattern penetrating the mold structure and connected to the substrate, a first charge storage film between the gate electrode and the semiconductor pattern, and a blocking insulation film extending along a bottom surface, sidewalls and an upper surface of the gate electrode, wherein the first charge storage film includes a protrusion protruding from the blocking insulation film toward the insulating pattern.

According to aspects of the present inventive concepts, there is provided a method for fabricating a nonvolatile memory device, the method comprising forming a preliminary mold structure including first to third sacrificial films on a substrate, the first sacrificial film and the third sacrificial film being alternately stacked, and the second sacrificial film being interposed between the first and third sacrificial films, forming a first hole penetrating the preliminary mold structure to expose the substrate, sequentially forming a preliminary charge storage film and a semiconductor pattern in the first hole, removing the third sacrificial film to expose a part of the preliminary charge storage film, performing an etchback process on the preliminary charge storage film to form a plurality of charge storage films apart from each other.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EMBODIMENTS

Hereinafter, a nonvolatile memory device according to some embodiments of the technical idea of the present inventive concepts will be described with reference to FIGS. 1 to 14.

Figure 1:
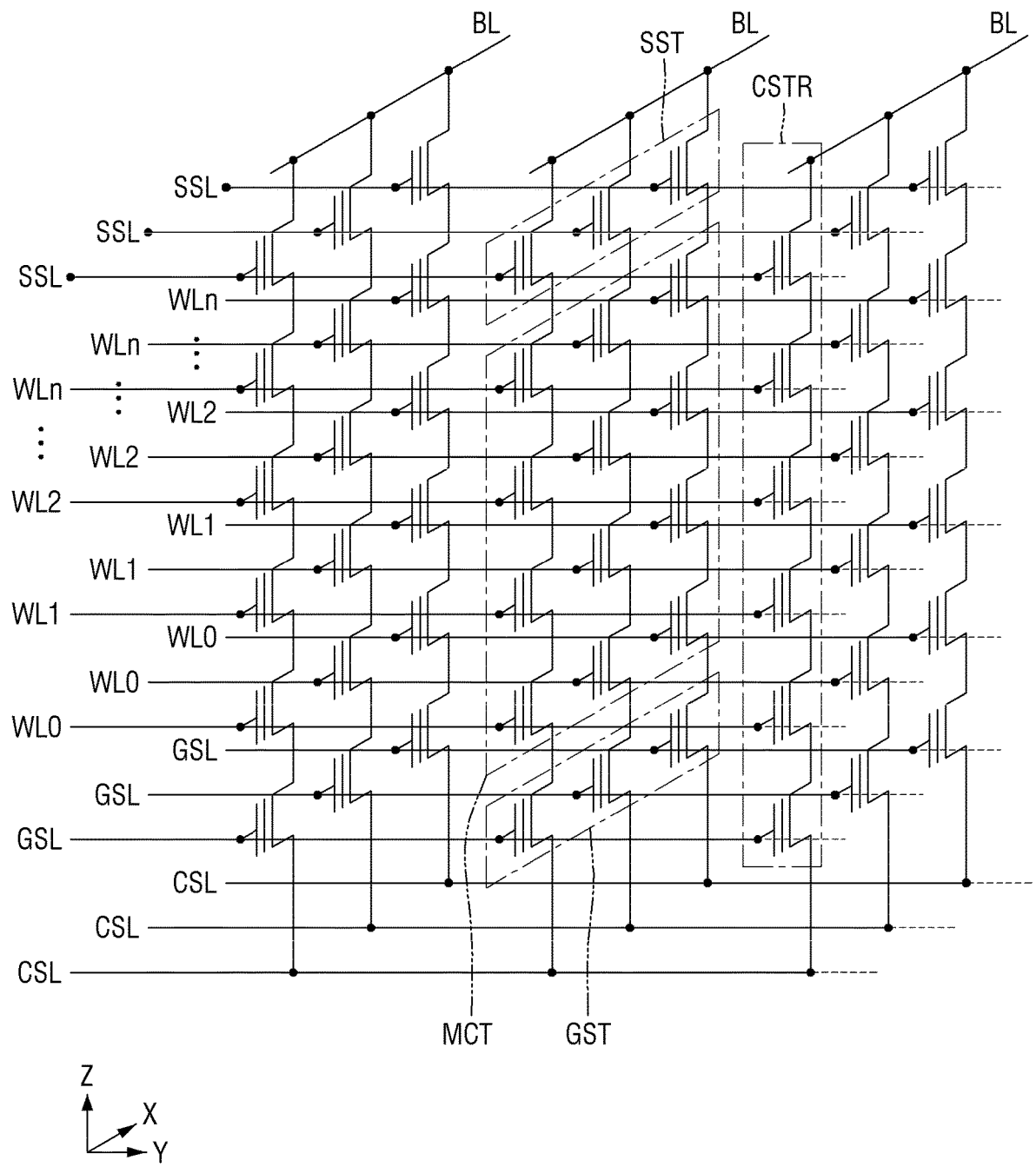
FIG. 1 is a schematic circuit diagram for explaining a nonvolatile memory device according to some embodiments of the technical idea of the present inventive concepts.
Figure 2:
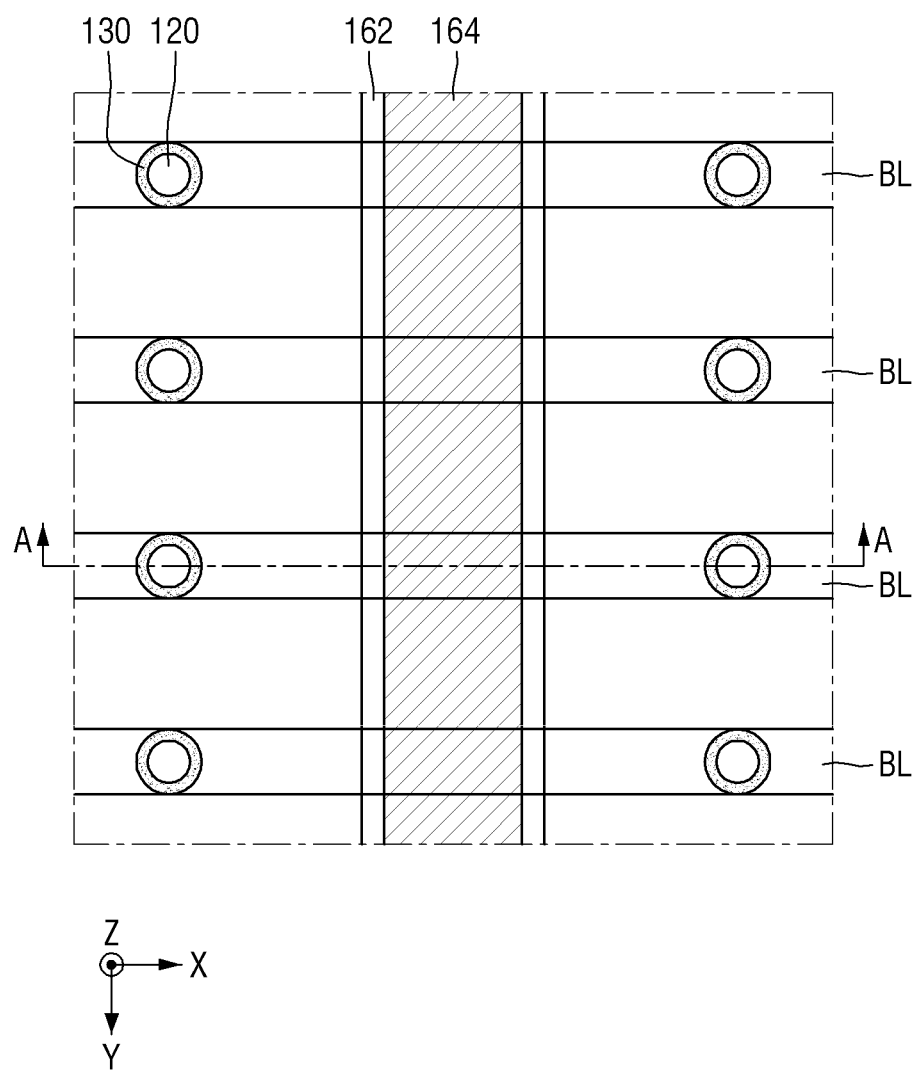
FIG. 2 is a schematic layout diagram for explaining the nonvolatile memory device according to some embodiments of the technical idea of the present inventive concepts.
Figure 3:
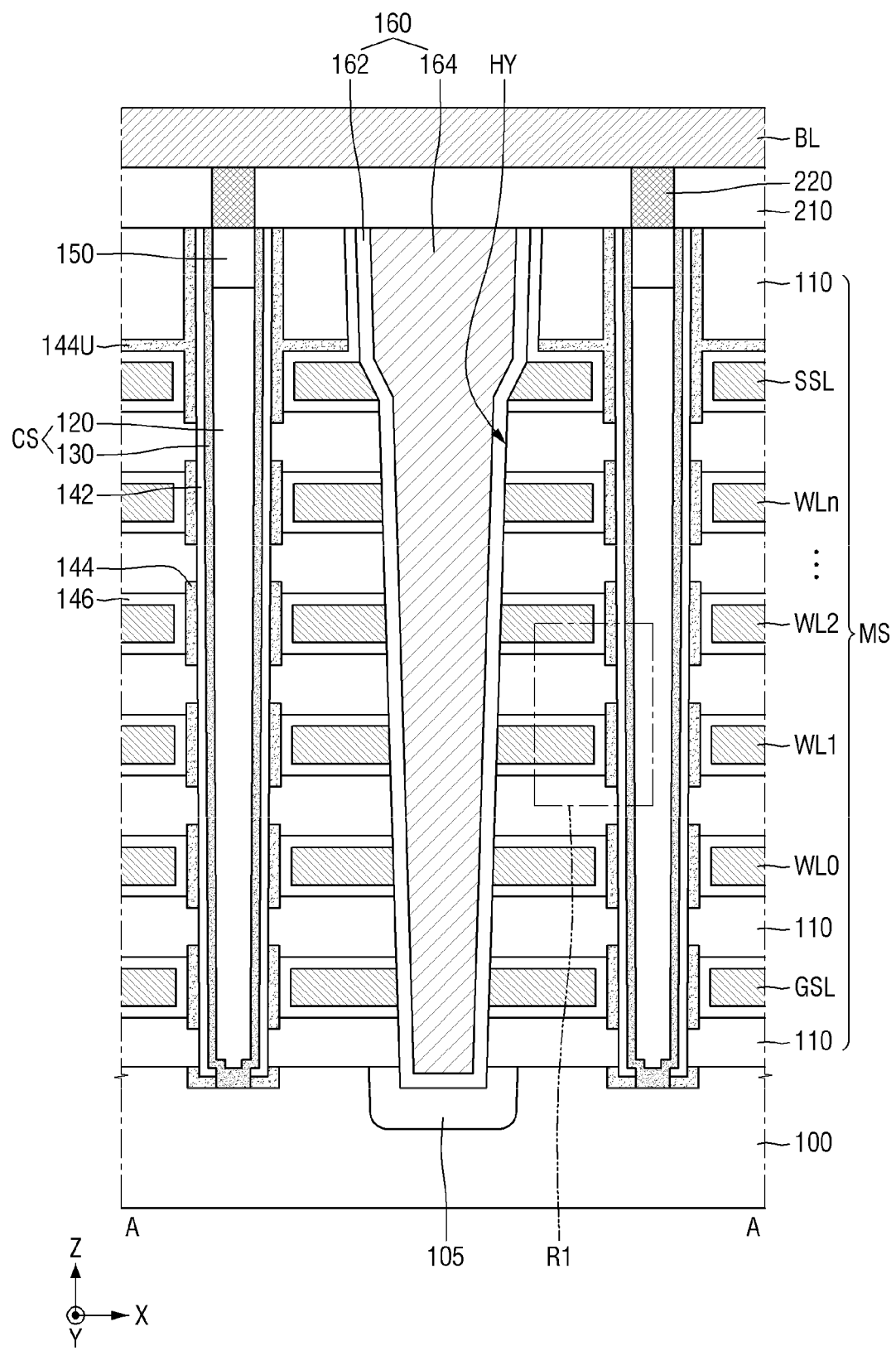
FIG. 3 is a cross-sectional view taken along line A-A of FIG. 2.
Figure 4:
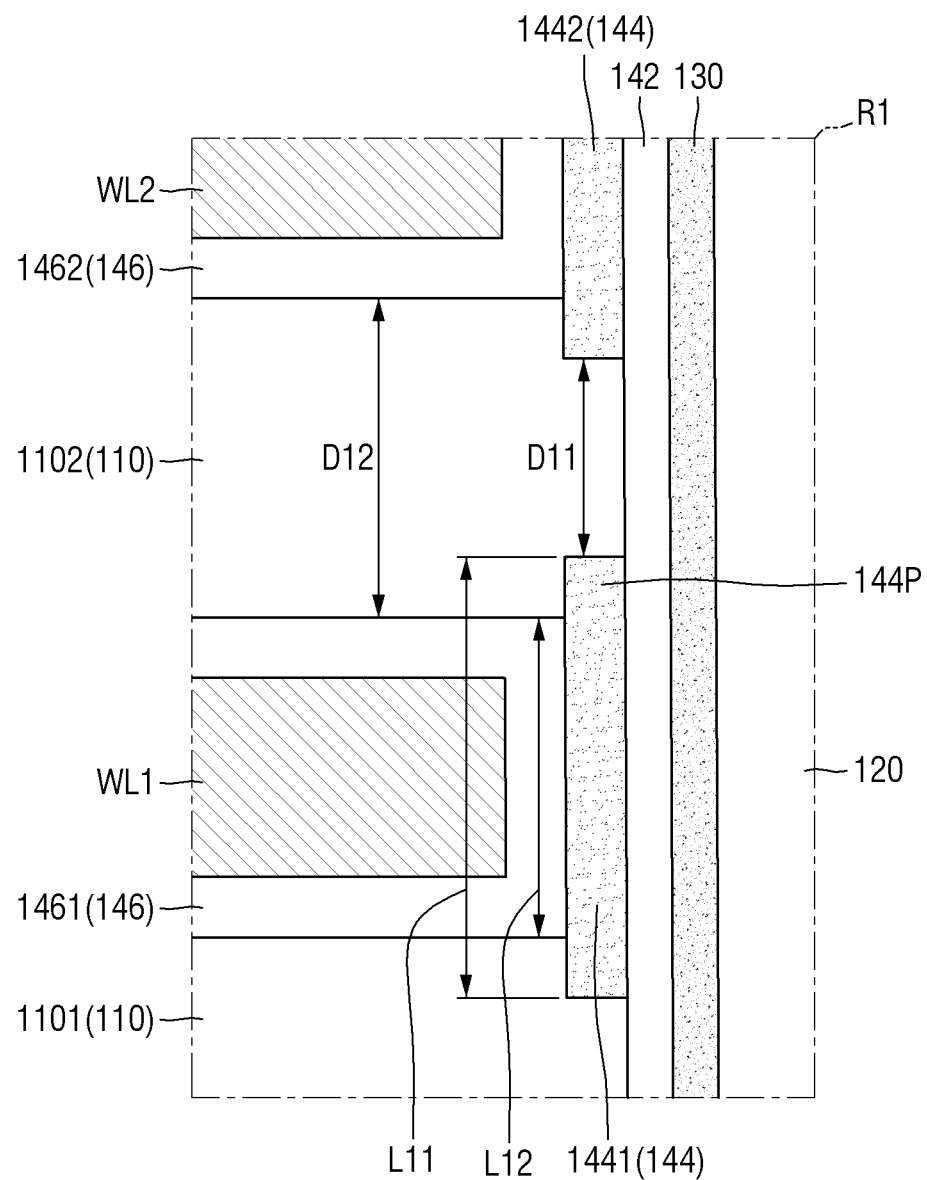
FIGS. 4 and 5 illustrate various enlarged views of a region R1 of FIG. 3.
Figure 5:
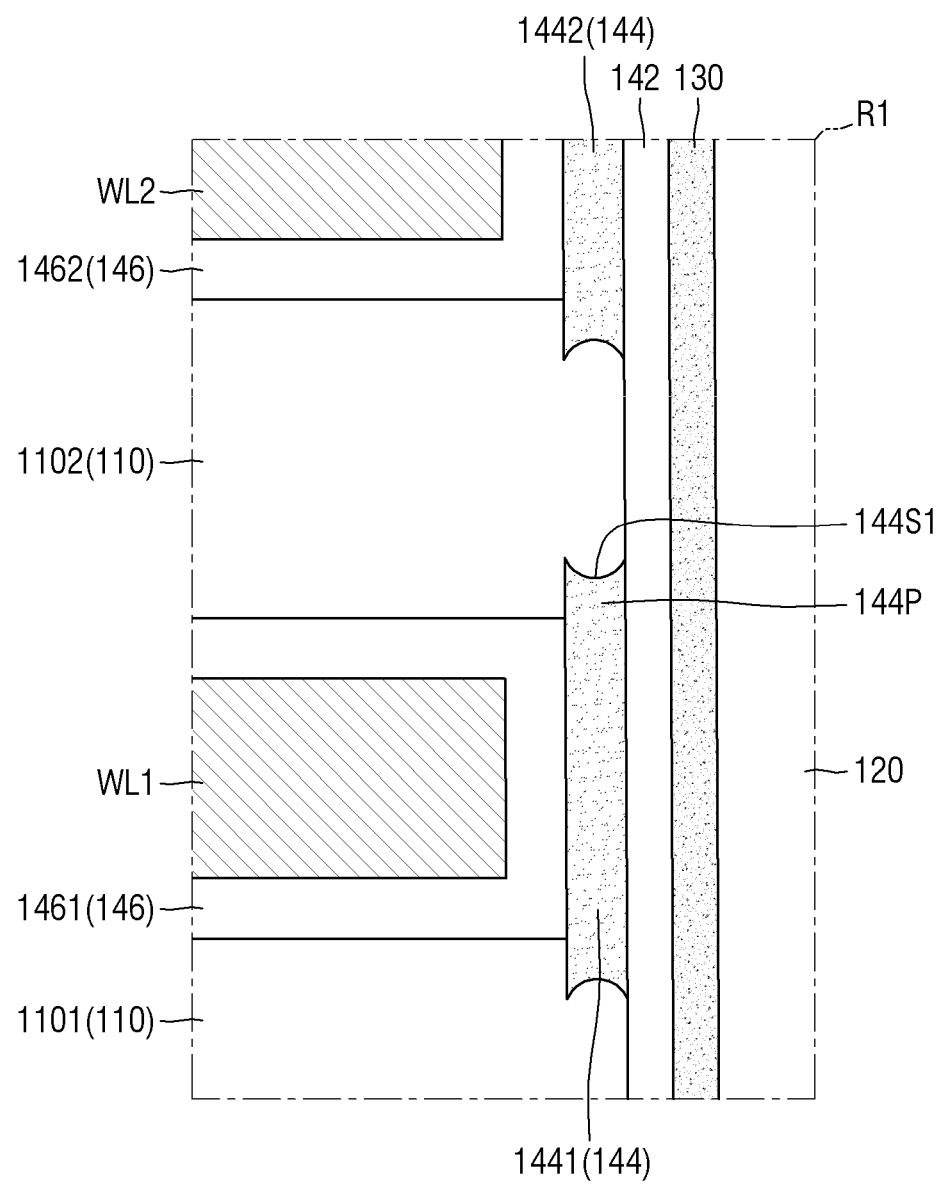

FIG. 1 is a schematic circuit diagram for explaining a nonvolatile memory device according to some embodiments of the technical idea of the present inventive concepts. FIG. 2 is a schematic layout diagram for explaining the nonvolatile memory device according to some embodiments of the technical idea of the present inventive concepts. FIG. 3 is a cross-sectional view taken along line A-A of FIG. 2. FIGS. 4 and 5 illustrate various enlarged views of a region R1 of FIG. 3.

Referring first to FIG. 1, the nonvolatile memory device according to some embodiments may include a common source line CSL, a plurality of bit lines BL and/or a plurality of cell strings CSTR.

The plurality of bit lines BL may be two-dimensionally arranged. For example, each bit line BL may be apart from each other and extend in a first direction X respectively. A plurality of cell strings CSTR may be connected in parallel to each bit line BL. The cell strings CSTR may be connected in common to the common source line CSL. That is, a plurality of cell strings CSTR may be disposed between the plurality of bit lines BL and the common source line CSL.

In some embodiments, the plurality of common source lines CSL may be arranged in two dimensions. For example, each common source line CSL may be apart from each other and extend in a second direction Y, respectively. The same electric voltage may be applied to the common source line CSL, or different voltages may be applied to the common source line CSL to be controlled separately.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each of the memory cell transistors MCT may include a data storage element. The ground selection transistor GST, the string selection transistor SST, and the memory cell transistors MCT may be connected to each other in series.

The common source line CSL may be connected in common to the sources of the ground selection transistors GST. Further, a ground selection line GSL, a plurality of word lines WL0 to WLn, and a string selection line SSL may be arranged between the common source line CSL and the bit line BL. The ground selection lines GSL may be used as the gate electrode of the ground selection transistor GST, the plurality of word lines WL0 to WLn may be used as the gate electrodes of the memory cell transistors MCT, and the string selection line SSL may be used as the gate electrode of the string selection transistor SST.

Next, referring to FIGS. 2 to 4, the nonvolatile memory device according to some embodiments includes a substrate 100, a mold structure MS, a channel structure CS, a tunnel insulating film 142, charge storage films 144 and 144U, blocking insulation films 146, a channel pad 150, a separation structure 160, an interlayer insulating film 210 and/or bit lines BL.

The substrate 100 may include a semiconductor substrate such as, for example, a silicon substrate, a germanium substrate or a silicon-germanium substrate. Alternatively, the substrate 100 may include a silicon-on-insulator (SOI) substrate, a germanium-on-insulator (GOI) substrate, or the like.

The mold structure MS may include a plurality of gate electrodes (GSL, WL0 to WLn, and SSL) and/or a plurality of insulating patterns 110. The respective gate electrodes (GSL, WL0 to WLn, and SSL) and the respective insulating patterns 110 may extend long in a direction parallel to the upper surface of the substrate 100.

The respective gate electrodes (GSL, WL0 to WLn, and SSL) may be alternately stacked with the respective insulating patterns 110. For example, the plurality of gate electrodes (GSL, WL0 to WLn, and SSL) may be sequentially stacked on the substrate 100, while being apart from each other along a third direction Z. The plurality of insulating patterns 110 may be interposed between the plurality of gate electrodes (GSL, WL0 to WLn, and SSL) and between the gate electrodes (GSL, WL0 to WLn, and SSL) and the substrate 100. For example, as illustrated in FIG. 4, the mold structure MS may include a first insulating pattern 1101, a first gate electrode WL1, a second insulating pattern 1102, and a second gate electrode pattern WL2 sequentially stacked on the substrate 100.

Although the plurality of gate patterns (GSL, WL0 to WLn, and SSL) are illustrated as having the same thickness, the technical idea of the present inventive concepts is not limited thereto, and a plurality of gate patterns (GSL, WL0 to WLn, and SSL) may have thicknesses different from each other.

In some embodiments, the lowermost gate electrode GSL among the plurality of gate electrodes (GSL, WL0 to WLn, and SSL) may be provided as a ground selection line GSL of FIG. 1. In some embodiments, the uppermost gate electrode SSL among the plurality of gate electrodes (GSL, WL0 to WLn, and SSL) may be provided as a string selection line GSL of FIG. 1. The gate electrodes WL0 to WLn between the ground selection line GSL and the string selection line SSL may be provided as the word lines WL0 to WLn of FIG. 1.

The plurality of gate patterns (GSL, WL0 to WLn, and SSL) may include a conductive material. The plurality of gate patterns (GSL, WL0 to WLn, and SSL) may include, for example, but is not limited to, a metal such as tungsten (W), cobalt (Co), and nickel (Ni) or a semiconductor material such as silicon.

The plurality of insulating patterns 110 may include an insulating material. The plurality of insulating patterns 110 may include, for example, silicon oxide, but is not limited thereto.

The channel structure CS may penetrate the mold structure MS to extend in a third direction Z. For example, the channel structure CS is formed in a pillar shape on the substrate 100 and may penetrates the plurality of gate patterns (GSL, WL0 to WLn, and SSL) and the plurality of insulating patterns 110. Thus, the plurality of gate patterns (GSL, WL0 to WLn, and SSL) may intersect the channel structure CS.

A plurality of channel structures CS may be provided. For example, as illustrated in FIG. 2, the plurality of channel structures CS may be arranged along the second direction Y. Also, for example, the plurality of channel structures CS may be disposed on both sides of the separation structure 160, respectively.

The channel structure CS may include a semiconductor pattern 130. The semiconductor pattern 130 penetrates the mold structure MS and may be connected to the substrate 100. For example, the semiconductor pattern 130 may extend in the third direction Z. The semiconductor pattern 130 may be formed, for example, in a cup shape. For example, the channel structure CS may include a filling insulating pattern 120 having a pillar shape, and a semiconductor pattern 130 conformally extending along a bottom surface and sidewalls of the filling insulating pattern 120. The filling insulating pattern 120 may include, for example, silicon oxide. However, the technical idea of the present inventive concepts is not limited thereto, and the semiconductor pattern 130 may have various shapes such as a cylindrical shape, a square cylindrical shape, a solid pillar shape, and the like.

The semiconductor pattern 130 may include, but is not limited to, a semiconductor material such as, for example, single crystal silicon.

A tunnel insulating film 142 may be formed on the sidewalls of the channel structure CS. For example, the tunnel insulating film 142 may be formed to surround the sidewalls of the semiconductor pattern 130. Further, the tunnel insulating film 142 may extend in the third direction Z.

The tunnel insulating film 142 may include, for example, silicon oxide or silicon oxynitride. Alternatively, for example, the tunnel insulating film 142 may be formed of a double layer of a silicon oxide film and a silicon nitride film. For convenience of explanation, hereinafter, the tunnel insulating film 142 will be described as including silicon oxide.

The charge storage films 144 and 144U may be formed on the sidewalls of the tunnel insulating film 142. Therefore, the tunnel insulating film 142 may be interposed between the semiconductor pattern 130 and the charge storage films 144 and 144U. Further, the charge storage films 144 and 144U may extend in the third direction Z.

Each of the charge storage films 144 and 144U may be interposed between the semiconductor pattern 130 and the respective gate electrodes (GSL, WL0 to WLn, and SSL). For example, as illustrated in FIG. 4, a first charge storage film 1441 may be interposed between the semiconductor pattern 130 and the first gate electrode WL1, and a second charge storage film 1442 may be interposed between the semiconductor pattern 130 and the second gate electrode WL2.

In addition, the respective charge storage films 144 and 144U may be apart from each other in the third direction Z. For example, the first charge storage film 1441 may be interposed between a first insulating pattern 1101 and a second insulating pattern 1102. Accordingly, the first charge storage film 1441 and the second charge storage film 1442 may be apart from each other by the second insulating pattern 1102.

Charges having passed through the tunnel insulating film 142 from the semiconductor pattern 130 may be stored in the charge storage films 144 and 144U. The charges stored in the charge storage films 144 and 144U may be changed by fowler-nordheim tunneling induced by, for example, a voltage difference between the semiconductor pattern 130 and the gate electrodes (GSL, WL0 to WLn, and SSL).

The charge storage films 144 and 144U may include, for example, at least one of silicon nitride, silicon oxynitride, Si-rich nitride and nanocrystalline (Si). For convenience of explanation, hereinafter, the charge storage films 144 and 144U will be described as including silicon nitride.

Blocking insulation film 146 may be formed on the sidewalls of the charge storage films 144 and 144U. As a result, the charge storage films 144 and 144U may be interposed between the tunnel insulating film 142 and the blocking insulation film 146.

Each blocking insulation film 146 may be interposed between the respective charge storage films 144 and 144U and the respective gate electrodes (GSL, WL0 to WLn, and SSL). For example, as illustrated in FIG. 4, the first blocking insulation film 1461 may be interposed between the first charge storage film 1441 and the first gate electrode WL1, and the second blocking insulation film 1462 may be interposed between the first charge storage film 1441 and the second gate electrode WL2.

Also, each blocking insulation film 146 may be formed to surround the respective gate patterns (GSL, WL0 to WLn, and SSL). For example, the first blocking insulation film 1461 may extend along the bottom surface, the sidewalls, and the upper surface of the first gate electrode WL1. Accordingly, the lower part of the first blocking insulation film 1461 may be interposed between the first gate electrode WL1 and the first insulating pattern 1101, the side part of the first blocking insulation film 1461 may be interposed between the first gate electrode WL1 and the first charge storage film 1441, and the upper part of the first blocking insulation film 1461 may be interposed between the first gate electrode WL1 and the second insulating pattern 1102.

The blocking insulation films 146 may include, for example, silicon oxide or a high-k material having a dielectric constant higher than silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof. For convenience of explanation, hereinafter, the blocking insulation films 146 will be described as including silicon oxide.

In some embodiments, as illustrated in FIG. 4, the respective charge storage films 144 and 144U may include protrusions 144P protruding from the blocking insulation films 146 toward the insulating patterns 110. The outer surface of the protrusion 144P is illustrated as being angulated, but this is only for convenience of explanation, and the technical idea of the present inventive concepts is not limited thereto. For example, the outer surface of the protrusion 144P may have a rounded shape.

As a result, the respective charge storage films 144 and 144U may extend to be longer than each blocking insulation film 146 in the third direction Z. For example, a first length L11 at which the first charge storage film 1441 extends in the third direction Z may be longer than a second length L12 at which the first blocking insulation film 1461 extends in the third direction Z.

Also, the distance at which the respective charge storage films 144 and 144U are apart from each other may be shorter than the distance at which the respective blocking insulation films 146 are apart from each other. For example, a first distance D11 at which the first charge storage film 1441 and the second charge storage film 1442 are space apart from each other may be shorter than a second distance D12 at which the first blocking insulation film 1461 and the second blocking insulation film 1462 are apart from each other.

In some embodiments, a part of the charge storage films 144 and 144U is illustrated as being in contact with the upper surface of the substrate 100, but this is only for convenience of description, and the technical idea of the present inventive concepts is not limited thereto. For example, portions of the charge storage film 144 and 144U being in contact with the upper surface of the substrate 100 may not exist.

In some embodiments, the upper charge storage film 144U disposed at the uppermost part among the charge storage films 144 and 144U may include a portion extending along the upper surface of the uppermost gate electrode SSL. For example, the upper charge storage film 144U may extend along the upper surface and sidewalls of the string selection line SSL.

A channel pad 150 may be formed on the channel structure CS. The channel pad 150 may be connected to the semiconductor pattern 130. In FIG. 3, the upper surface of the semiconductor pattern 130 is illustrated as being disposed on the same plane as the upper surface of the channel pad 150, but the technical idea of the present inventive concepts is not limited thereto. For example, unlike the illustrated case, the upper surface of the semiconductor pattern 130 may be disposed on the same plane as the upper surface of the filling insulation pattern 120. For example, in some embodiments, the channel pad 150 may be formed on the upper surface of the filling insulating pattern 120 and the upper surface of the semiconductor pattern 130.

The channel pad 150 may include a conductive material. The channel pad 150 may include, for example, impurity-doped polysilicon, but is not limited thereto.

The separation structure 160 penetrates the mold structure MS and may be connected to the impurity region 105 in the substrate 100. For example, a separation hole HY extending in the second direction Y between adjacent channel structures CS may be formed in the mold structure MS. The separation structure 160 may be formed to fill the separation hole HY. The impurity region 105 may be formed in the region of the substrate 100 exposed by the separation hole HY. For example, the impurity region 105 may extend in the second direction Y. The separation structure 160 and/or the impurity region 105 may be provided as the common source line CSL of FIG. 1.

In some embodiments, the separation structure 160 may include a common source plug pattern 164 and/or an insulating spacer 162. The common source plug pattern 164 penetrates the mold structure MS and may be connected to the impurity region 105 in the substrate 100. The common source plug pattern 164 may include, for example, a conductive material, but is not limited thereto. The insulating spacer 162 may extend along the sidewalls of the common source plug pattern 164.

In some embodiments, the sidewalls of the separation structure 160 adjacent to the uppermost gate electrode (SSL; e.g., the string selection line) may include steps.

The interlayer insulating film 210 may be formed on the mold structure MS. The interlayer insulating film 210 may be formed of, but is not limited to, for example, a BSG (borosilicate glass), a PSG (phosphosilicate glass), a BPSG (borophosphosilicate glass), an USG (undoped silicate glass), a TEOS (TetraEthyl Ortho Silicate Glass) or a HDP-CVD (High Density Plasma-CVD).

The bit lines BL may extend in the first direction X on the interlayer insulating film 210. The bit lines BL may be connected to the channel pad 150. For example, the bit lines BL may be connected to the bit line plug 220 penetrating the interlayer insulating film 210 and connected to the channel pad 150.

Referring to FIG. 5, in the nonvolatile memory device according to some embodiments, the protrusions 144P of the charge storage films 144 and 144U may include a first concave surface 144S1. The first concave surface 144S1 may be formed at the distal ends of the charge storage films 144 and 144U in the third direction Z.

In some embodiments, a center of curvature of the first concave surface 144S1 may be formed between the tunnel insulating film 142 and the blocking insulation films 146. For example, the first length L11 at which the first charge storage film 1441 extends in the third direction Z may decrease and then increase as it approaches the semiconductor pattern 130.

In a case where the charge storage film of the nonvolatile memory device continuously extends between the memory cell transistors, there is a problem that the charges are lost in the direction in which the charge storage film extends (for example, the third direction Z). This becomes a problem of inducing coupling between the adjacent memory cell transistors and lowering the reliability of the nonvolatile memory device.

However, the nonvolatile memory device according to some embodiments may include the charge storage films 144 and 144U apart from each other to correspond to each memory cell transistor MCT. As a result, it is possible to provide a memory device in which the charge lost in the extending direction of the charge storage film (for example, the third direction Z) is improved, the coupling between the adjacent memory cell transistors is improved, and reliability is improved.

Also, the nonvolatile memory device according to some embodiments may include the charge storage films 144 and 144U protruding from the blocking insulation film 146. The charge storage films 144 and 144U are able to store a large amount of charges as compared with the charge storage films recessed from the blocking insulation film 146, and may have an improved terminal profile. Therefore, it is possible to provide a nonvolatile memory device with further improved reliability.

Figure 6:
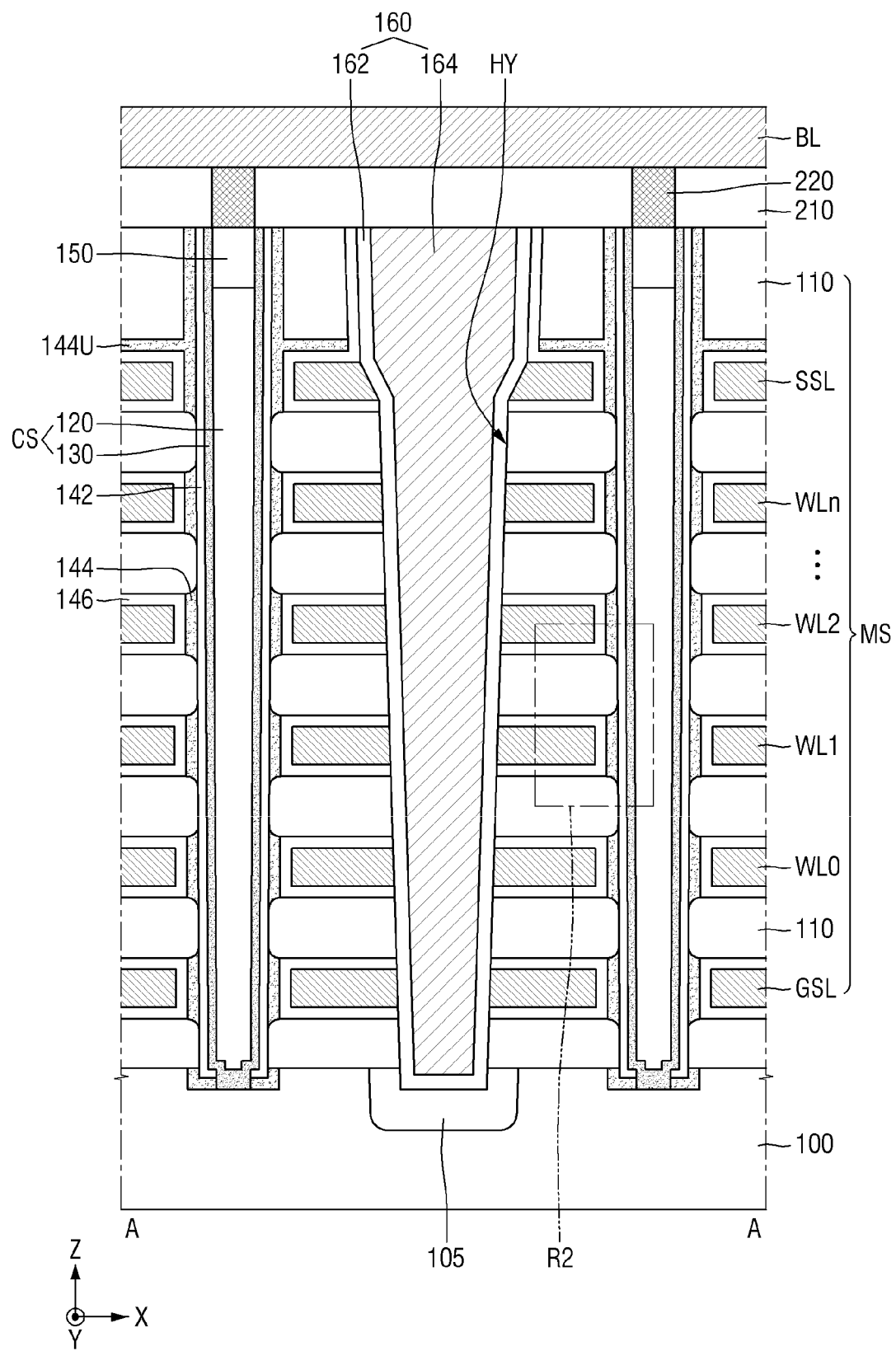
FIG. 6 is a cross-sectional view illustrating the nonvolatile memory device according to some embodiments of the technical idea of the present inventive concepts.

FIG. 6 is a cross-sectional view illustrating the nonvolatile memory device according to some embodiments of the technical idea of the present inventive concepts. FIGS. 7 to 10 illustrate various enlarged views of a region R2 of FIG. 6. For the sake of convenience of explanation, repeated parts of description provided using FIGS. 1 to 5 will be briefly explained or omitted.

Figure 7:
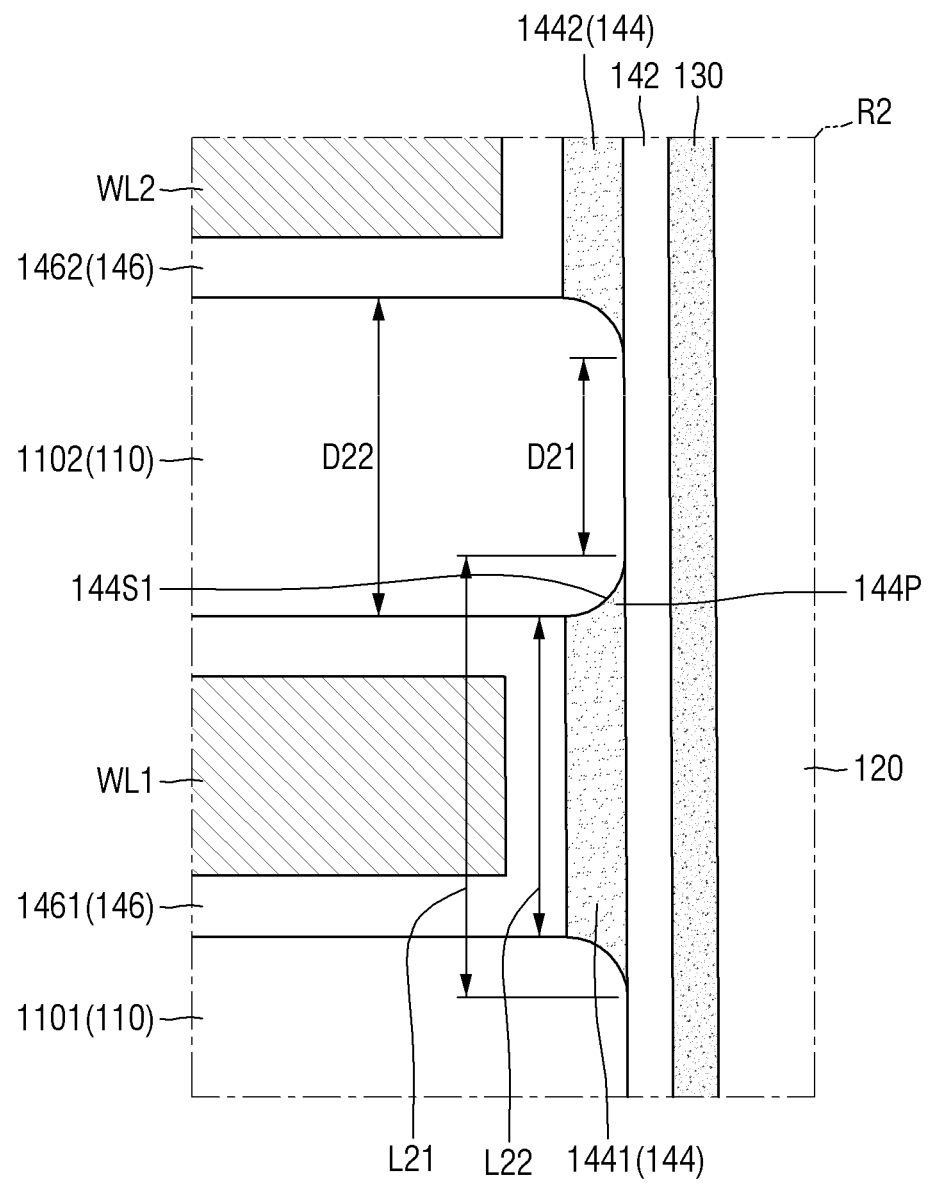
FIGS. 7 to 10 illustrate various enlarged views of a region R2 of FIG. 6.

Referring to FIGS. 6 and 7, in the nonvolatile memory device according to some embodiments, the length at which the charge storage films 144 and 144U extend in the third direction Z may increase approaching the semiconductor pattern 130.

For example, the first length L11 at which the first charge storage film 1441 extends in the third direction Z may increase as approaching the semiconductor pattern 130.

In some embodiments, the protrusions 144P of the charge storage films 144 and 144U may include a first concave surface 144S1. In such a case, a center of curvature of the first concave surface 144S1 may be formed at a position farther from the charge storage films 144 and 144U on the basis of the semiconductor pattern 130.

Figure 8:
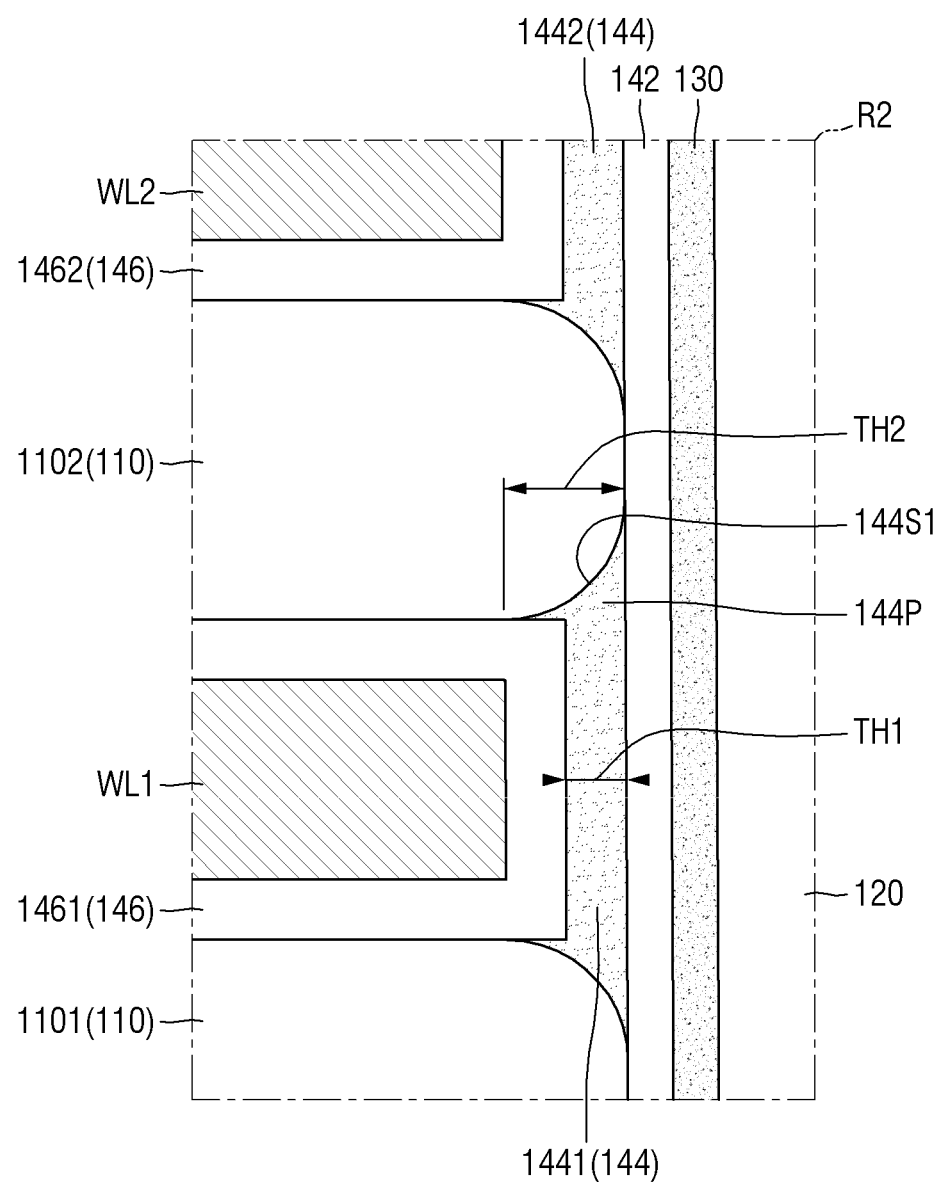

Referring to FIG. 8, in the nonvolatile memory device according to some embodiments, a part of the protrusions 144P of the charge storage films 144 and 144U may extend along a part of the bottom surfaces of the blocking insulation films 146 or a part of the upper surfaces of the blocking insulation films 146.

For example, a part of the protrusion 144P may extend between the first blocking insulation film 1461 and the first insulating patterns 1101, and between the first blocking insulation film 1461 and the second insulating pattern 1102. Thus, a first thickness TH1 of the first charge storage film 1441 between the first blocking insulation film 1461 and the tunnel insulating film 142 may be smaller than a second thickness TH2 of the protrusion 144P in the first direction X. Here, the thickness means a thickness in the first direction X.

The protrusion 144P is illustrated as extending along a part of the bottom surfaces of the blocking insulation films 146 and a part of the upper surfaces of the blocking insulation films 146, but the technical idea of the present inventive concepts is not limited thereto. For example, the protrusion 144P extends along only a part of the bottom surfaces of the blocking insulation films 146 and may not extend along the upper surfaces of the blocking insulation films 146. Alternatively, for example, the protrusion 144P may extend along only a part of the upper surfaces of the blocking insulation films 146 and may not extend along the bottom surfaces of the blocking insulation films 146.

Figure 9:
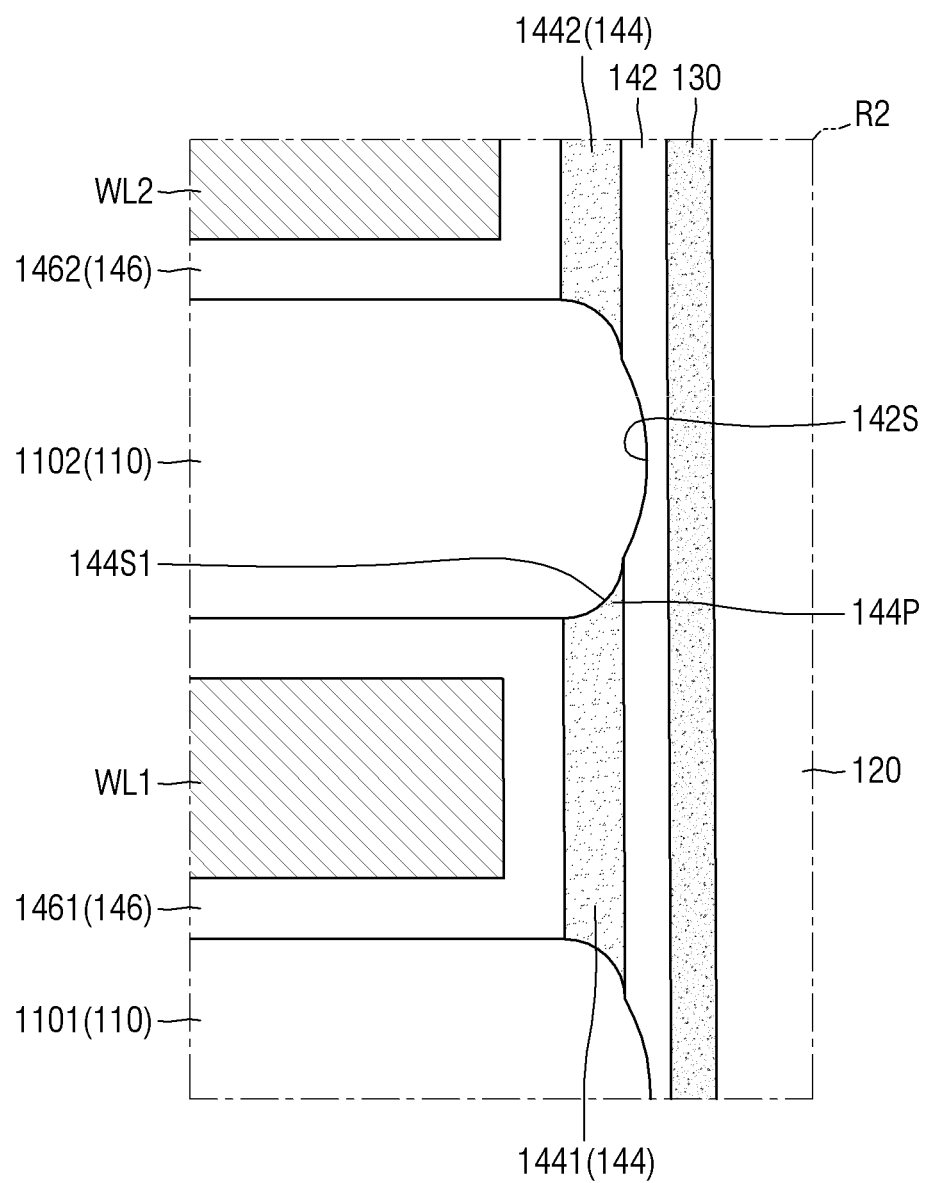

Referring to FIG. 9, in the nonvolatile memory device according to some embodiments, the tunnel insulating film 142 may include a second concave surface 142S.

The second concave surface 142S of the tunnel insulating film 142 may be formed between the charge storage films 144 and 144U. For example, the second concave surface 142S may be formed on the outer surface of the tunnel insulating film 142 between the first charge storage film 1441 and the second charge storage film 1442.

In some embodiments, the thickness of the tunnel insulating film 142 in the first direction X may decrease as it goes away from the charge storage films 144 and 144U.

Figure 10:
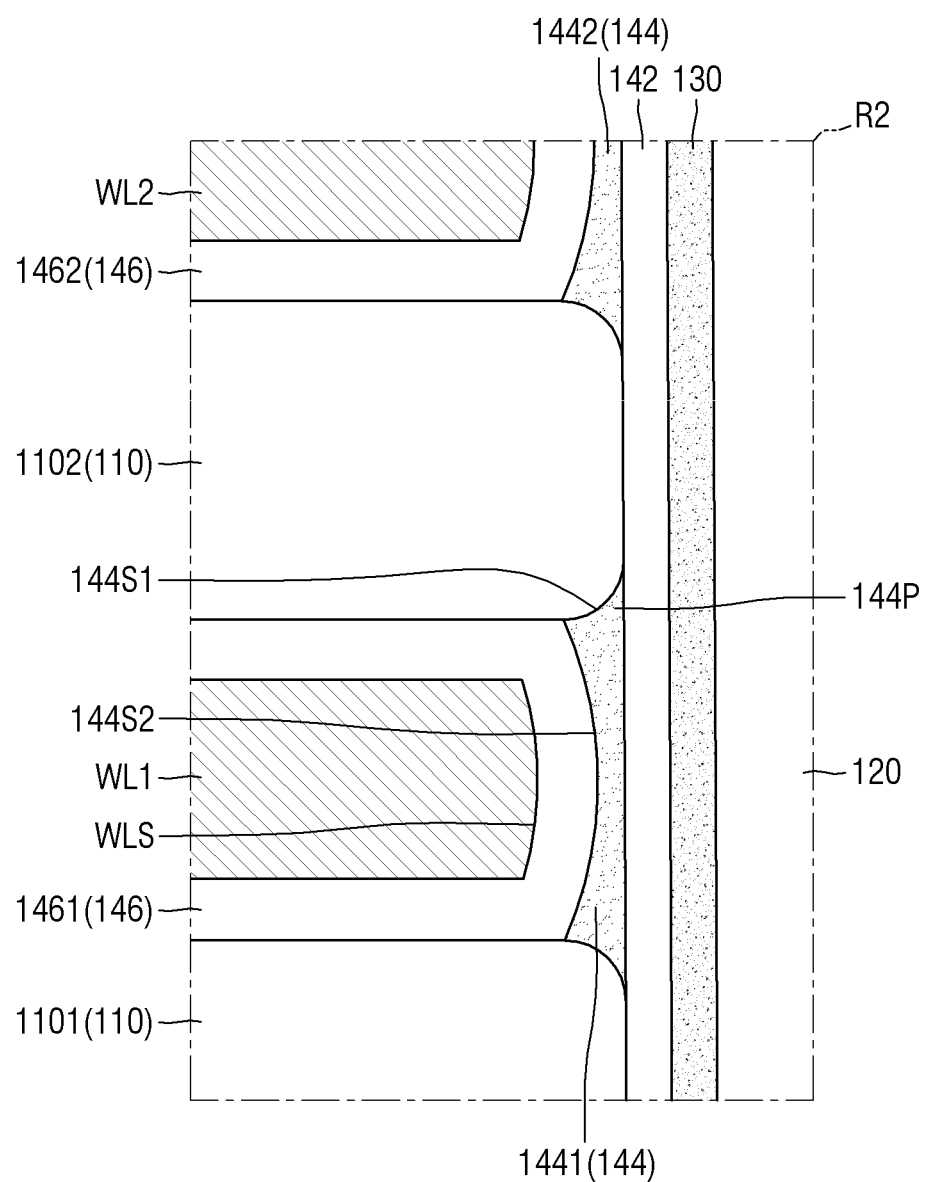

Referring to FIG. 10, in the nonvolatile memory device according to some embodiments, the charge storage films 144 and 144U may include a third concave surface 144S2.

The third concave surfaces 144S2 of the charge storage films 144 and 144U may be adjacent to the blocking insulation film 146. For example, the third concave surface 144S2 of the first charge storage film 1441 may be formed on the outer surface of the first charge storage film 1441 adjacent to the first blocking insulation film 1461.

In some embodiments, the blocking insulation films 146 and the gate electrodes (GSL, WL0 to WLn, and SSL) may extend along the profile of the third concave surface 144S2. For example, the first blocking insulation film 1461 and the first gate electrode WL1 may extend along the profile of the third concave surface 144S2 of the first charge storage film 1441. Accordingly, in some embodiments, the sidewall of the first gate electrode WL1 adjacent to the first charge storage film 1441 may include a convex surface WLS.

Figure 11:
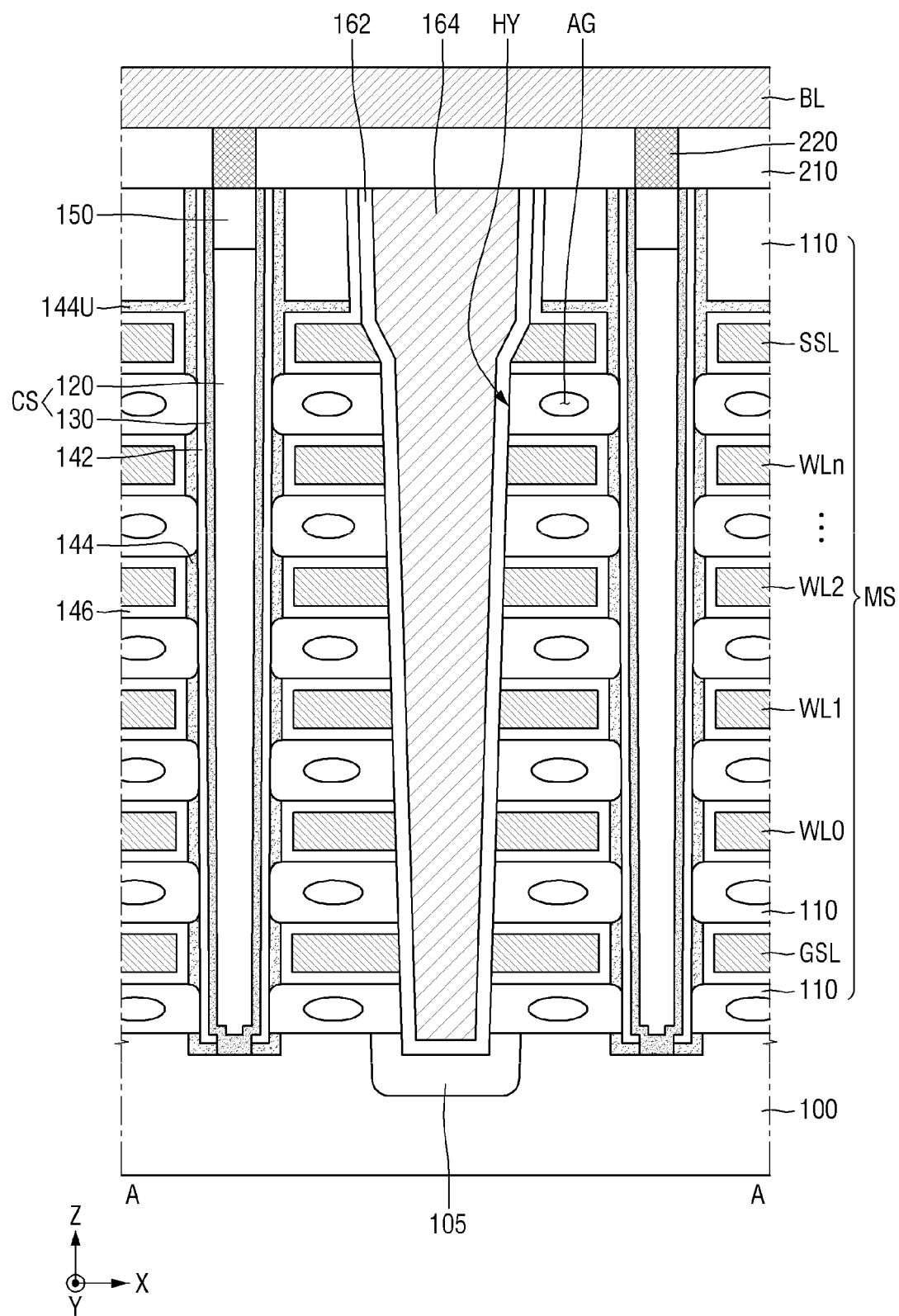
FIG. 11 is a cross-sectional view illustrating the nonvolatile memory device according to some embodiments of the technical idea of the present inventive concepts.

FIG. 11 is a cross-sectional view illustrating the nonvolatile memory device according to some embodiments of the technical idea of the present inventive concepts. For the sake of convenience of explanation, repeated parts of description provided using FIGS. 1 to 10 will be briefly described or omitted.

Referring to FIG. 11, in the nonvolatile memory device according to some embodiments, the insulating pattern 110 may include an air gap AG.

The air gap AG may be formed in each insulating pattern 110. Therefore, the air gap AG may be interposed between the gate electrodes (GSL, WL0 to WLn, and SSL). The air gap AG may be, for example, a void.

All the insulating patterns 110 are illustrated as including the air gap AG, but the technical idea of the present inventive concepts is not limited thereto. For example, some parts of the insulating patterns 110 may include the air gap AG, and other parts of the insulating patterns 110 may not include the air gap AG.

Figure 12:
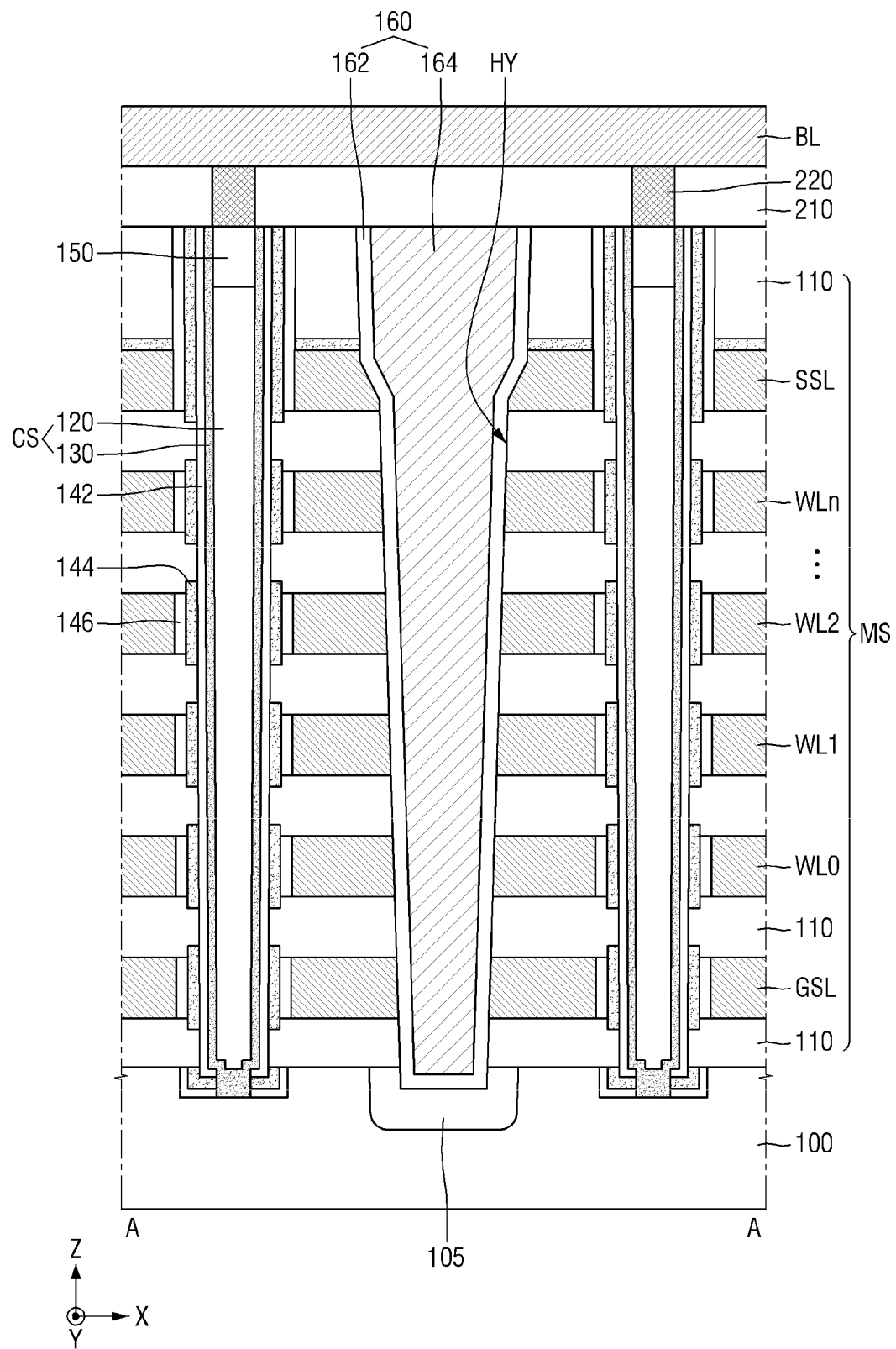
FIG. 12 is a cross-sectional view illustrating the nonvolatile memory device according to some embodiments of the technical idea of the present inventive concepts.

FIG. 12 is a cross-sectional view illustrating the nonvolatile memory device according to some embodiments of the technical idea of the present inventive concepts. For the sake of convenience of explanation, repeated parts of description provided using FIGS. 1 to 10 will be briefly described or omitted.

Referring to FIG. 12, in the nonvolatile memory device according to some embodiments, each blocking insulation film 146 may not extend along the bottom surfaces and the upper surfaces of the respective gate electrodes (GSL, WL0 to WLn, and SSL).

For example, each blocking insulation film 146 may extend only along the sidewalls of the respective gate electrodes (GSL, WL0 to WLn, and SSL). As a result, each blocking insulation film 146 may be formed between the respective gate electrodes (GSL, WL0 to WLn, and SSL) and the charge storage films 144 and 144U. Further, the blocking insulation film 146 may not be interposed between the respective gate electrodes (GSL, WL0 to WLn, and SSL) and the insulating patterns 110.

In some embodiments, the respective gate electrodes (GSL, WL0 to WLn, and SSL) and the respective insulating patterns 110 may be in direct contact with each other.

The length at which each blocking insulation film 146 extends in the third direction Z is illustrated as being equal to the length at which the respective gate electrodes (GSL, WL0 to WLn, and SSL) extend in the third direction Z. However, this is only for convenience of explanation, and the technical idea of the present inventive concepts is not limited thereto. For example, the length at which each blocking insulation film 146 extends in the third direction Z may be greater than the length at which the respective gate electrodes (GSL, WL0 to WLn, and SSL) extend in the third direction Z.

Figure 13:
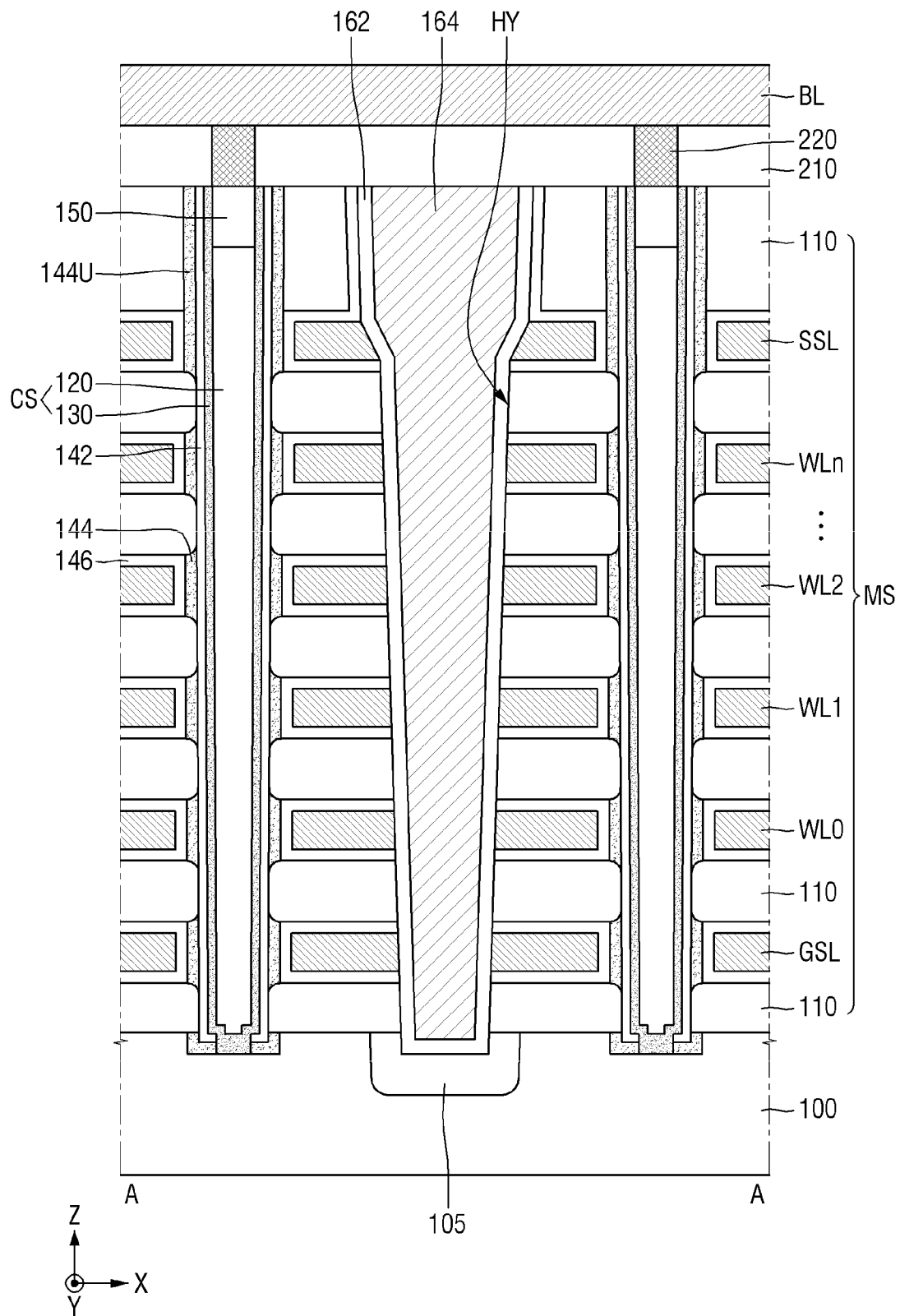
FIG. 13 is a cross-sectional view illustrating a nonvolatile memory device according to some embodiments of the technical idea of the present inventive concepts.

FIG. 13 is a cross-sectional view illustrating a nonvolatile memory device according to some embodiments of the technical idea of the present inventive concepts. For the sake of convenience of explanation, the repeated parts of description provided using FIGS. 1 to 12 will be briefly explained or omitted.

Referring to FIG. 13, in the nonvolatile memory device according to some embodiments, the upper charge storage film 144U may not extend along the upper surface of the uppermost gate electrode SSL.

For example, the upper charge storage film 144U may extend along only the sidewalls of the string selection line SSL and may not extend along the upper surface of the string selection line SSL.

Figure 14:
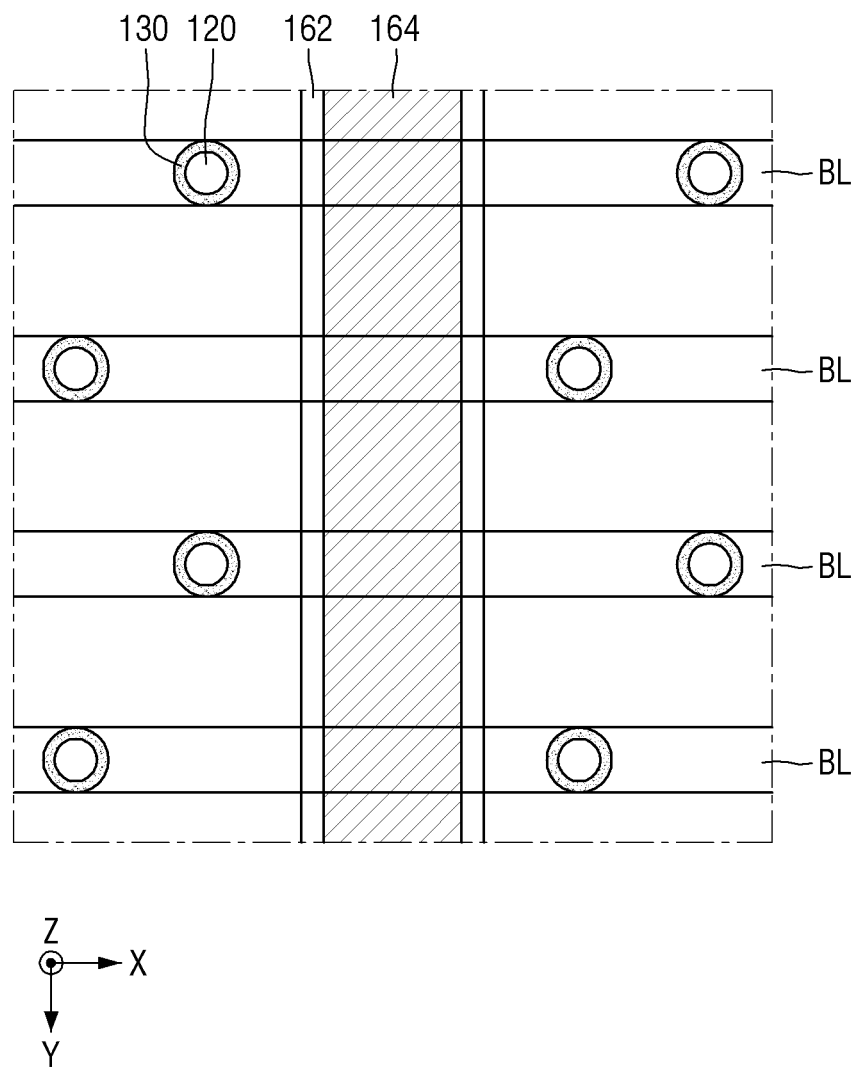
FIG. 14 is a schematic layout diagram for explaining the nonvolatile memory device according to some embodiments of the technical idea of the present inventive concepts.

FIG. 14 is a schematic layout diagram for explaining the nonvolatile memory device according to some embodiments of the technical idea of the present inventive concepts. For the sake of convenience of explanation, the repeated parts of description provided using FIGS. 1 to 13 will be briefly explained or omitted.

Referring to FIG. 14, in the nonvolatile memory device according to some embodiments, a plurality of channel structures CS may be arranged in a zigzag form.

For example, a part of the plurality of channel structures CS may form a first row arranged in a line along the second direction Y. Further, other channel structures CS adjacent to the channel structures CS forming the first row may form a second row apart from the first row in the first direction X and arranged in a line along the second direction Y. That is, in some embodiments, the plurality of channel structures CS may be formed such that they do not fully overlap the second direction Y.

Hereinafter, a method for fabricating a nonvolatile memory device according to some embodiments of the technical idea of the present inventive concepts will be described with reference to FIGS. 1 to 43.

FIG. 15a to FIG. 29 are intermediate stage diagrams for explaining the method for fabricating the nonvolatile memory device according to some embodiments of the technical idea of the present inventive concepts. For the sake of convenience of explanation, the repeated parts of description provided using reference to FIGS. 1 to 14 will be briefly explained or omitted.

Referring to 15a to 15c, a preliminary mold structure MSp including first to third sacrificial films 310, 320 and 330 is formed on the substrate 100.

Figure 15A:
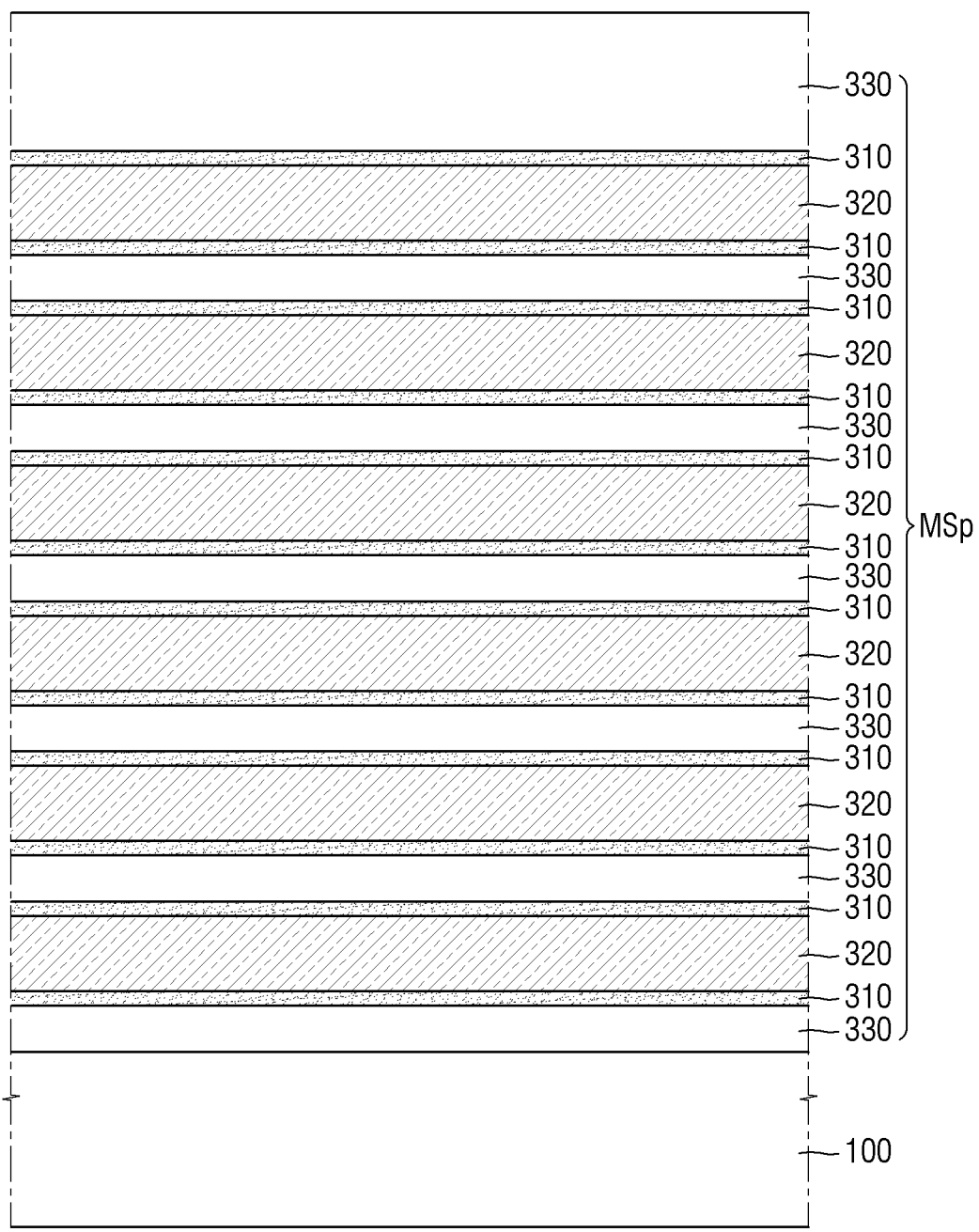
FIG. 15a to FIG. 29 are intermediate stage diagrams for explaining the method for fabricating the nonvolatile memory device according to some embodiments of the technical idea of the present inventive concepts.

In some embodiments, the second sacrificial film 320 and the third sacrificial film 330 may be alternately stacked, and the first sacrificial film 310 may be formed to be interposed between the second sacrificial film 320 and the third sacrificial film 330. For example, as illustrated in FIG. 15a, the first to third sacrificial films 310, 320 and 330 may be sequentially stacked on the substrate 100 in the order of the third sacrificial film 330, the first sacrificial film 310, the second sacrificial film 320, and the first sacrificial film 310 to form the preliminary mold structure MSp.

Figure 15B:
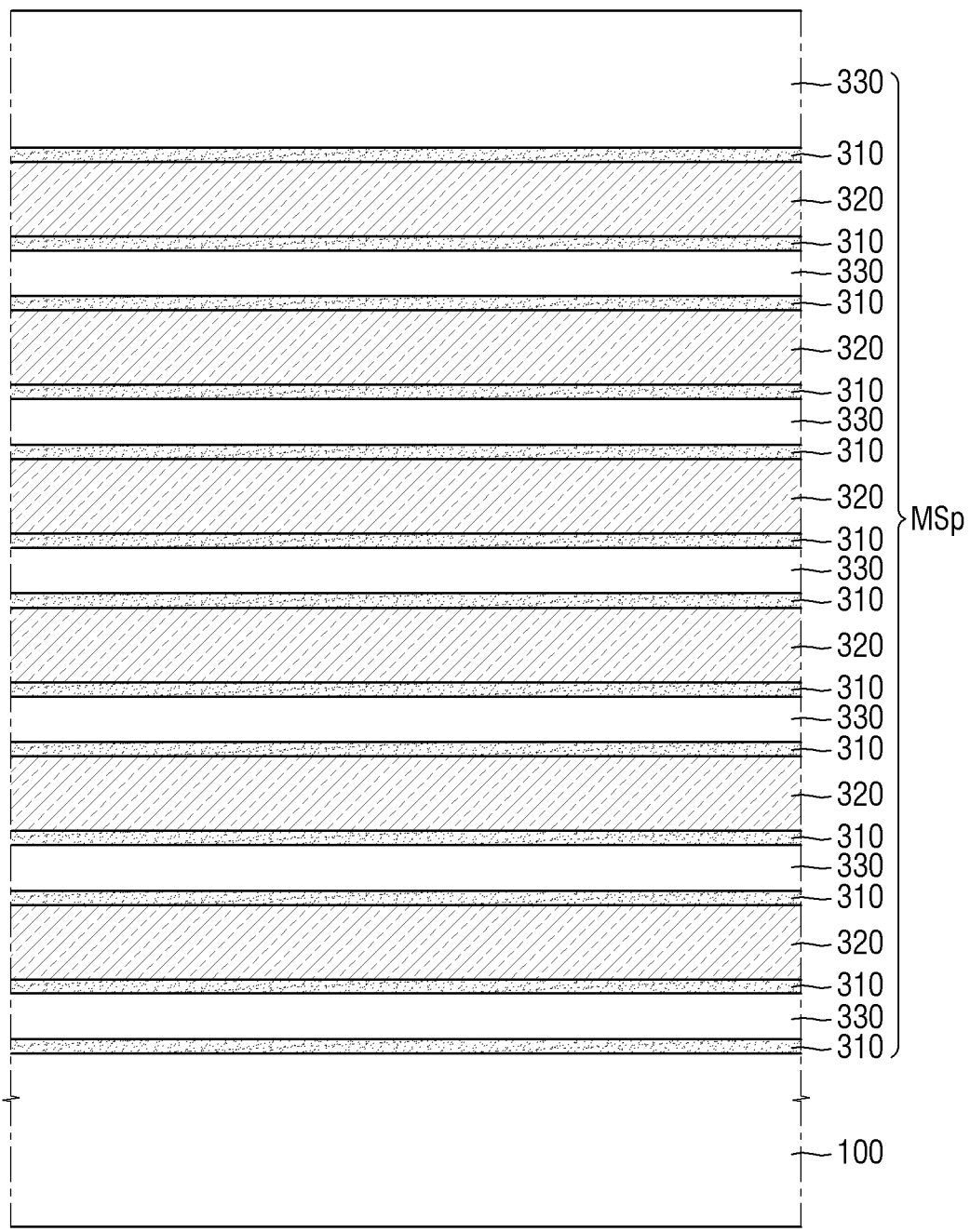
Figure 15C:
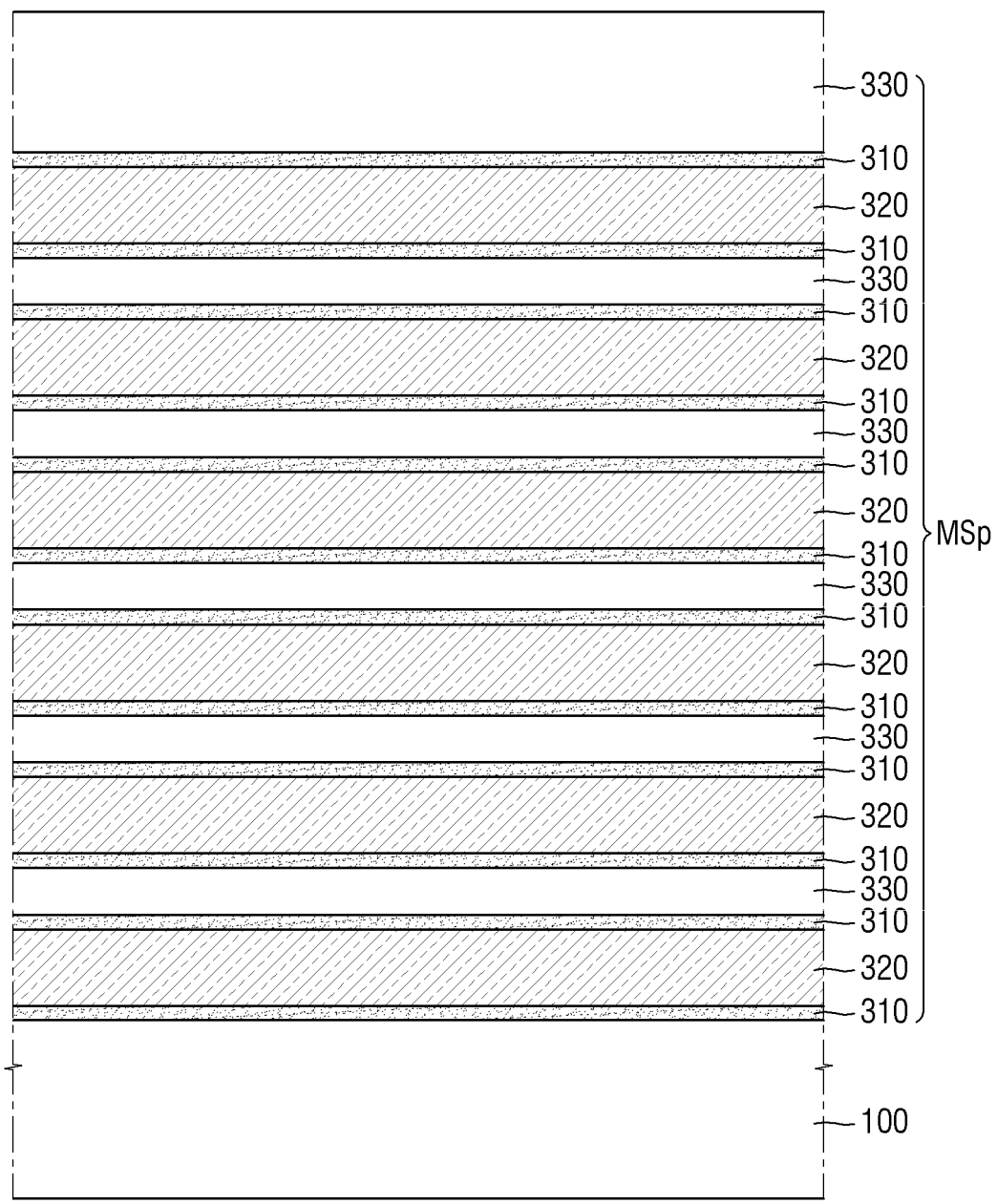

In some embodiments, as illustrated in FIG. 15b, the first to third sacrificial films 310, 320 and 330 may be repeatedly stacked on the substrate 100 in the order of the first sacrificial film 310, the third sacrificial film 330, the first sacrificial film 310 and the second sacrificial film 320 to form the preliminary mold structure MSp.

In some embodiments, as illustrated in FIG. 15b, the first to third sacrificial films 310, 320 and 330 may be repeatedly stacked on the substrate 100 in the order of the first sacrificial film 310, the second sacrificial film 320, the first sacrificial film 310 and the third sacrificial film 330 to form the preliminary mold structure MSp.

Although the respective first sacrificial films 310 are illustrated as having the same thickness, this is only for convenience of explanation, and the technical idea of the present inventive concepts is not limited thereto. For example, the lowermost first sacrificial film 310 may have a thickness different from the other first sacrificial film 310. Similarly, each second sacrificial film 320 and each third sacrificial film 330 may have thicknesses different from each other. The first sacrificial film 310 may include, for example, at least one of silicon nitride, silicon oxynitride, Si-rich nitride and nanocrystalline (Si). For convenience of explanation, the first sacrificial film 310 will be described below as containing silicon nitride.

The second sacrificial film 320 may define a region in which the aforementioned gate electrodes (GSL, WL0 to WLn, and SSL) are formed. The second sacrificial film 320 may include, for example, polysilicon, but is not limited thereto.

The third sacrificial film 330 and the first sacrificial film 310 may define a region in which the aforementioned insulating pattern 110 is formed. The third sacrificial film 330 may include, for example, silicon oxide, but is not limited thereto.

Figure 16:
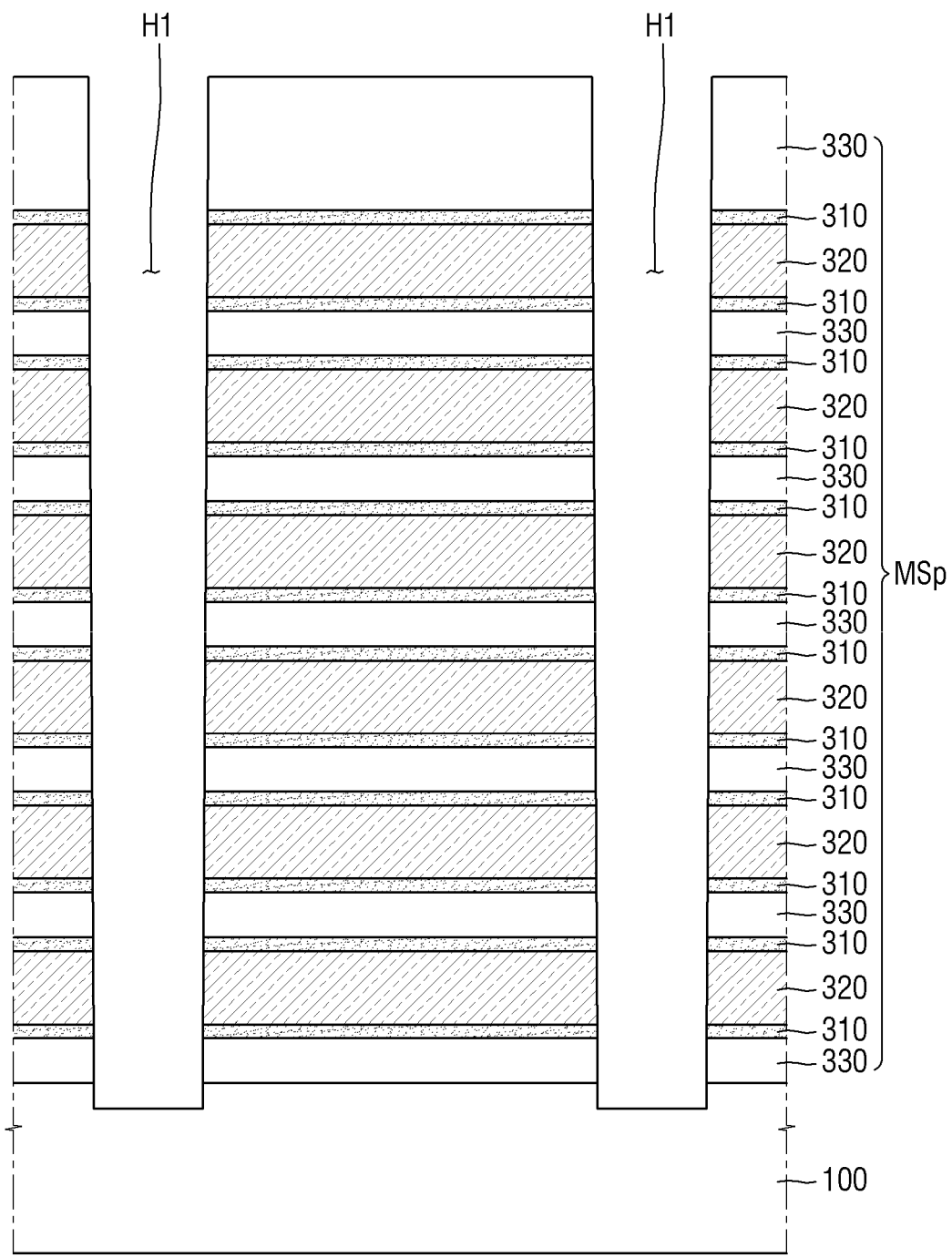

Referring to FIG. 16, a first hole H1 is formed in the preliminary mold structure MSp.

For example, a part of the preliminary mold structure MSp may be etched to form the first hole H1 penetrating through the first to third sacrificial films 310, 320 and 330. The first hole H1 may be formed to penetrate the preliminary mold structure MSp and expose a part of the substrate 100. In some embodiments, formation of the first hole H1 may include etching a part of the upper part of the substrate 100.

In some embodiments, the first hole H1 may have a tapered shape. For example, the width of the first hole H1 may become narrower approaching the substrate 100. The shape of the first hole H1 may be caused by the characteristics of an etching process for forming the first hole H1, but is not limited thereto.

Figure 17:
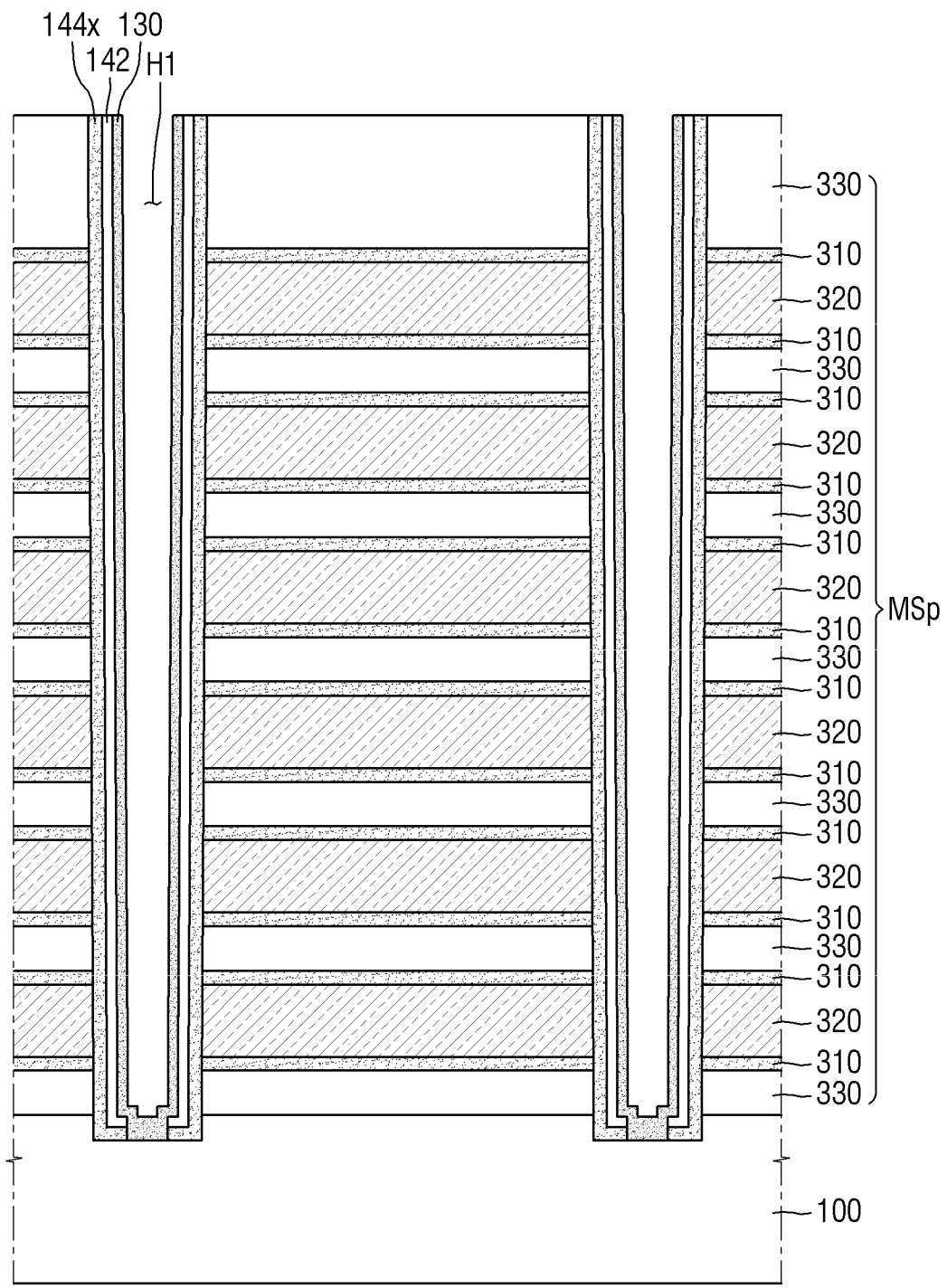

Referring to FIG. 17, a preliminary charge storage film 144x, a tunnel insulating film 142 and a semiconductor pattern 130 are sequentially formed in the first hole H1.

The semiconductor pattern 130 may be formed to be connected to the substrate 100. For example, the semiconductor pattern 130 may be formed to penetrate the bottom surface of the preliminary charge storage film 144x and the bottom surface of the tunnel insulating film 142 to be connected to the substrate 100.

The preliminary charge storage film 144x, the tunnel insulating film 142 and the semiconductor pattern 130 may extend along the profile of the first hole H1. The preliminary charge storage film 144x, the tunnel insulating film 142 and the semiconductor pattern 130 are illustrated as filling only a part of the first hole H1, but the technical idea of the present inventive concepts is not limited thereto. For example, in some embodiments, the semiconductor pattern 130 may be formed to fill all the remaining regions of the first hole H1.

The preliminary charge storage film 144x may include, for example, at least one of silicon nitride, silicon oxynitride, Si-rich nitride and nanocrystalline (Si). In some embodiments, the preliminary charge storage film 144x may have substantially the same material composition as the first sacrificial film 310. For example, the preliminary charge storage film 144x may include silicon nitride.

Figure 18:
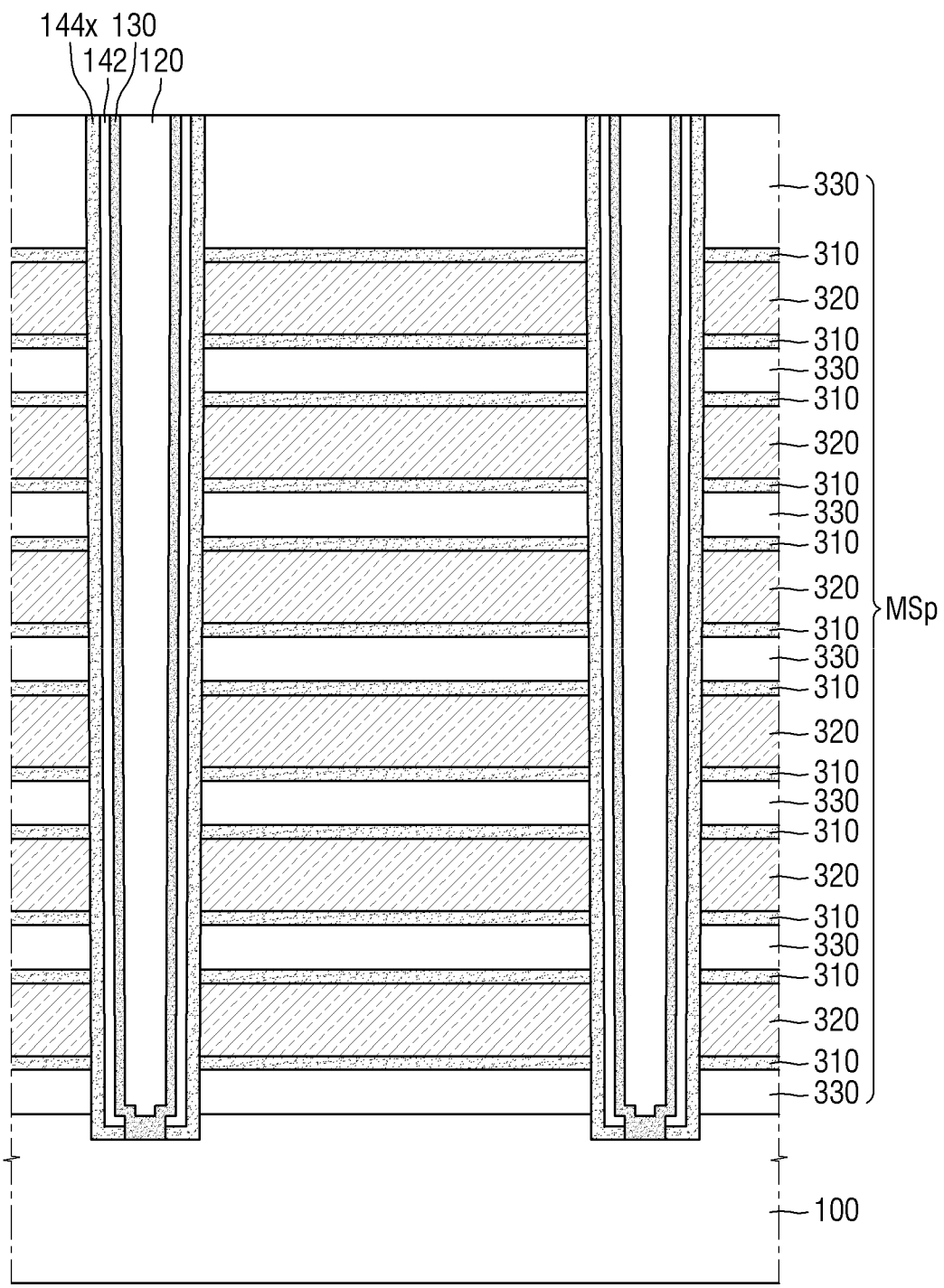

Referring to FIG. 18, a filling insulating pattern 120 is formed on the semiconductor pattern 130.

The filling insulating pattern 120 may be formed to fill all the remaining regions of the first hole H1. The filling insulating pattern 120 may include, for example, silicon oxide, but is not limited thereto.

Figure 19:
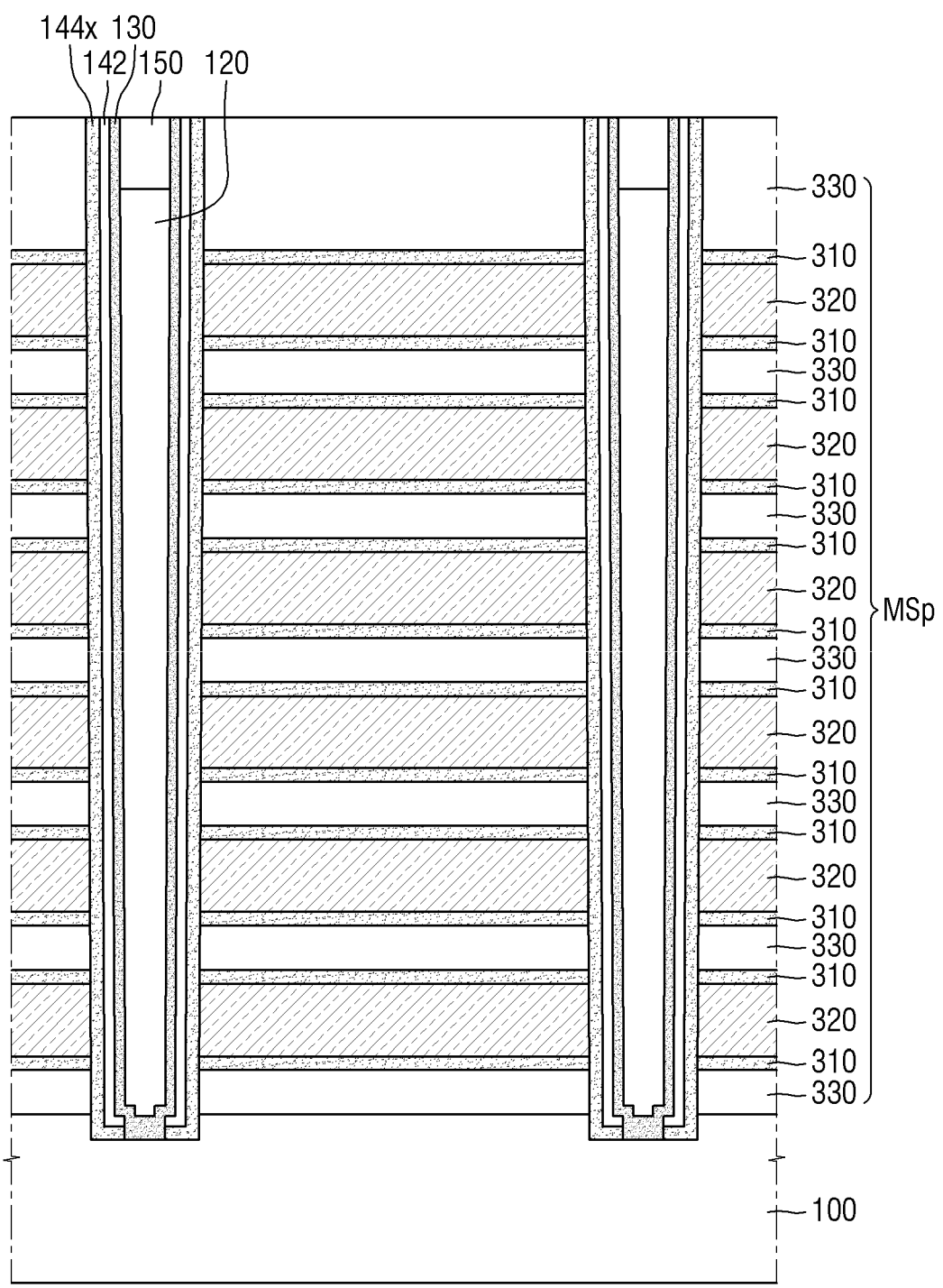

Referring to FIG. 19, a channel pad 150 connected to the semiconductor pattern 130 is formed.

For example, the upper part of the filling insulating pattern 120 may be removed, and the channel pad 150 may be formed on the remaining filling insulating pattern 120. Although the width of the channel pad 150 is illustrated as being the same as the width of the filling insulating pattern 120, the technical idea of the present inventive concepts is not limited thereto. For example, the channel pad 150 may be formed after removal of the upper parts of the semiconductor pattern 130, the tunnel insulating film 142 and/or the preliminary charge storage film 144x.

The channel pad 150 may include, for example, impurity-doped polysilicon, but is not limited thereto.

Figure 20:
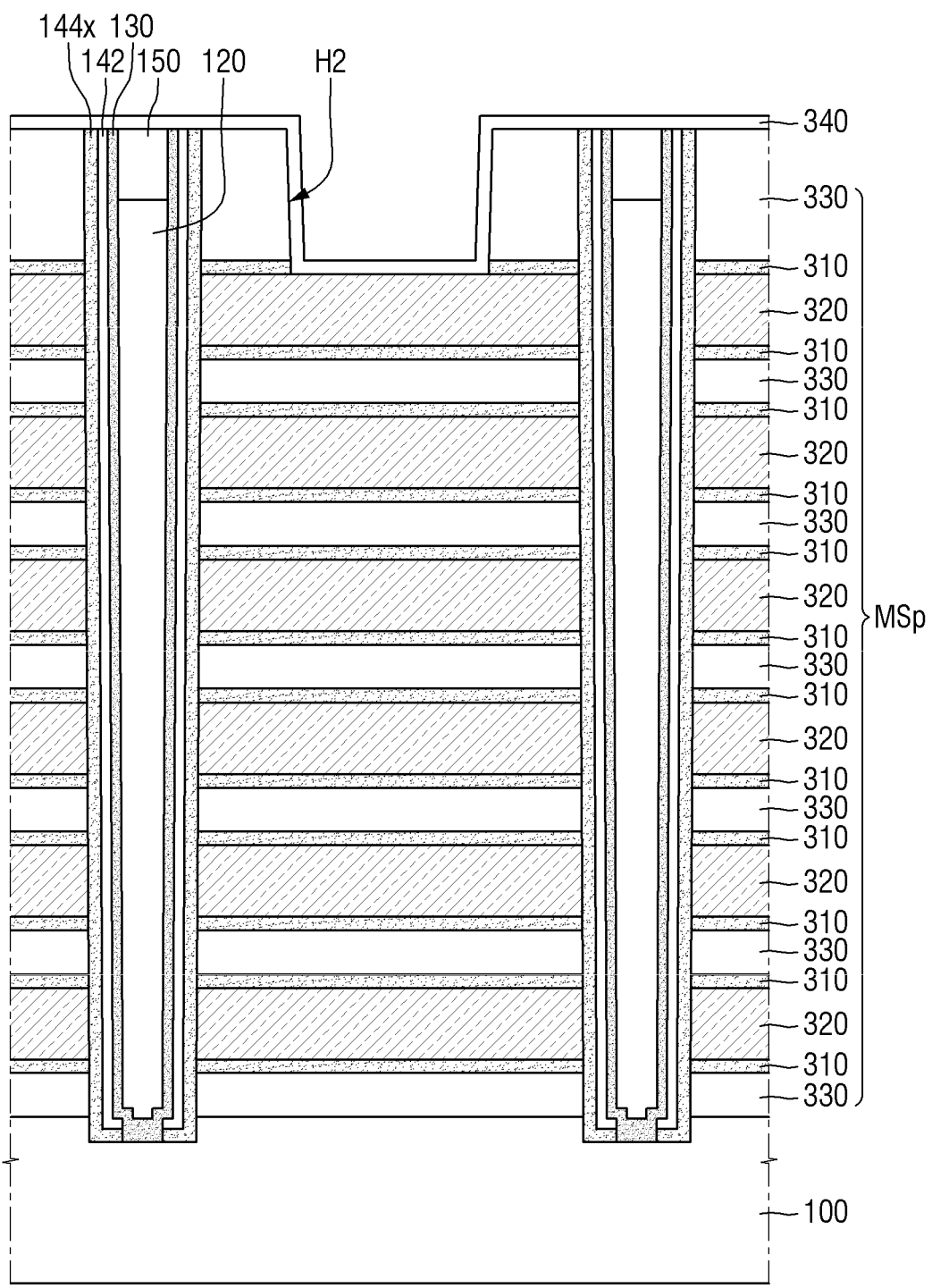

Referring to FIG. 20, a second hole H2 is formed in the uppermost third sacrificial film 330.

The second hole H2 may be formed to extend in the second direction (Y of FIG. 3) between the semiconductor patterns 130 adjacent to each other. In some embodiments, the second hole H2 may be formed to expose the uppermost second sacrificial film 320.

Subsequently, a protective film 340 covering the preliminary mold structure MSp is formed. The protective film 340 may extend along the profile of the second hole H2. As a result, the protective film 340 may cover the uppermost first sacrificial film 310, the uppermost second sacrificial film 320, and the uppermost third sacrificial film 330.

The protective film 340 may include, for example, polysilicon, but is not limited thereto. In some embodiments, the protective film 340 may have substantially the same material composition as that of the second sacrificial film 320.

Figure 21:
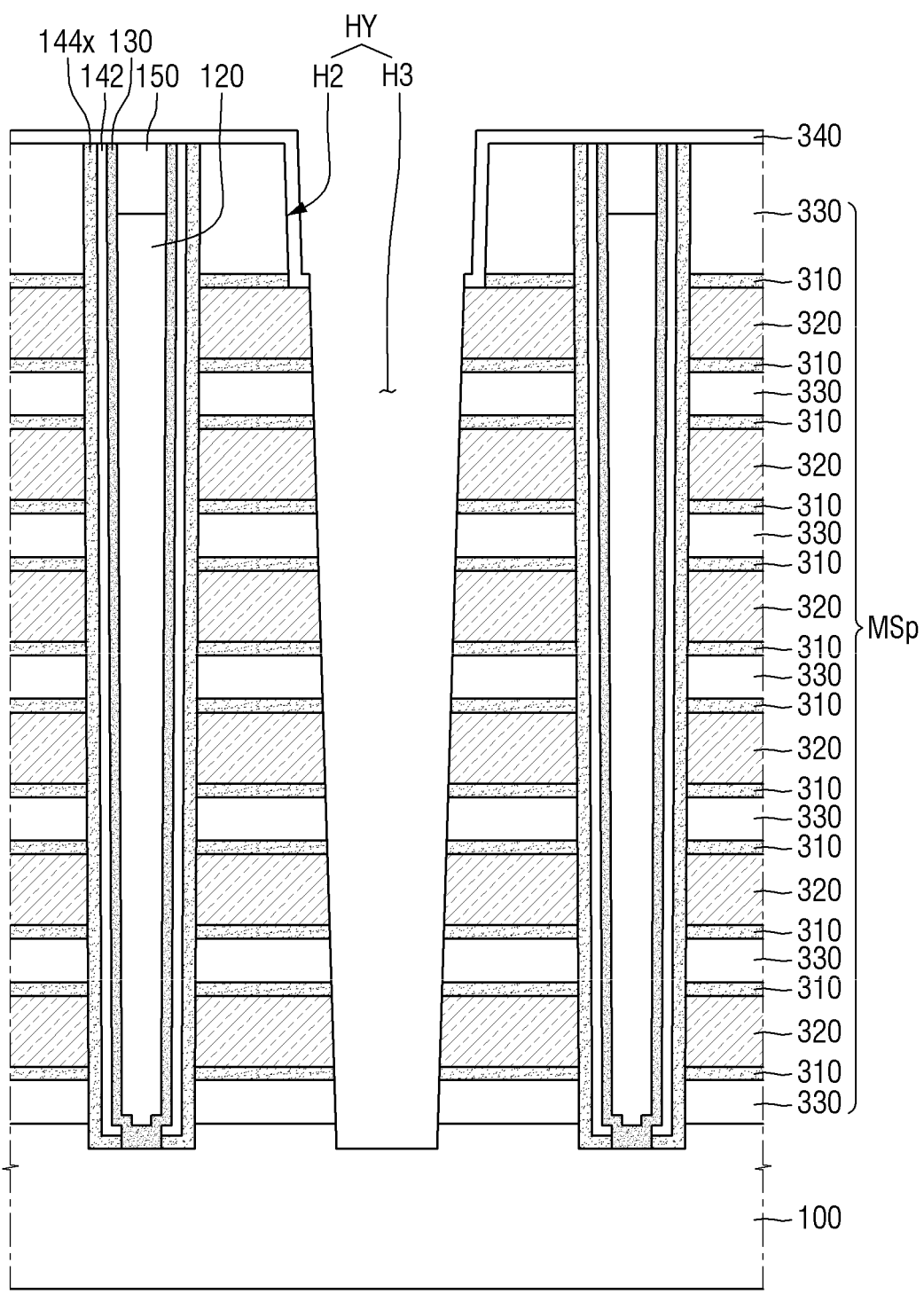

Referring to FIG. 21, a third hole H3 is formed in the preliminary mold structure MSp.

The third hole H3 may be formed to extend in the second direction (Y of FIG. 3) between the semiconductor patterns 130 adjacent to each other. Also, the third hole H3 may be formed to overlap the second hole H2. A part of the protective film 340 in the second hole H2 may be removed by the third hole H3. The second hole H2 and the third hole H3 may form a separation hole HY.

The first to third sacrificial films 310, 320 and 330 may be exposed by the separation hole HY. However, in some embodiments, the protective film 340 on the sidewalls of the second hole H2 may not be removed. For example, the width of the third hole H3 may be formed to be smaller than the width of the second hole H2. As a result, the protective film 340 may still cover the uppermost first sacrificial film 310 and the uppermost third sacrificial film 330. Further, a separation hole HY including a step may be formed on the sidewalls adjacent to the uppermost second sacrificial film 320.

Figure 22:
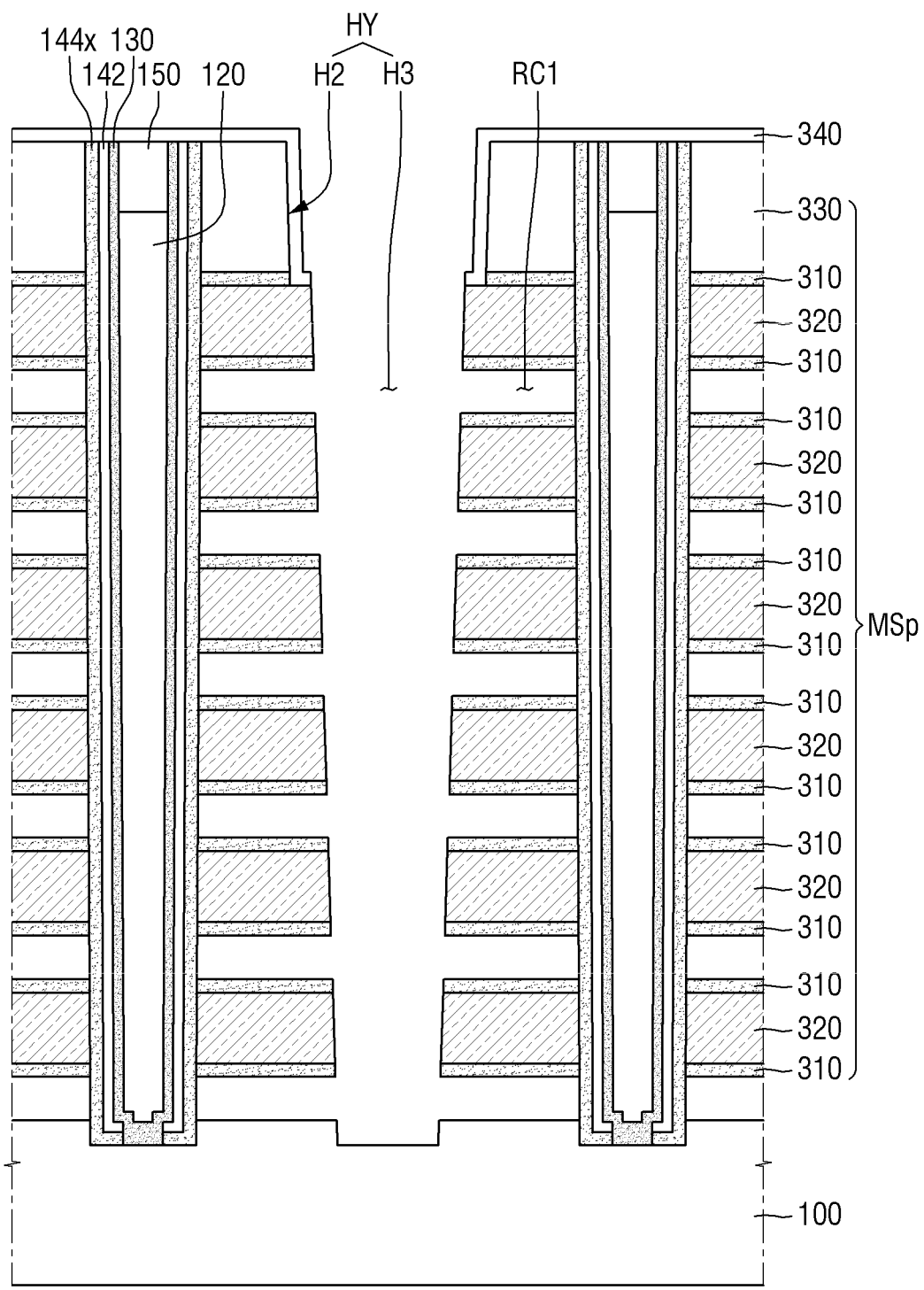

Referring to FIG. 22, the third sacrificial film 330 exposed by the separation hole HY is removed.

For example, a first etchback process on the third sacrificial film 330 may be performed to form a first recess RC1 in the region of the third sacrificial film 330 exposed by the separation hole HY. The first recess RC1 may expose a part of the preliminary charge storage film 144x. In some embodiments, the uppermost third sacrificial film 330 is protected by the protective film 340 and may be not removed by the first etchback process.

Figure 23:
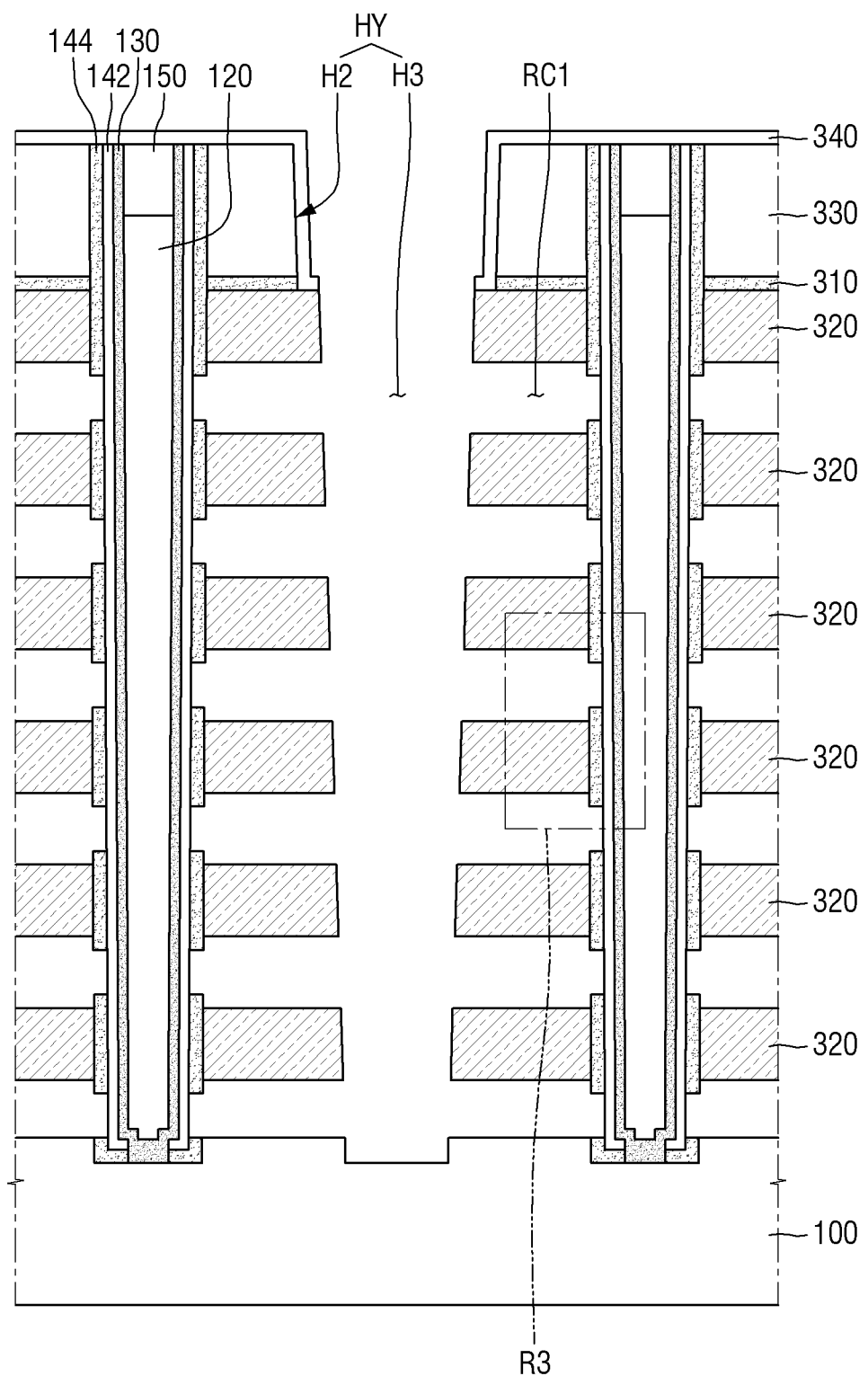
Figure 24:
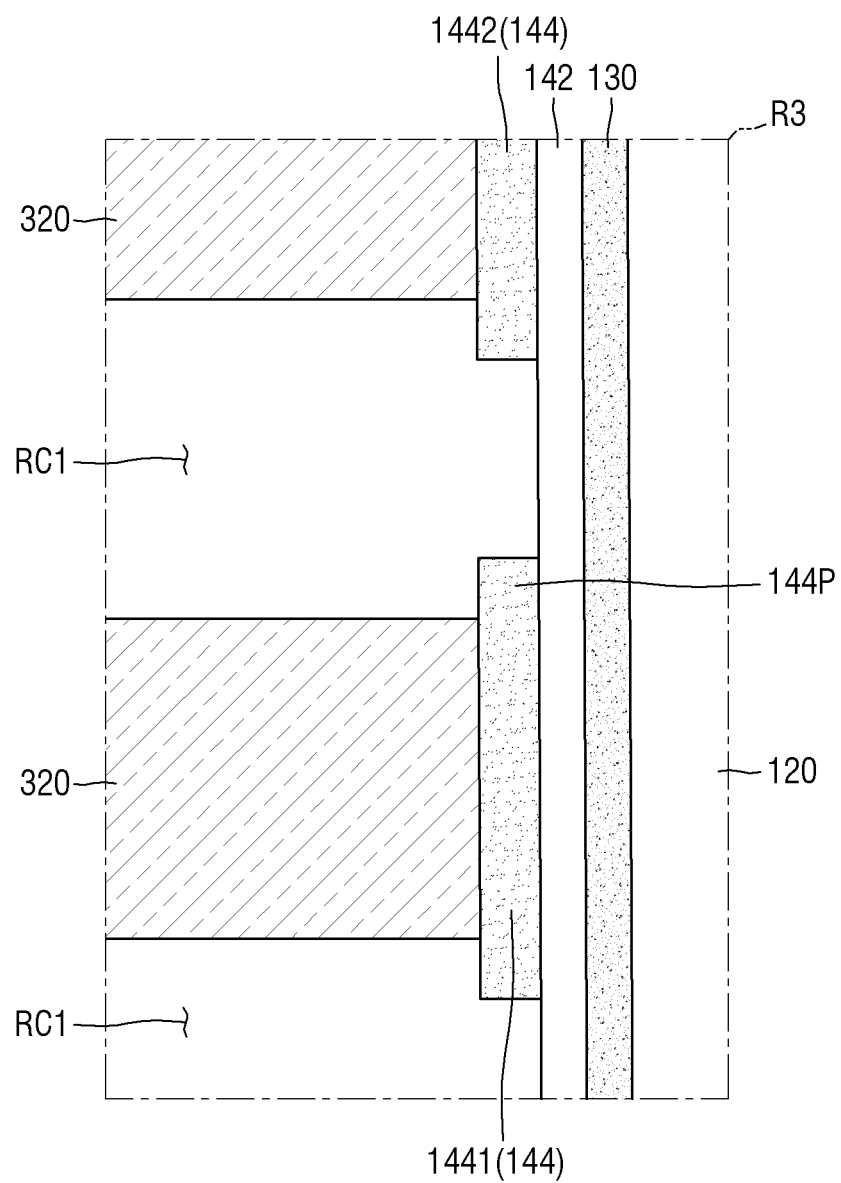
Figure 25:
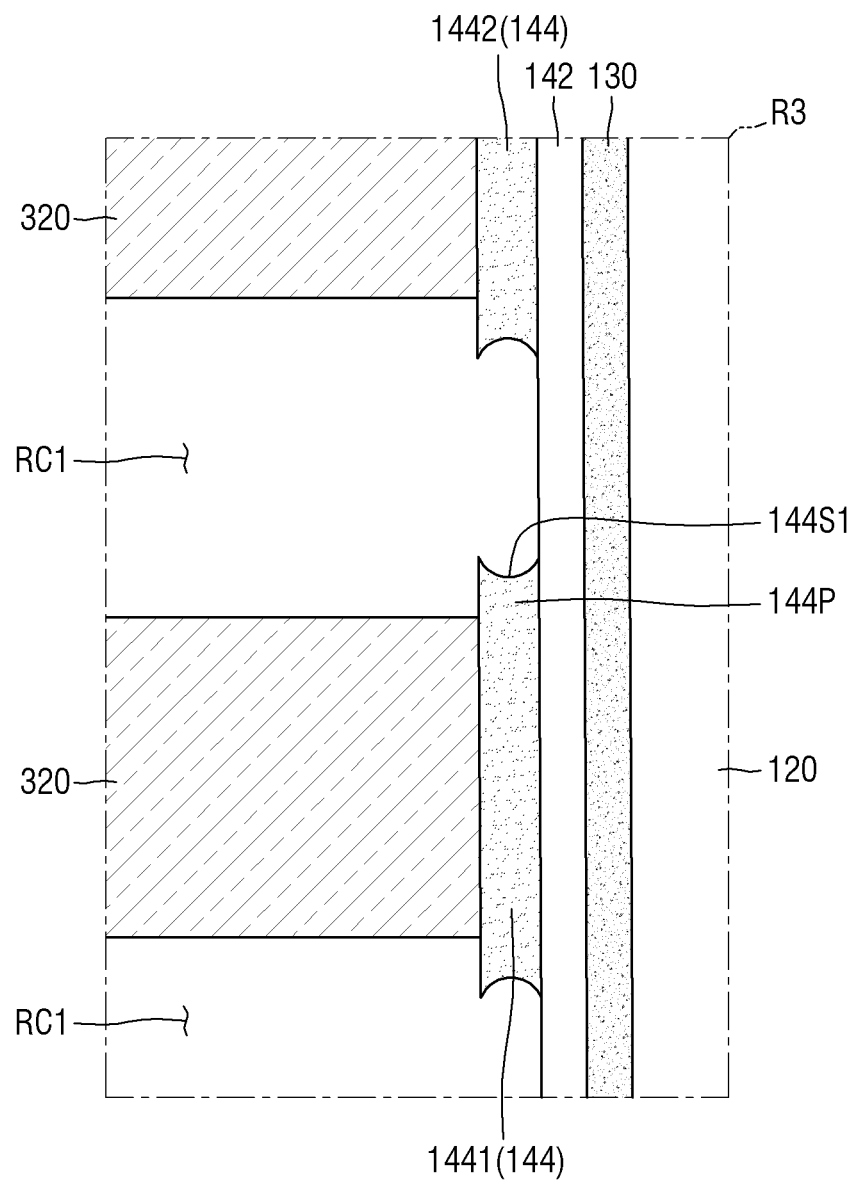

Referring to FIGS. 23 to 25, a second etchback process on the preliminary charge storage film 144x exposed by the first recess RC1 is performed. For reference, FIGS. 24 and 25 are various enlarged views of a region R3 of FIG. 23.

As a result, the charge storage films 144 apart from each other in the third direction Z may be formed. In the course of performing the second etchback process, at least a part of the preliminary charge storage film 144x overlapping the first sacrificial film 310 may be protected. As a result, each charge storage film 144 may include a protrusion 144P protruding from the second sacrificial film 320.

FIGS. 23 and 24 illustrate that all the parts of the preliminary charge storage film 144x overlapping the first sacrificial film 310 are not removed, but this is for convenience of explanation, and the technical idea of the present inventive concepts is not limited thereto.

The first sacrificial film 310 may be removed in the second etchback process or in a subsequent process. In some embodiments, the uppermost first sacrificial film 310 is protected by the protective film 340 and may not be removed by the second etchback process. The lowermost first sacrificial film 310 is illustrated as not being removed, but this is only for convenience of explanation, and at least a part of the lowermost first sacrificial film 310 may be removed in the second etchback process or in a subsequent process.

In some embodiments, a part of the preliminary charge storage film 144x adjacent to the substrate 100 may not be removed. As a result, a part of the charge storage films 144 may remain on the upper surface of the substrate 100. However, this is only for convenience of explanation, and the technical idea of the present inventive concepts is not limited thereto. For example, a part of the charge storage films 144 may not remain on the upper surface of the substrate 100, depending on the characteristics of the process of forming the charge storage films 144.

Referring to FIG. 25, in the nonvolatile memory device according to some embodiments, the protrusions 144P of the charge storage films 144 may include a first concave surface 144S1. The first concave surface 144S1 may be attributed, for example, to the characteristics of the second etchback process.

Figure 26:
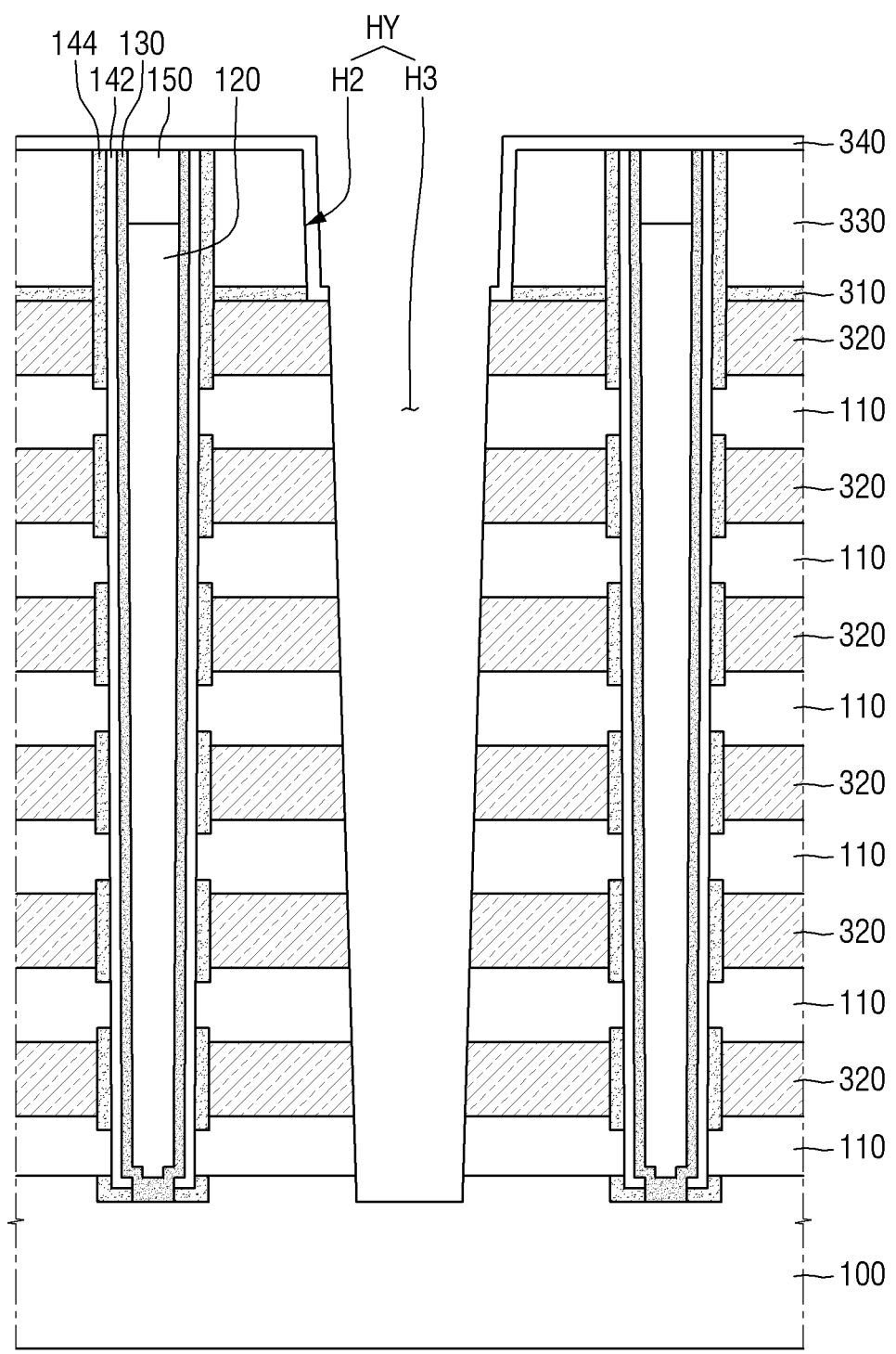

Referring to FIG. 26, a plurality of insulating patterns 110 is formed in the first recess RC1.

As a result, the insulating patterns 110 alternately stacked with the second sacrificial film 320 may be formed. The plurality of insulating patterns 110 may include, for example, silicon oxide, but is not limited thereto.

Figure 27:
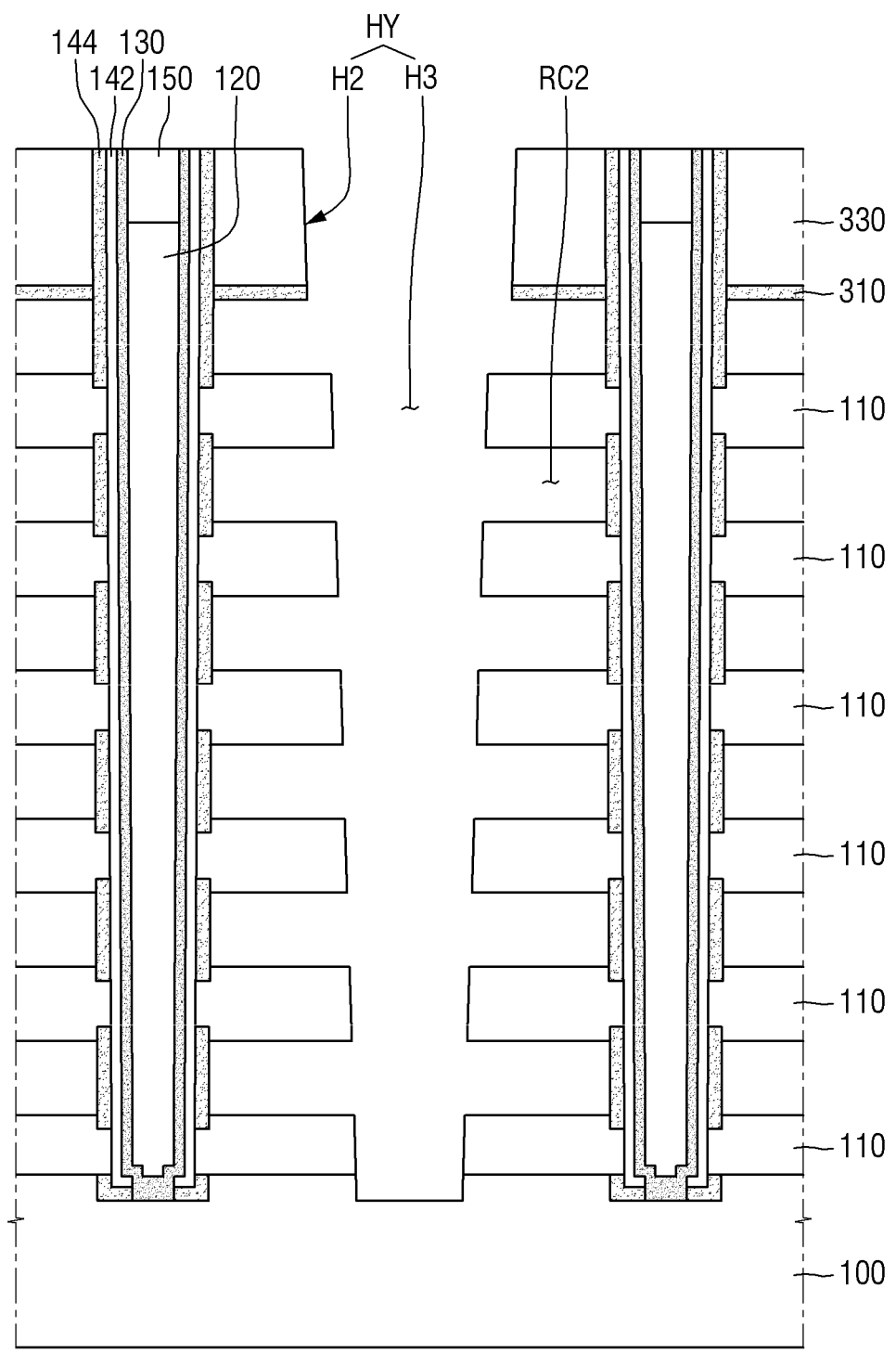

Referring to FIG. 27, the second sacrificial film 320 exposed by the separation hole HY is removed.

For example, a third etchback process on the second sacrificial film 320 may be performed to form a second recess RC2 in the region of the second sacrificial film 320 exposed by the separation hole HY.

Figure 28:
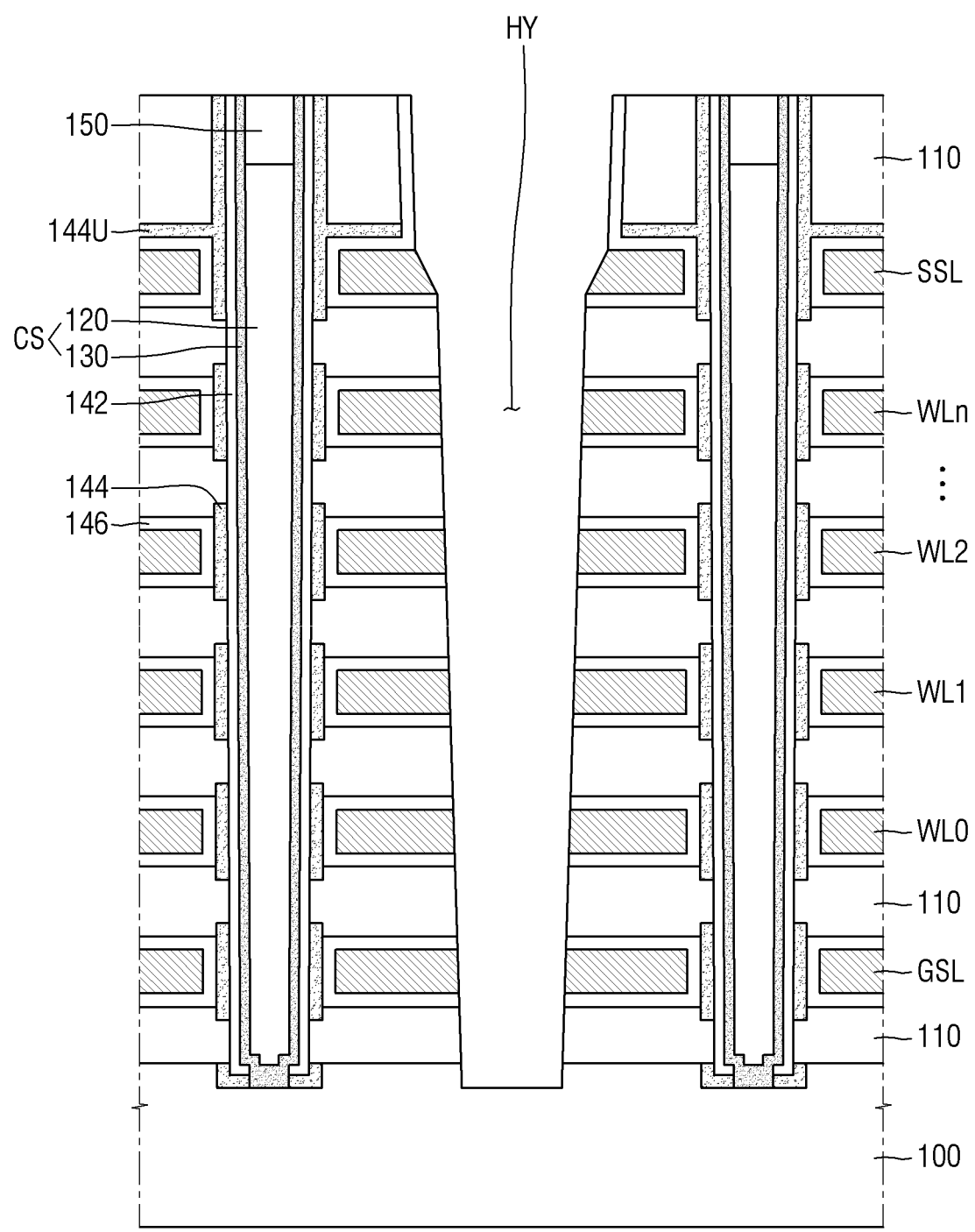

Referring to FIG. 28, the blocking insulation films 146 and the gate electrodes (GSL, WL0 to WLn, and SSL) are sequentially formed in the second recess RC2.

For example, the blocking insulation films 146 may be formed along the profile of the second recess RC2. Subsequently, the gate electrodes (GSL, WL0 to WLn, and SSL) for filling the second recess RC2 may be formed on the blocking insulation films 146.

As a result, each blocking insulation film 146 may be formed to surround the respective gate electrodes (GSL, WL0 to WLn, and SSL). In addition, a plurality of gate electrodes (GSL, WL0 to WLn, and SSL) alternately stacked with the plurality of insulating patterns 110 may be formed.

Figure 29:
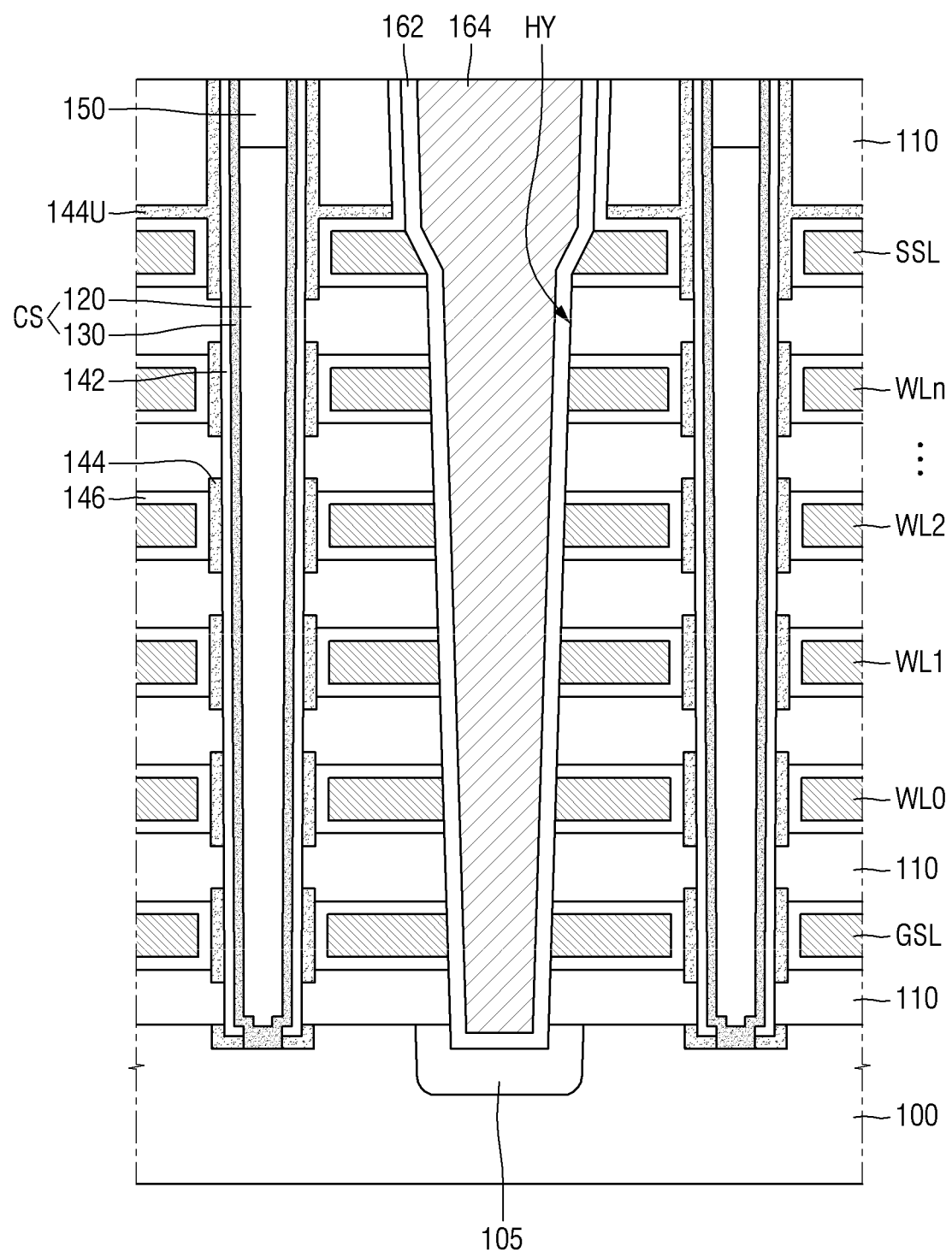

Referring to FIG. 29, an impurity region 105 is formed in the region of the substrate 100 exposed by the separation hole HY.

Formation of the impurity region 105 may be performed by, for example, an ion implantation process, but is not limited thereto.

Next, an insulating spacer 162 and a common source plug pattern 164 are formed in the separation hole HY. For example, the insulating spacer 162 may be formed along the profile of the separation hole HY. Subsequently, the common source plug pattern 164 penetrating the bottom surface of the insulating spacer 162 and connected to the impurity region 105 may be formed.

Subsequently, the bit lines BL connected to the channel pad 150 may be formed. Therefore, the nonvolatile memory device of FIG. 3 may be fabricated.

Figure 30:
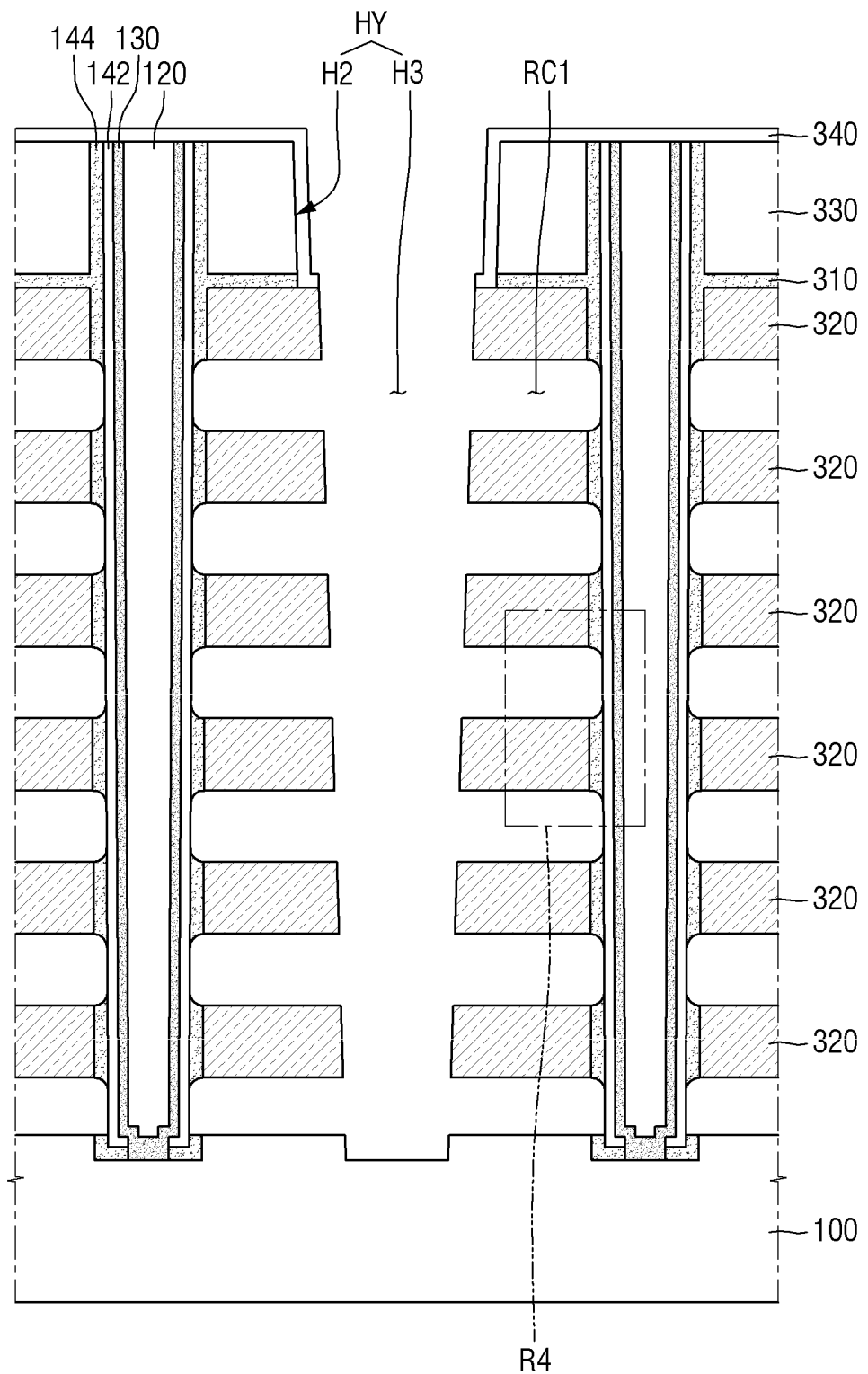
FIGS. 30 to 36 are intermediate step diagrams for explaining a method for fabricating a nonvolatile memory device according to some embodiments of the technical idea of the present inventive concepts.

FIGS. 30 to 36 are intermediate step diagrams for explaining a method for fabricating a nonvolatile memory device according to some embodiments of the technical idea of the present inventive concepts. For the sake of convenience of explanation, repeated parts of description provided using FIGS. 1 to 29 will be briefly described or omitted. For reference, FIG. 30 is a diagram for explaining steps after FIG. 22.

Figure 31:
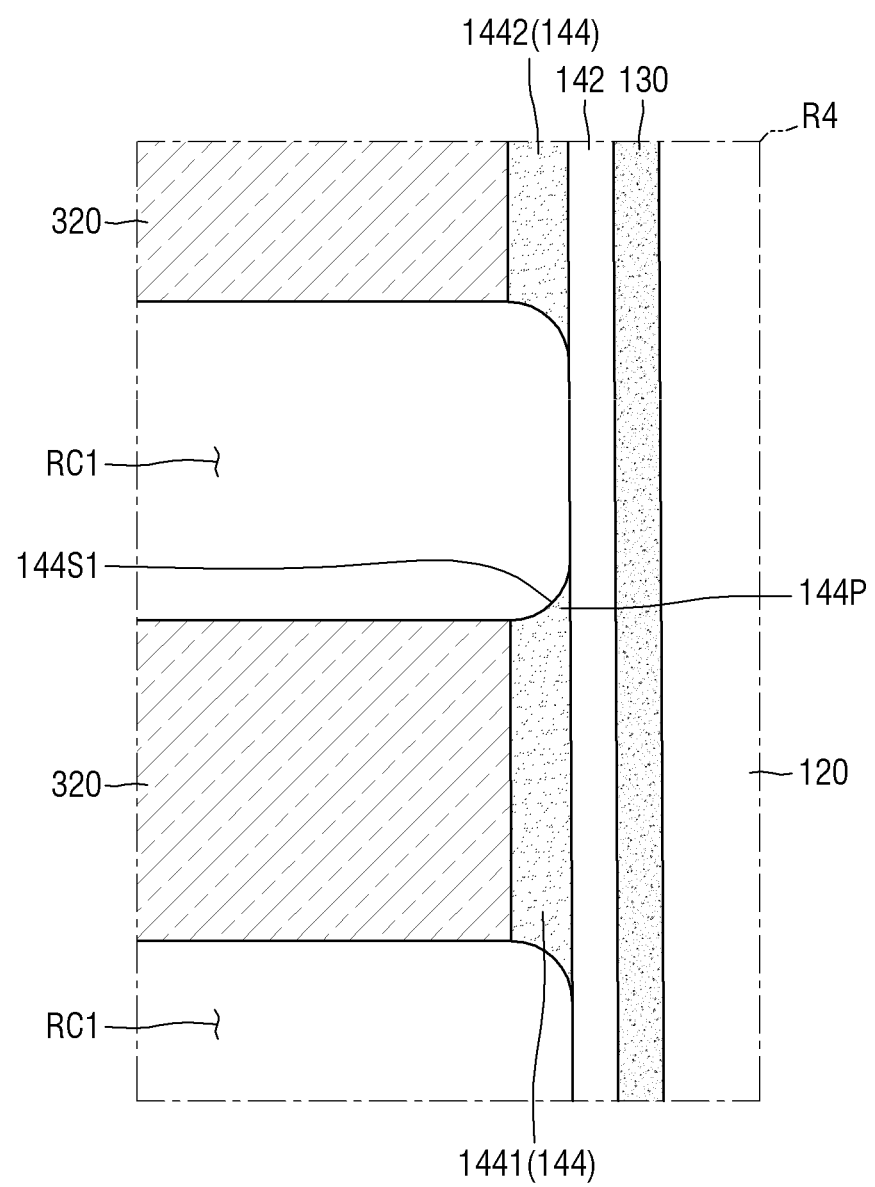
Figure 32:
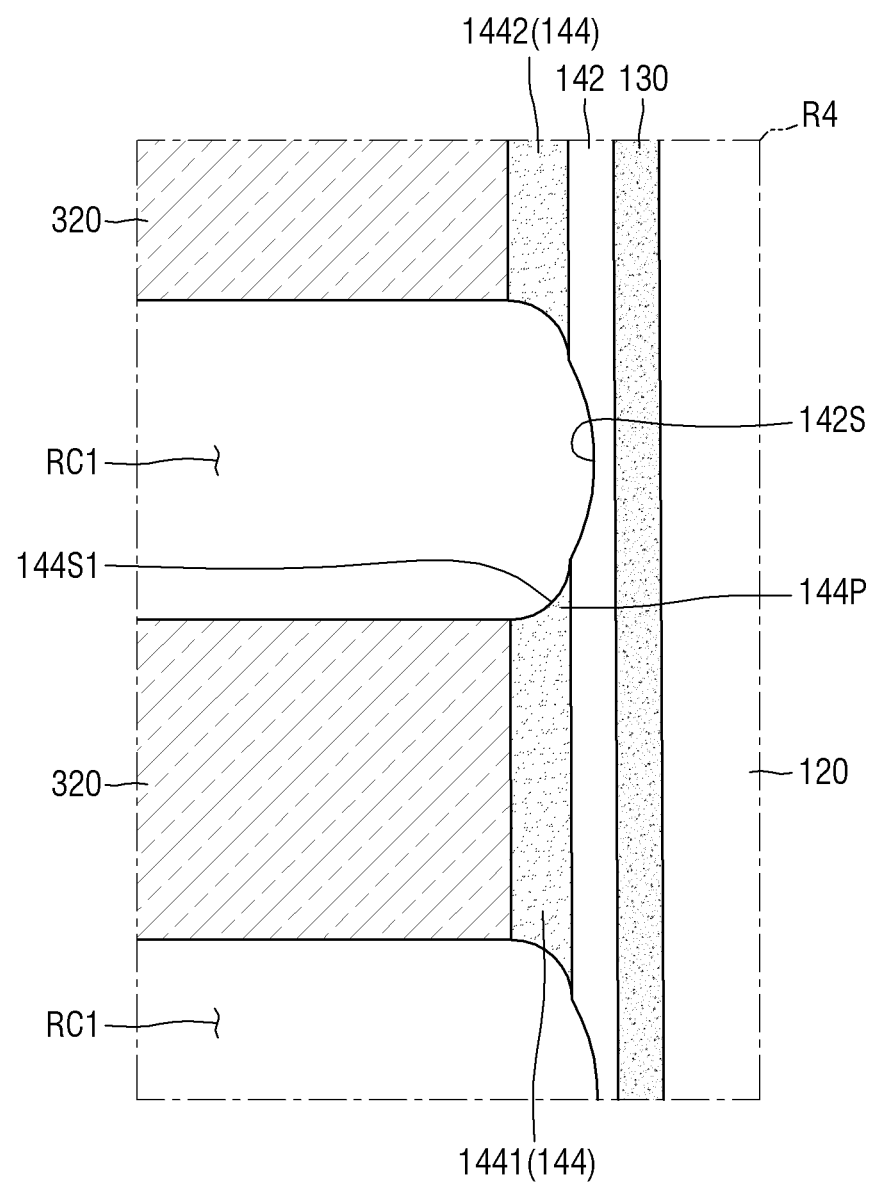

Referring to FIGS. 30 to 32, the second etchback process on the preliminary charge storage film 144x exposed by the first recess RC1 is performed. For reference, FIGS. 31 and 32 illustrate various enlarged views of a region R4 of FIG. 30.

Referring to FIG. 31, in the nonvolatile memory device according to some embodiments, the length at which the charge storage films 144 extends in the third direction Z may increase as it approaches the semiconductor pattern 130.

For example, the protrusions 144P of the charge storage films 144 may include a first concave surface 144S1. The first concave surface 144S1 may be attributed, for example, to the characteristics of the second etchback process.

Referring to FIG. 32, in the nonvolatile memory device according to some embodiments, the tunnel insulating film 142 may include a second concave surface 142S. The second concave surface 142S may be attributed, for example, to the characteristics of the second etchback process.

Figure 33:
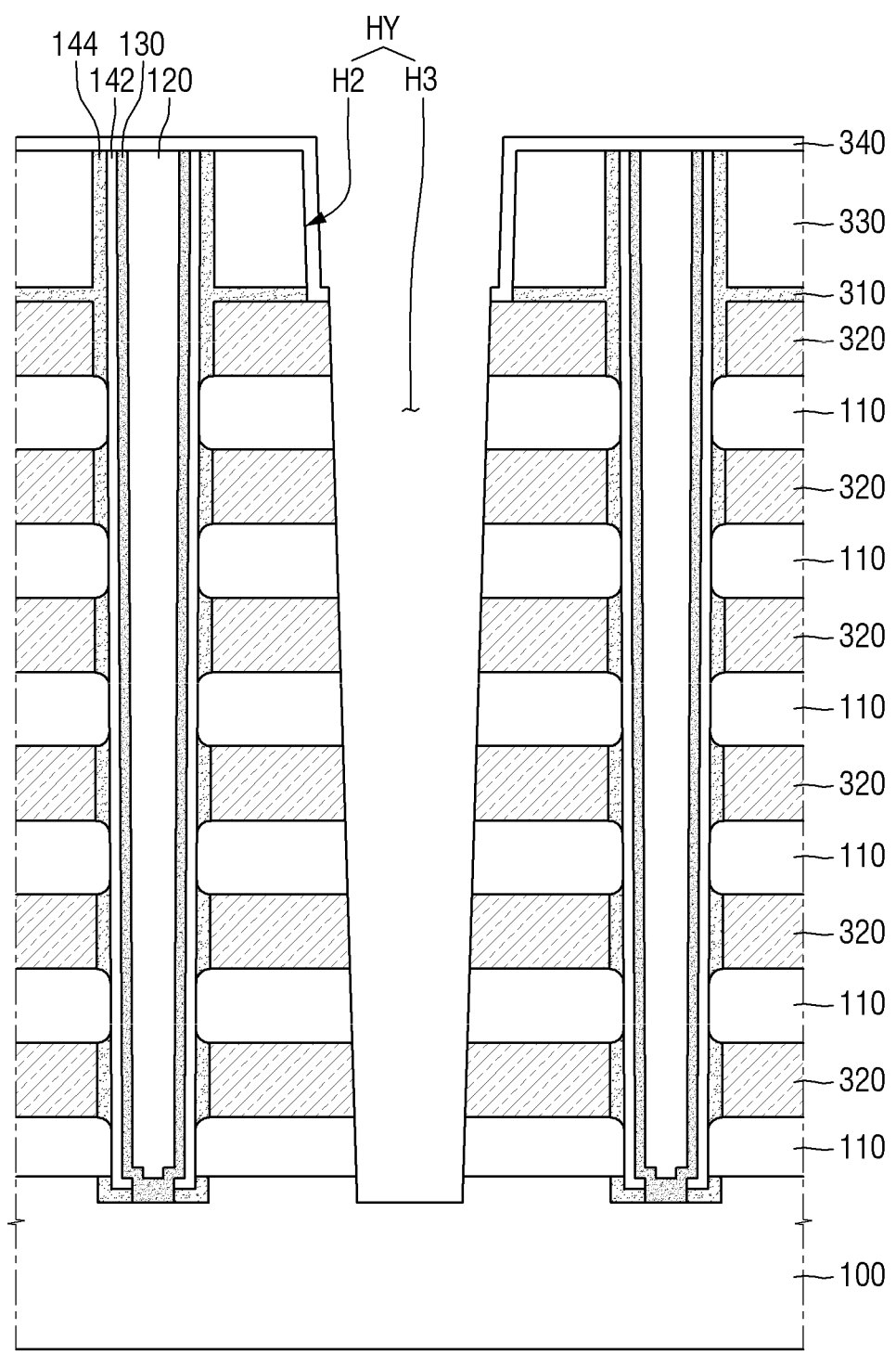

Referring to FIG. 33, a plurality of insulating patterns 110 is formed in the first recess RC1. Since formation of the plurality of insulating patterns 110 is substantially the same as that described using FIG. 26, the detailed description thereof will not be provided below.

Figure 34:
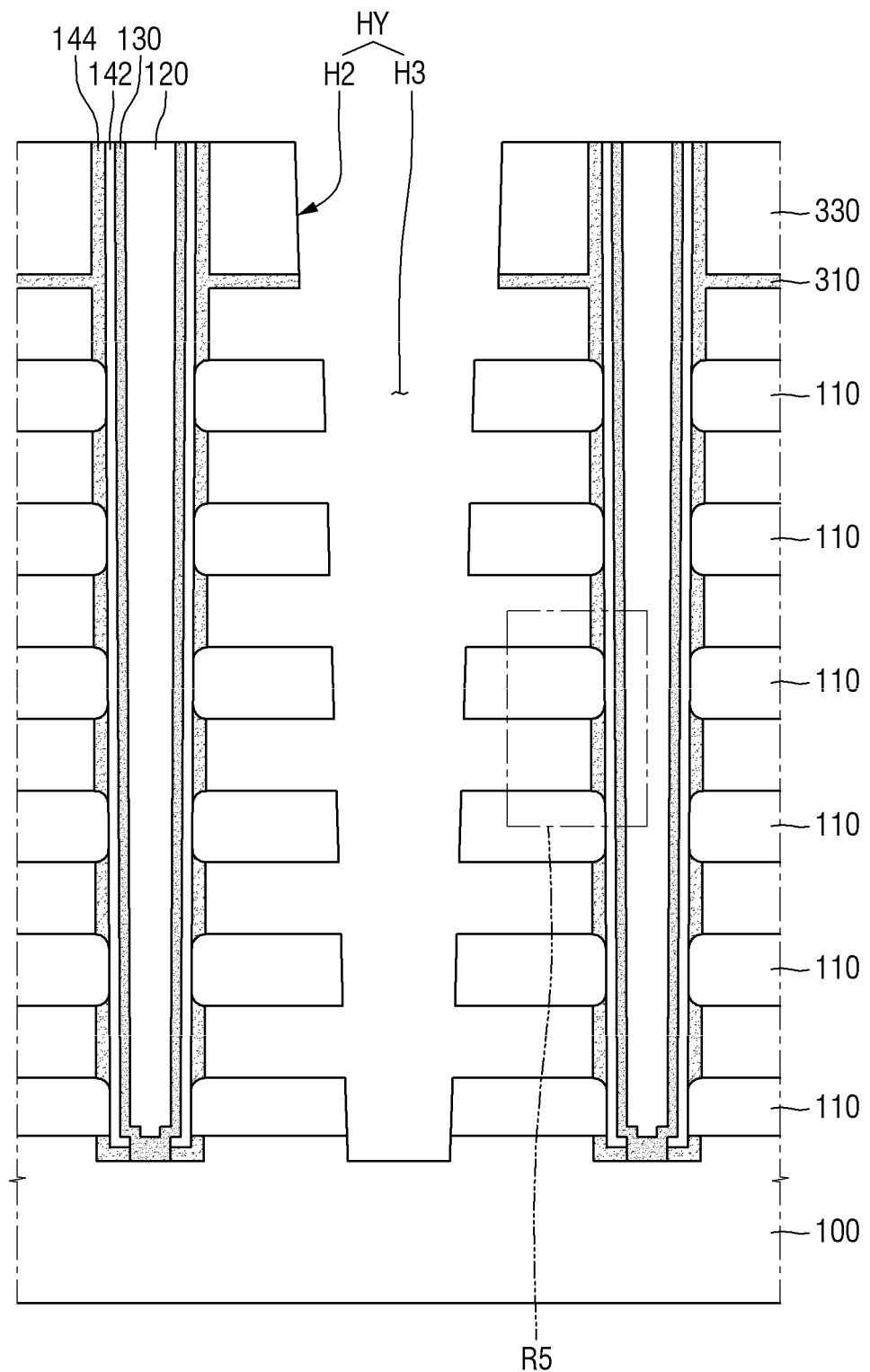
Figure 35:
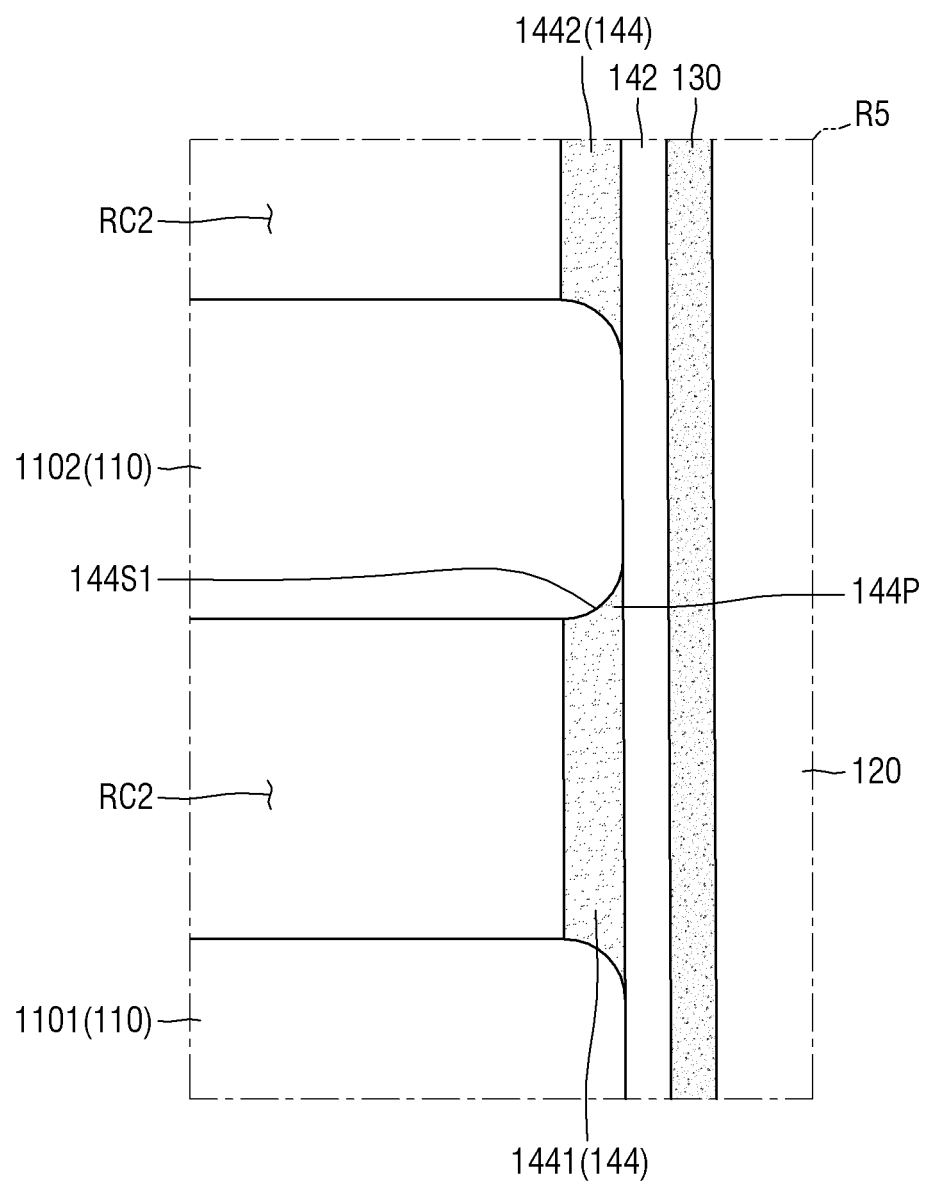
Figure 36:
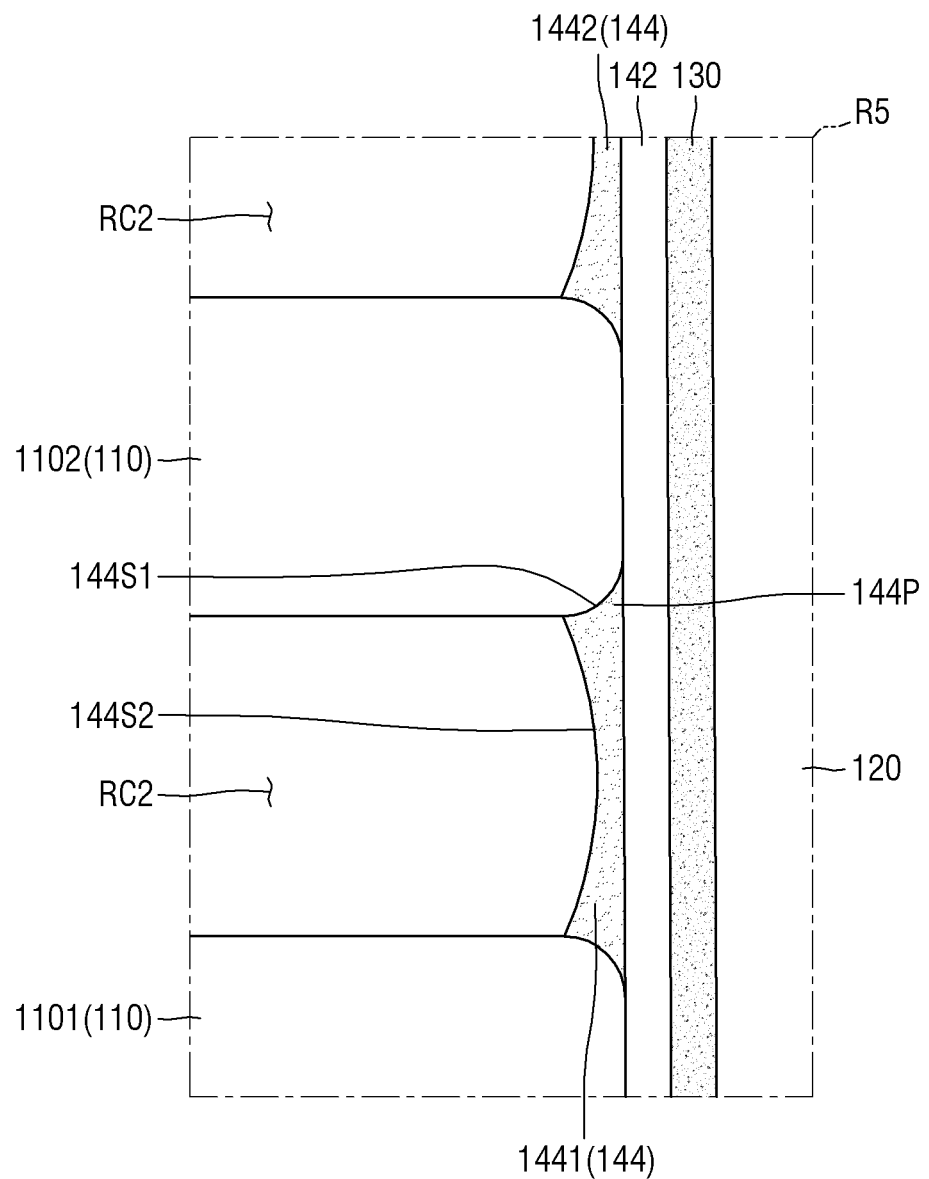

Referring to FIGS. 34 to 36, the second sacrificial film 320 exposed by the separation hole HY is removed. For reference, FIGS. 35 and 36 illustrate various enlarged views of a region R5 of FIG. 34.

Referring to FIGS. 34 and 35, the third etchback process on the second sacrificial film 320 is formed, and the second recess RC2 may be formed in the region of the second sacrificial film 320 exposed by the separation hole HY.

Referring to FIG. 36, in the nonvolatile memory device according to some embodiments, the charge storage films 144 may include a third concave surface 144S2. The third concave surface 144S2 may be attributed, for example, to the characteristics of the third etchback process.

Figure 37:
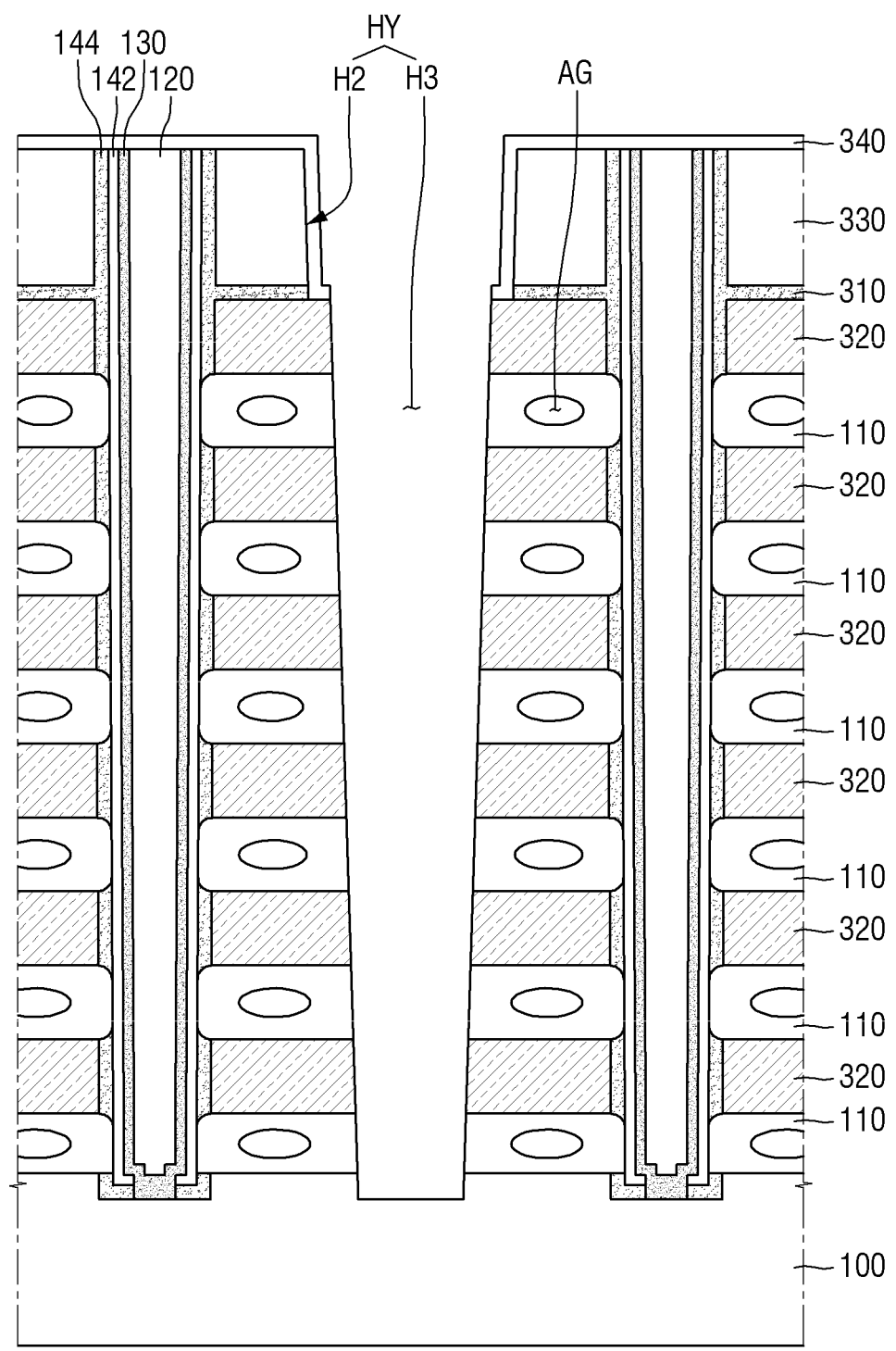
FIG. 37 is an intermediate step diagram for explaining a method for fabricating a nonvolatile memory device according to some embodiments of the technical idea of the present inventive concepts.

FIG. 37 is an intermediate step diagram for explaining a method for fabricating a nonvolatile memory device according to some embodiments of the technical idea of the present inventive concepts. For reference, FIG. 37 is a diagram for explaining the steps after FIG. 30.

Referring to FIG. 37, a plurality of insulating patterns 110 including an air gap AG is formed in the first recess RC1.

For example, the plurality of insulating patterns 110 including the air gap AG in the first recess RC1 may be formed, using a material having poor step coverage characteristics.

Figure 38:
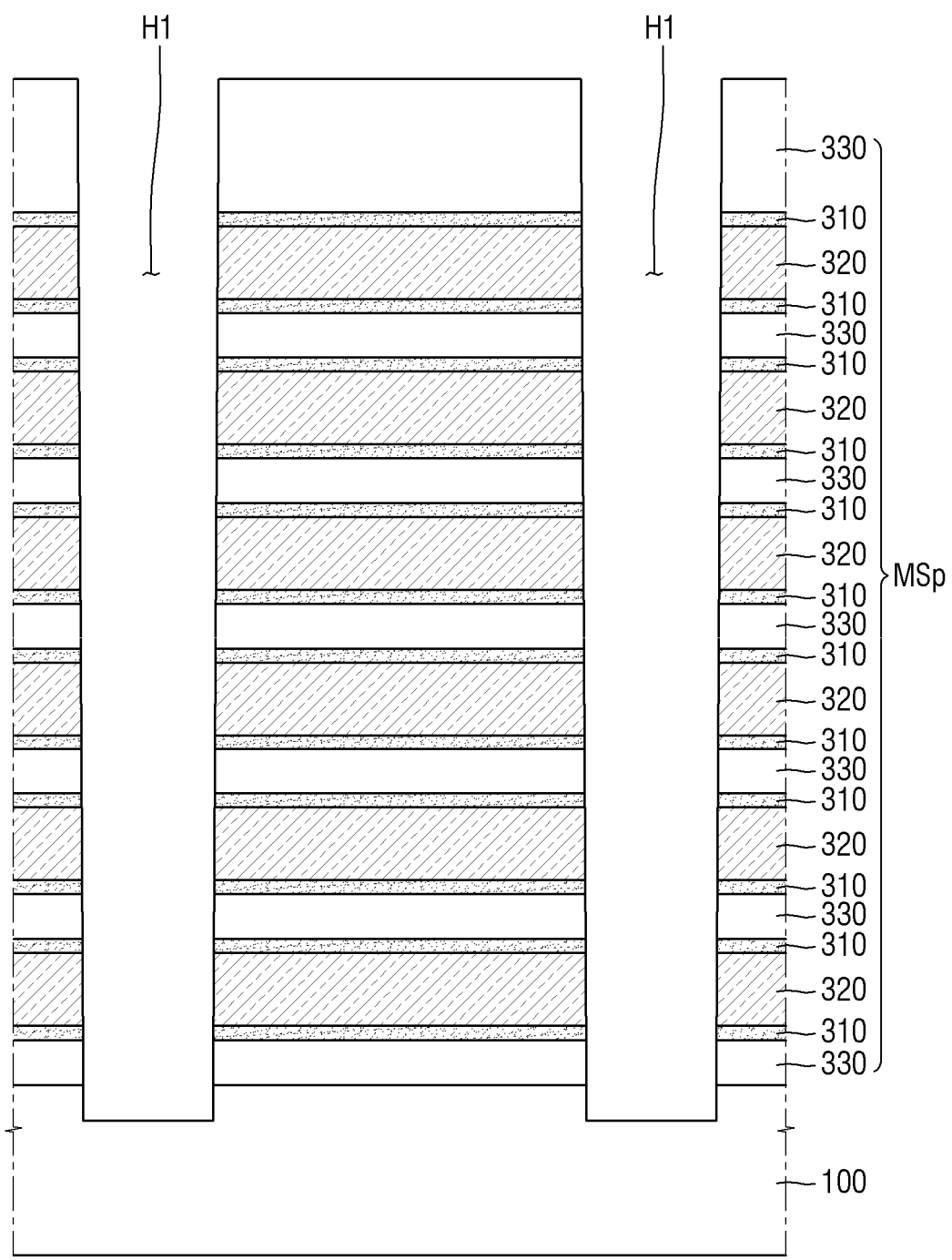
FIGS. 38 to 43 are intermediate stage diagrams for explaining a method for fabricating a nonvolatile memory device according to some embodiments of the technical idea of the present inventive concepts.

FIGS. 38 to 43 are intermediate stage diagrams for explaining a method for fabricating a nonvolatile memory device according to some embodiments of the technical idea of the present inventive concepts. For the sake of convenience of explanation, repeated parts of description provided using FIGS. 1 to 29 will be briefly described or omitted. For reference, FIG. 38 is a diagram for explaining the steps after FIG. 15a.

Referring to FIG. 38, a first hole H1 is formed in the preliminary mold structure MSp.

For example, a part of the preliminary mold structure MSp may be etched to form the first hole H1 penetrating the first to third sacrificial films 310, 320 and 330. The first hole H1 may be formed to penetrate the preliminary mold structure MSp and expose a part of the substrate 100. In some embodiments, formation of the first hole H1 may include etching a part of the upper part of the substrate 100.

Figure 39:
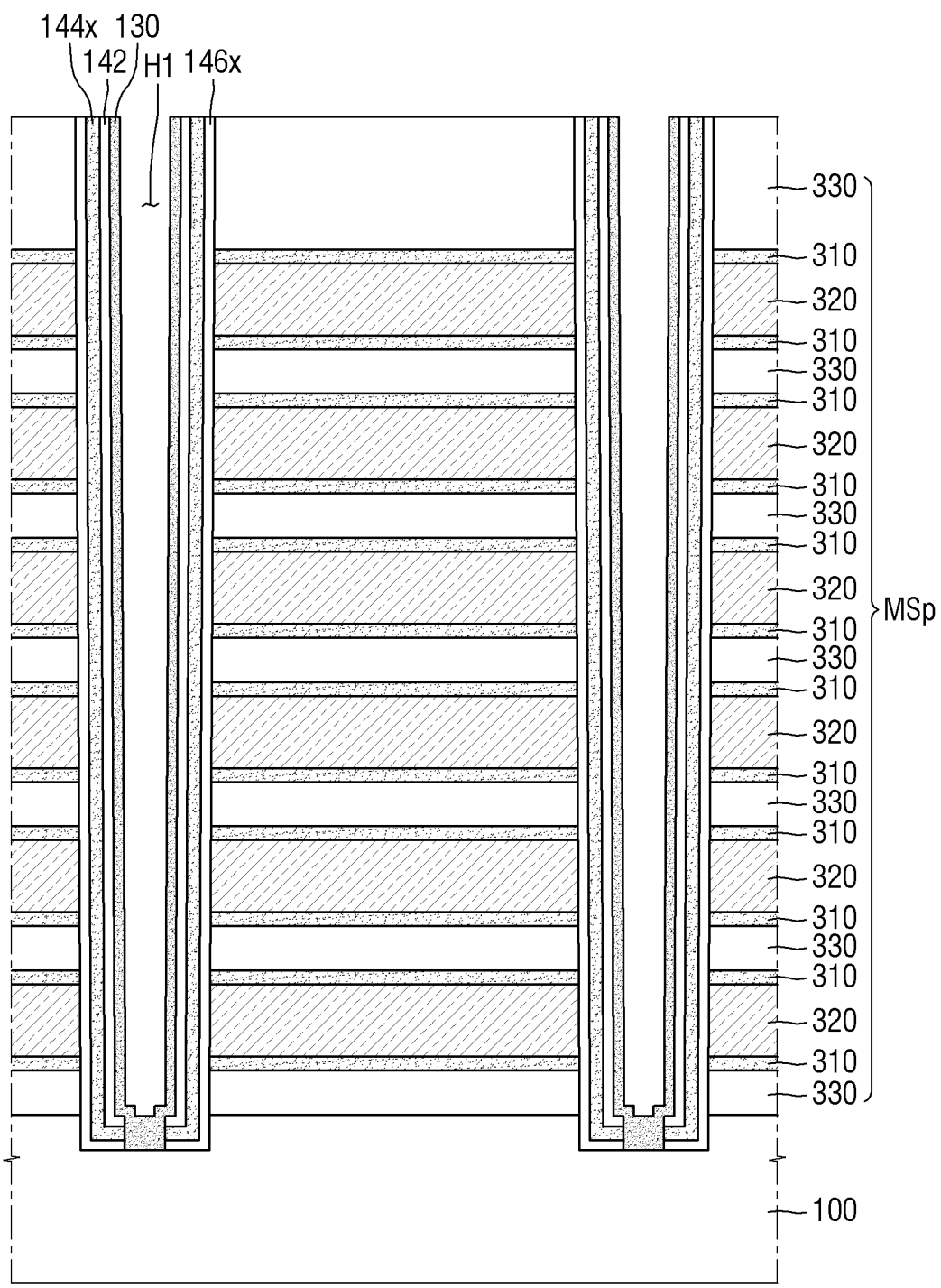

Referring to FIG. 39, a preliminary blocking insulation film 146x, a preliminary charge storage film 144x, a tunnel insulating film 142 and a semiconductor pattern 130 are sequentially formed in the first hole H1.

The preliminary blocking insulation film 146x, the preliminary charge storage film 144x, the tunnel insulating film 142 and the semiconductor pattern 130 may extend along the profile of the first hole H1.

The preliminary blocking insulation film 146x may include a high-k material having a dielectric constant higher than that of, for example, silicon oxide or silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof. For convenience of explanation, the blocking insulation films 146 will be described below as including silicon oxide.

Figure 40:
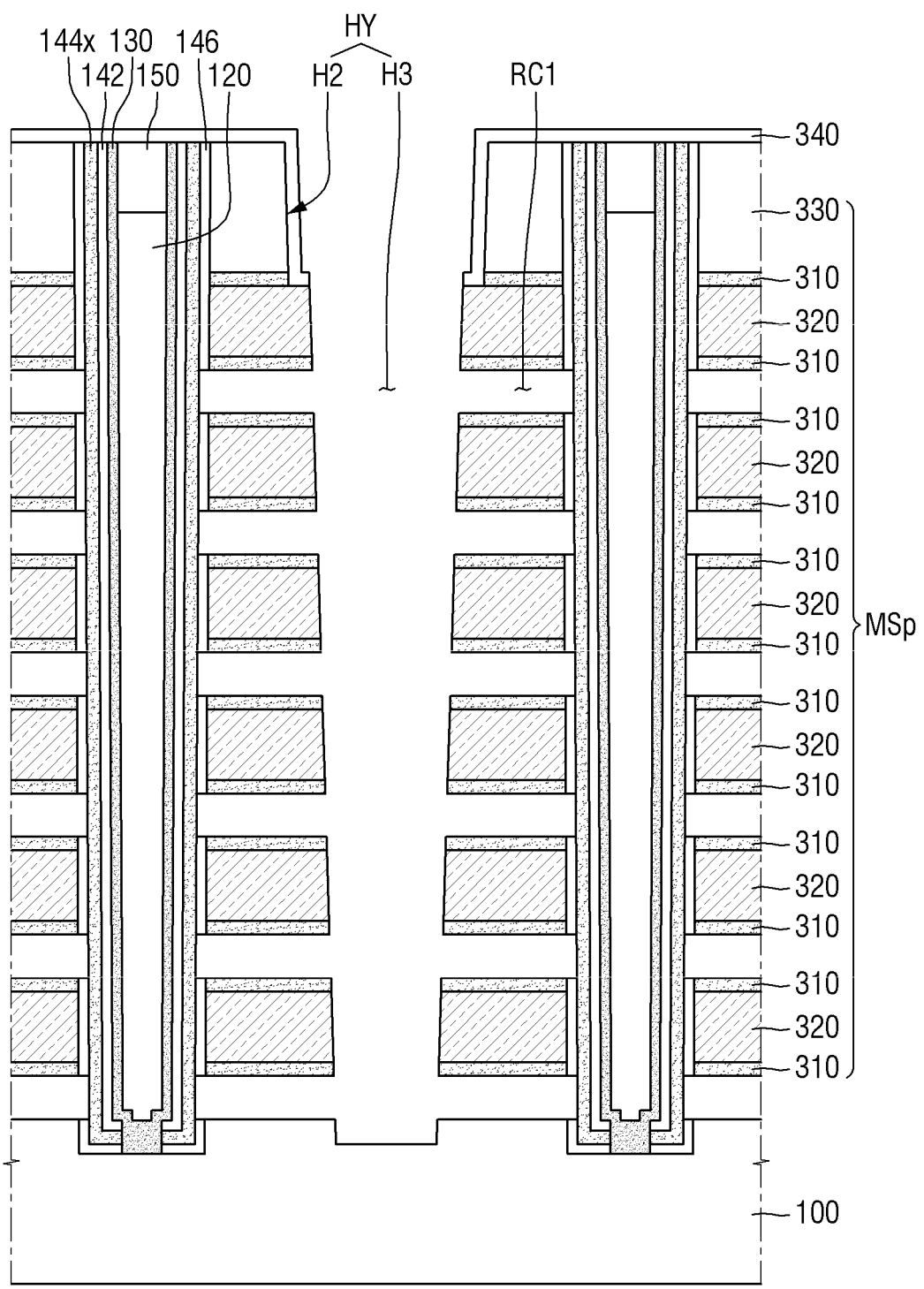

Referring to FIG. 40, the third sacrificial film 330 exposed by the separation hole HY is removed.

For example, the above-described steps may be executed using FIGS. 18 to 21. As a result, the separation hole HY including the second hole H2 and the third hole H may be formed in the preliminary mold structure MSp.

Next, the first etchback process on the first sacrificial film 330 is performed, and the first recess RC1 may be formed in the region of the third sacrificial film 330 exposed by the separation hole HY.

In some embodiments, the first recess RC1 may expose a part of the preliminary charge storage film 144x. For example, a part of the preliminary blocking insulation film 146x may be removed together by the first etchback process.

As a result, the blocking insulation films 146 extending along the sidewalls of the respective gate electrodes (GSL, WL0 to WLn, and SSL) may be formed. However, the technical idea of the present inventive concepts is not limited thereto, and the preliminary blocking insulation film 146x may not be removed by the first etchback process, depending on the characteristics of the first etchback process.

Figure 41:
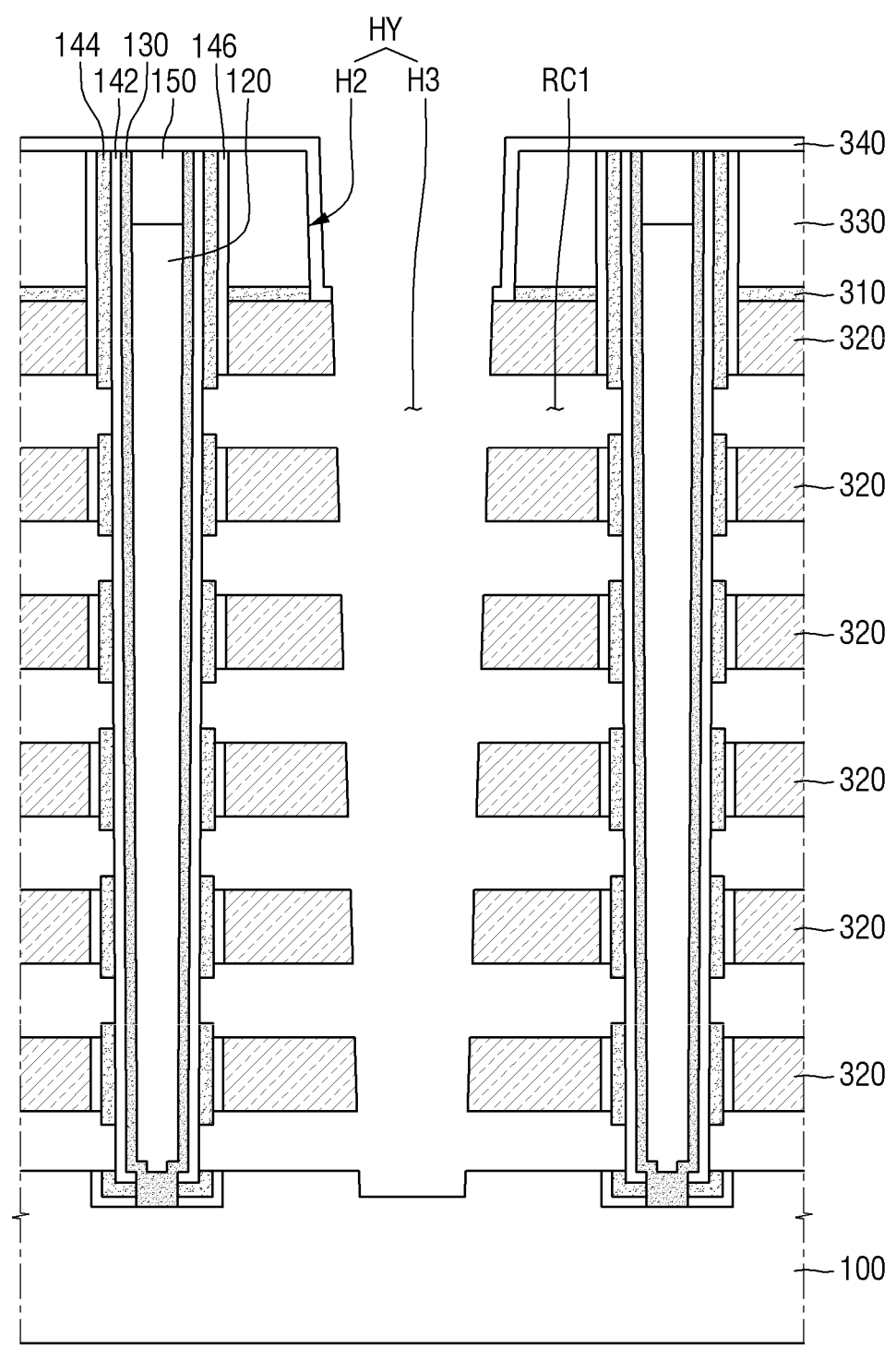

Referring to FIG. 41, the second etchback process on the preliminary charge storage film 144x exposed by the first recess RC1 is performed.

As a result, the charge storage films 144 apart from each other in the third direction Z may be formed. In the process in which the second etchback process is performed, at least a part of the preliminary charge storage film 144x overlapping the first sacrificial film 310 may be protected.

Figure 42:
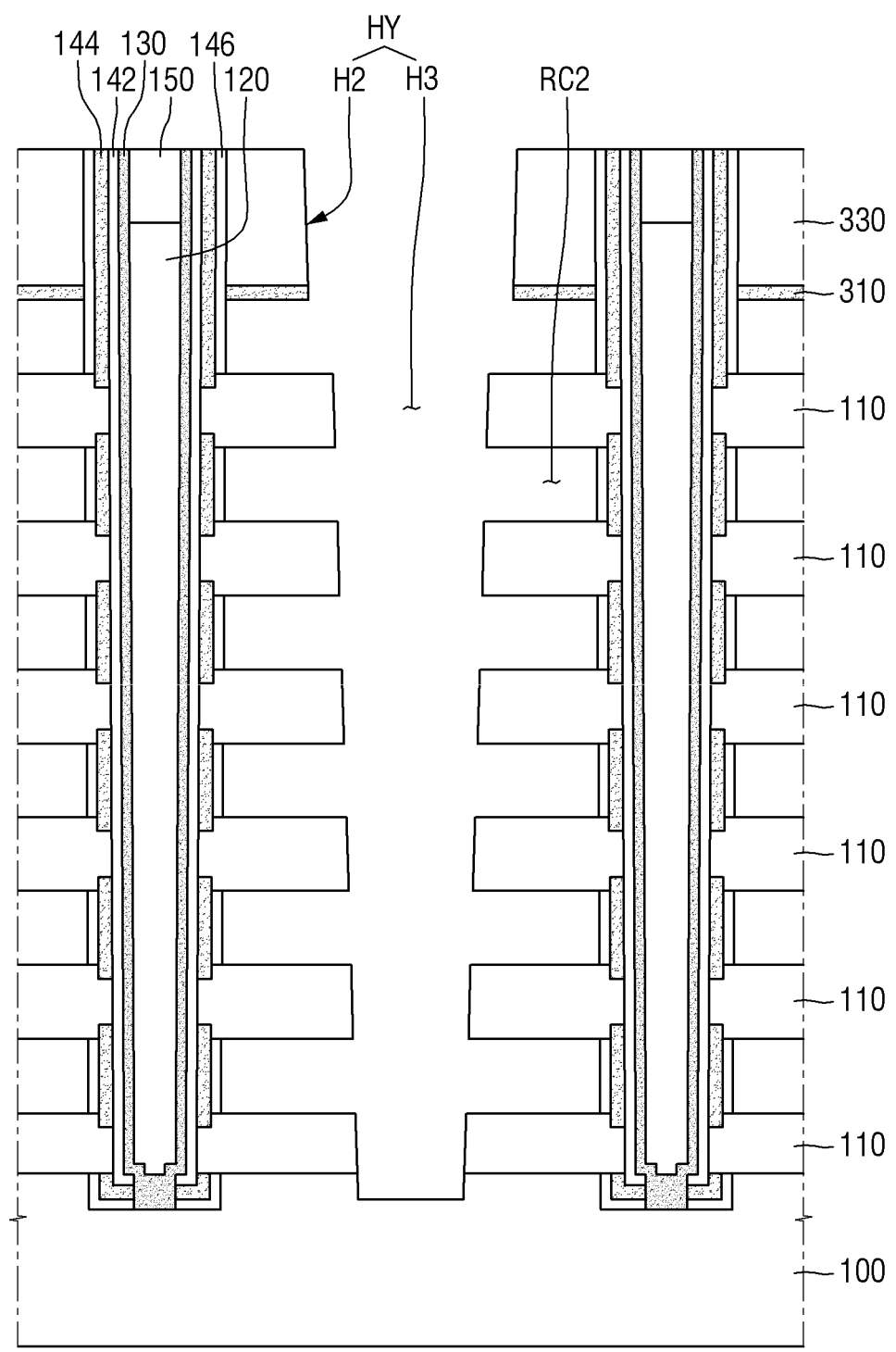

A part of the blocking insulation film 146 overlapping the first sacrificial film 310 is illustrated as being removed, but this is only for convenience of explanation, and the technical idea of the present inventive concepts is not limited thereto. For example, a part of the blocking insulation films 146 overlapping the first sacrificial film 310 may remain without being removed. Referring to FIG. 42, the second sacrificial film 320 exposed by the separation hole HY is removed.

For example, the above-described steps may be executed using FIG. 26. As a result, a plurality of insulating patterns 110 may be formed in the first recess RC1.

Next, a third etchback process on the second sacrificial film 320 is performed, and the second recess RC2 may be formed in the region of the second sacrificial film 320 exposed by the separation hole HYe.

Figure 43:
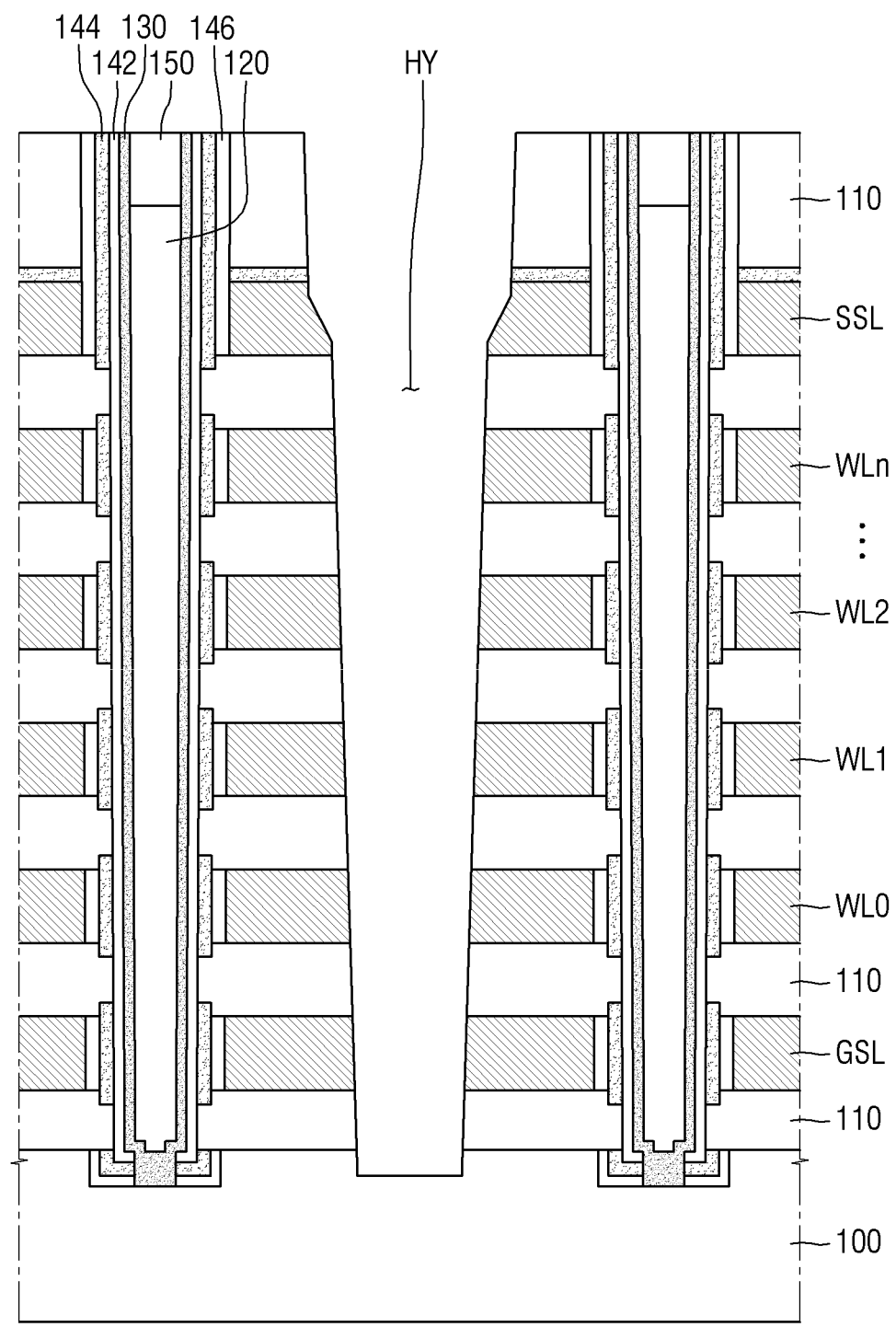

Referring to FIG. 43, gate electrodes (GSL, WL0 to WLn, and SSL) are formed in the second recess RC2.

For example, gate electrodes (GSL, WL0 to WLn, and SSL) for filling the second recess RC2 may be formed on the blocking insulation film 146.

As a result, each blocking insulation film 146 may be formed between the respective gate electrodes (GSL, WL0 to WLn, and SSL) and the charge storage films 144 and 144U. Also, the blocking insulation film 146 may not be interposed between the respective gate electrodes (GSL, WL0 to WLn, and SSL) and the insulating patterns 110.

In concluding the detailed description, those skilled in the art will appreciate that many variations and modifications may be made to example embodiments without substantially departing from the principles of the present inventive concepts. Therefore, the disclosed example embodiments of the present inventive concepts are used in a generic and descriptive sense only and not for purposes of limitation.

What is claimed is:

1. A nonvolatile memory device comprising:
a mold structure which includes a first insulating pattern, a first gate electrode and a second insulating pattern sequentially stacked on a substrate;
a semiconductor pattern which penetrates the mold structure, is connected to the substrate, and extends in a first direction;
a first charge storage film extending in the first direction between the first insulating pattern and the second insulating pattern and between the first gate electrode and the semiconductor pattern; and
a blocking insulation film between the first gate electrode and the first charge storage film,
wherein a first length at which the first charge storage film extends in the first direction is longer than a second length at which the blocking insulation film extends in the first direction, and
wherein the first charge storage film includes a protrusion extending, in the first direction, into one of the first insulating pattern and the second insulating pattern.

2. The nonvolatile memory device of claim 1, wherein the blocking insulation film extends along a bottom surface, sidewalls, and an upper surface of the first gate electrode.

3. The nonvolatile memory device of claim 1, wherein the mold structure further includes a second gate electrode on the second insulating pattern, and
the nonvolatile memory device further comprises a second charge storage film apart from the first charge storage film between the second gate electrode and the semiconductor pattern.

4. The nonvolatile memory device of claim 1, wherein the first insulating pattern and the second insulating pattern include an air gap inside.

5. The nonvolatile memory device of claim 1, wherein the first length increases approaching the semiconductor pattern.

6. The nonvolatile memory device of claim 1, wherein sidewalls of the first charge storage film adjacent to the blocking insulation film include a concave surface.

7. The nonvolatile memory device of claim 1, wherein the mold structure further includes a ground selection line between the substrate and the first insulating pattern.

8. The nonvolatile memory device of claim 1, wherein the mold structure further includes a string selection line on the second insulating pattern, and
the nonvolatile memory device string further comprises an upper charge storage film extending along an upper surface and sidewalls of the string selection line.

9. The nonvolatile memory device of claim 1, further comprising:
an impurity region in the substrate; and
a separation structure penetrating the mold structure and connected to the impurity region,
wherein the mold structure further includes a string selection line on the second insulating pattern, and
sidewalls of the separation structure adjacent to the string selection line include a step.

10. A nonvolatile memory device comprising:
a mold structure which includes a first gate electrode, an insulating pattern and a second gate electrode sequentially stacked on a substrate;
a semiconductor pattern penetrating the mold structure and connected to the substrate;
a first charge storage film between the first gate electrode and the semiconductor pattern;
a second charge storage film apart from the first charge storage film between the second gate electrode and the semiconductor pattern;
a first blocking insulation film between the first gate electrode and the insulating pattern; and
a second blocking insulation film between the second gate electrode and the insulating pattern,
wherein a first distance at which the first charge storage film and the second charge storage film are apart from each other is shorter than a second distance at which the first blocking insulation film and the second blocking insulation film are apart from each other, and
wherein the first charge storage film includes a first protrusion extending into the insulating pattern in a first direction, and the second charge storage film includes a second protrusion extending into the insulating pattern in the first direction.

11. The nonvolatile memory device of claim 10, wherein the first blocking insulation film extends along a bottom surface, sidewalls, and an upper surface of the first gate electrode, and the second blocking insulation film extends along a bottom surface, sidewalls and an upper surface of the second gate electrode.

12. The nonvolatile memory device of claim 10, wherein the semiconductor pattern extends in a first direction and penetrates the mold structure, and a first length at which the first charge storage film extends in the first direction is longer than a second length at which the first blocking insulation film extends in the first direction.

13. The nonvolatile memory device of claim 12, further comprising:

a tunnel insulating film penetrating the mold structure between the semiconductor pattern and the insulating pattern, wherein sidewalls of the tunnel insulating film between the first charge storage film and the second charge storage film include a concave surface.

14. The nonvolatile memory device of claim 10, wherein the insulating pattern includes an air gap inside.

15. The nonvolatile memory device of claim 10, wherein the first distance decreases approaching the semiconductor pattern.

16. A nonvolatile memory device comprising:

a mold structure which includes a first insulating pattern, a first gate electrode and a second insulating pattern sequentially stacked on a substrate;

a semiconductor pattern which penetrates the mold structure, is connected to the substrate, and extends in a first direction; and a first charge storage film extending in the first direction between the first insulating pattern and the second insulating pattern and between the first gate electrode and the semiconductor pattern, wherein a first length at which the first charge storage film extends in the first direction increases approaching the semiconductor pattern, wherein the first charge storage film includes a first protrusion extending into the first insulating pattern in the first direction, and a second protrusion extending to the second insulating pattern in the first direction, wherein the first protrusion is disposed above an upper surface of the first gate electrode, and the second protrusion is disposed below a bottom surface of the first gate electrode.

17. The nonvolatile memory device of claim 16, wherein the mold structure further includes a second gate electrode on the second insulating pattern, and the nonvolatile memory device further includes a second charge storage film apart from the first charge storage film, between the second gate electrode and the semiconductor pattern.

18. The nonvolatile memory device of claim 16, wherein a distal end of the first charge storage film adjacent to the first insulating pattern includes a concave surface.

19. The nonvolatile memory device of claim 16, further comprising:

a blocking insulation film between the first gate electrode and the first charge storage film, wherein the blocking insulation film extends along a bottom surface, sidewalls and the upper surface of the first gate electrode.

20. The nonvolatile memory device of claim 16, further comprising:

a blocking insulation film between the first gate electrode and the first charge storage film, wherein a second length at which the blocking insulation film extends in the first direction is shorter than the first length.

* * * * *